(12) United States Patent
Yoshiyama et al.

(10) Patent No.: US 6,541,823 B1
(45) Date of Patent: *Apr. 1, 2003

(54) SEMICONDUCTOR DEVICE INCLUDING MULTIPLE FIELD EFFECT TRANSISTORS AND MANUFACTURING METHOD THEREOF

(75) Inventors: Kenji Yoshiyama, Hyogo (JP); Motoshige Igarashi, Hyogo (JP); Keiichi Yamada, Hyogo (JP); Katsuya Okada, Hyogo (JP); Keiichi Higashitani, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,020

(22) Filed: Mar. 11, 1998

(30) Foreign Application Priority Data

Sep. 9, 1997 (JP) .............................. 9-244245
Jun. 9, 1997 (JP) .............................. 9-150942

(51) Int. Cl.$^7$ ................... H01L 27/01; H01L 27/12; H01L 31/0392; H01L 29/76; H01L 29/94
(52) U.S. Cl. .................. 257/351; 257/391; 257/392
(58) Field of Search .................. 257/391, 351, 257/392; 438/258, 302

(56) References Cited

U.S. PATENT DOCUMENTS 5,502,009 A    3/1996  Lin ............................ 438/275
5,719,425 A  * 2/1998  Akram et al. ................ 257/344
5,739,589 A  * 4/1998  Sugiura et al. ............. 257/763
5,824,588 A  * 10/1998 Liu ............................ 438/302
5,834,352 A  * 11/1998 Choi .......................... 438/275

FOREIGN PATENT DOCUMENTS

| JP | 63-252459 | 10/1988 |
| JP | 1-110761  | 4/1989  |
| JP | 4-260364  | 9/1992  |
| JP | 5-267595  | 10/1993 |

OTHER PUBLICATIONS

Stanley Wolf, Ph.D., "Silicon Processing for the VLSI Era vol. 3: the Submicron Mosfet," Latice Press, 1995, pp. 646–661.

Japanese Office Action.

Stanley Wolf, Ph.D., "Silicon Processing for the VLSI Era vol. 3: the Subicron Mosfet," Latice Press, 1995, pp. 646–661.

* cited by examiner

Primary Examiner—Olik Chaudhuri
Assistant Examiner—William M. Brewster
(74) Attorney, Agent, or Firm—McDermott, Will & Emery

(57) ABSTRACT

A semiconductor device and a manufacturing method thereof permitting the quality of gate insulating films to be prevented from deteriorating and thereby permitting electrical characteristics of the device to be prevented from deteriorating are provided. In a semiconductor device including a plurality of field effect transistors, an oxidation protection film 21 is formed on a side of one gate electrode 19.

2 Claims, 47 Drawing Sheets

SEMICONDUCTOR DEVICE INCLUDING MULTIPLE FIELD EFFECT TRANSISTORS AND MANUFACTURING METHOD THEREOF

BACKGROUND OF THE INVENTION

1. Field of the Invention

The present invention relates generally to semiconductor devices and manufacturing methods thereof, and more particularly, to a semiconductor device including a plurality of field effect transistors and a manufacturing method thereof.

2. Description of the Background Art

In recent years, as semiconductor devices came to be more densely integrated and reduced in size, 2-power supply devices having external voltage of a conventional level and internal voltage of a lower level have been proposed.

FIG. 79 is a cross sectional view showing such a conventional 2-power supply semiconductor device including a plurality of field effect transistors.

Referring to FIG. 79, the conventional 2-power supply semiconductor device include a first field effect transistor supplied with first power supply voltage (low Vdd) and a second field effect transistor supplied with second power supply voltage (high Vdd) higher than low Vdd formed on a main surface of a p type semiconductor substrate 101 and spaced apart from each other. An isolation oxide film 102 is formed between the first and second field effect transistors.

In the low Vdd region, a pair of first source/drain regions 110 and a pair of low concentration impurity diffusion regions 108 are formed spaced apart from each other on the main surface of semiconductor substrate 101 having a first channel region therebetween. Low concentration, n type impurity diffusion region 108 formed adjacent to the first channel region and high concentration, n type impurity diffusion region 110 formed adjacent to n type impurity diffusion region 108 constitute an LDD (Lightly Doped Drain) structure. A first gate insulating film 106 is formed on the first channel region. A first gate electrode 118 is formed on first gate insulating film 106. A sidewall oxide film 109 is formed on a side of first gate electrode 118. The first field effect transistor supplied with low Vdd is formed of first source/drain regions 110, impurity diffusion regions 108, first gate insulating film 106, and first gate electrode 118.

In the high Vdd region, a pair of second source/drain regions 117 and a pair of low concentration impurity diffusion regions 116 are formed on the main surface of semiconductor substrate 101, spaced apart from each other and having a second channel region therebetween. Second source/drain region 117 and low concentration impurity diffusion region 116, in other words low concentration n type impurity diffusion region 116 formed adjacent to the second channel region and high concentration, n type impurity diffusion region 117 formed adjacent to n type impurity diffusion region 116 constitute an LDD structure. A second gate insulating film 104 is formed on the second channel region. First gate insulating film 106 is formed on second gate insulating film 104. A second gate electrode 119 is formed on first gate insulating film 106. A sidewall oxide film 120 is formed on a side of second gate electrode 119. Second source/drain regions 117 and impurity diffusion region 116, second gate insulating film 104, first gate insulating film 106 and first gate electrode 119 form the second field effect transistor supplied with high Vdd. The gate insulating films 104 and 106 of the second field effect transistor supplied with high Vdd should be thicker than the first gate insulating film 106 of first field effect transistor supplied with low Vdd.

Referring to FIGS. 80 to 86, a method of manufacturing the conventional 2-power supply semiconductor device will be now described.

Isolation oxide film 102 is formed on the main surface of semiconductor substrate 101 to surround an active region. Second gate insulating film 104 is formed on the active region on the main surface of semiconductor substrate 101. A resist pattern 105a is formed on second gate insulating film 104 positioned in the high Vdd region and on isolation oxide film 102. The structure as shown in FIG. 80 is thus obtained.

An isotropic etching is performed using resist pattern 105a as a mask to remove second gate insulating film 104 positioned in the low Vdd region to obtain the structure as shown in FIG. 81. Resist pattern 105a is then removed.

As shown in FIG. 82, first gate insulating film 106 is formed on the main surface of semiconductor substrate 101 and on second gate insulating film 104.

A first doped polysilicon film 103 (see FIG. 83) is deposited on first gate insulating film 106 and isolation oxide film 102. Resist patterns 105b and 105c are formed on the regions of first doped polysilicon film 103 to be first and second gate electrodes 118 and 119 (see FIG. 79). The structure as shown in FIG. 83 is thus obtained.

Then, using resist patterns 105b and 105c as masks, an anisotropic etching is performed to remove a part of first doped polysilicon film 103, and first and second gate electrodes 118 and 119 are formed as a result. Resist patterns 105b and 105c are then removed. The structure as shown in FIG. 84 is thus obtained. The gate insulating film portion of the second field effect transistor formed of first and second gate insulating films 106 and 104 can be made thicker than the first gate insulating film 106 of the first field effect transistor. Thus, the breakdown voltage of the second field effect transistor can be greater than the breakdown voltage of the first field effect transistor, so that the second field effect transistor may be supplied with voltage higher than the first field effect transistor.

As shown in FIG. 85, an n type impurity is introduced into a prescribed region of the main surface of semiconductor substrate 101 to form low concentration n type impurity diffusion regions 108 and 116.

Sidewall oxide films 109 and 120 (see FIG. 86) are formed on sides of first and second gate electrodes 118 and 119. An n type impurity is then introduced into a prescribed region of the main surface of semiconductor substrate 101 to form high concentration n type impurity diffusion regions 110 and 117 as shown in FIG. 86.

The conventional 2-power supply semiconductor device is manufactured as described above.

In the manufacture of the 2-power supply semiconductor device, resist pattern 105a is directly formed on second gate insulating film 104 positioned in the high Vdd region. In the following removal of resist pattern 105a, defects (local irregularities) are sometimes generated in the surface of second gate insulating film 104. A light etching processing for removing resist pattern 105a is directly performed to the surface of second gate insulating film 104, second gate insulating film 104 may be reduced in thickness. The defects in the surface of second gate insulating film 104 and the reduction in thickness lead to a reduction in the breakdown voltage of second gate insulating film 104, and as a result electrical characteristics of the semiconductor device including the field effect transistor deteriorate.

As a countermeasure, a manufacturing method as shown in FIGS. 87 to 93 has been proposed.

Referring to FIGS. 87 to 93, the proposed conventional method of manufacturing a 2-power supply semiconductor device including a plurality of field effect transistors will be described.

Isolation oxide film 102 is formed on the main surface of p type semiconductor substrate 101 to surround an active region. Second gate insulating film 104 is formed on the active region in the main surface of p type semiconductor substrate 101. First doped polysilicon film 103 is formed on second gate insulating film 104 and isolation oxide film 102. Resist pattern 105a is formed on the region of first doped polysilicon film 103 to be second gate electrode 119 (see FIG. 88) positioned in the high Vdd region to obtain the structure as shown in FIG. 87.

An anisotropic etching is performed using resist pattern 105a as a mask to etch away a part of first doped polysilicon film 103, and second gate electrode 119 as shown in FIG. 88 results. Resist pattern 105a is then removed. Resist pattern 105b is formed on second gate insulating film 104 positioned in the high Vdd region and second gate electrode 119 to form the structure as shown in FIG. 88.

In the manufacture, second gate electrode 119 is formed on second gate insulating film 104 and then resist pattern 105b is formed. Resist pattern 105b is not directly formed on the region of the surface of second gate insulating film 104 in contact with second gate electrode 119. Thus, defects in the surface of second gate insulating film 104 as in the manufacturing method shown in FIGS. 80 to 86 can be prevented.

Then, as shown in FIG. 89, second gate insulating film 104 positioned in the low Vdd region is removed by an isotropic etching. Then, resist pattern 105b is removed.

As shown in FIG. 90, a silicon oxide film to be first gate insulating film 106 is formed on the main surface of p type semiconductor substrate 101 positioned in the low Vdd region and on second gate insulating film 104 and second gate electrode 119.

Then, on first gate insulating film 106 and isolation oxide film 102, a second doped polysilicon film 107 (see FIG. 91) is formed by means of CVD. Resist pattern 105c (see FIG. 91) is formed on the region of second doped polysilicon film 107 to be first gate electrode 118 (see FIG. 93). The structure as shown in FIG. 91 is thus obtained.

An anisotropic etching is performed using resist pattern 105c as a mask to remove a part of second doped polysilicon film 107, and first gate electrode 118 (see FIG. 92) is formed as a result. After the anisotropic etching, a part of second doped polysilicon film 107 also remains on a side of second gate electrode 119. Resist pattern 105c is then removed. Resist pattern 105d (see FIG. 92) is formed on first gate insulating film 106 positioned in the low Vdd region and on first gate electrode 118. Thus, the structure as shown in FIG. 92 results.

Second doped polysilicon film 107 remaining on the side of second gate electrode is removed by an isotropic etching, and then resist pattern 105d is removed. After low concentration, n type impurity diffusion regions 108, 116 (see FIG. 93) are formed by introducing an impurity, sidewall oxide films 109, 120 (see FIG. 93) are formed, followed by formation of high concentration n type impurity diffusion regions 110, 117 (see FIG. 93), and the semiconductor device as shown in FIG. 93 results.

In the manufacture of the proposed conventional 2-power supply semiconductor device as shown in FIGS. 87 to 93, second gate electrode 119 is formed before resist pattern 105b is formed as shown in FIG. 88, in order to prevent defects from being formed in the surface of second gate insulating film 104. In the manufacture of the 2-power supply semiconductor device, however, in the step as shown in FIG. 90, during forming first gate insulating film 106, second gate electrode 119 formed of doped polysilicon is oxidized in an end 123 of the contact portion between second gate electrode 119 and second gate insulating film 104 as shown in FIG. 94. Therefore, a silicon oxide film 124 grows along the contact surface between second gate insulating film 104 and second gate electrode 119. Thus grown silicon oxide film is called "gate bird's beak". Herein, FIG. 94 is an enlarged view of region 100 shown in FIG. 90. The gate oxide film having a "gate bird's beak" formed of an oxide film is poor in quality and difficult to control in thickness. As a result, electrical characteristics of the semiconductor device including the plurality of field effect transistors deteriorate.

SUMMARY OF THE INVENTION

The present invention is directed to a solution to the above-described problems. It is one object of the invention to provide a semiconductor device which can prevent electrical characteristics of the device from deteriorating by preventing the deterioration of the quality of a gate insulating film.

Another object of the invention is to provide a semiconductor device which can prevent a gate bird's beak from being generated.

Yet another object of the invention is to provide a method of manufacturing a semiconductor device which can prevent the deterioration of the quality of a gate insulating film.

A semiconductor device according to one aspect of the invention having a plurality of field effect transistors includes first and second field effect transistors.

The first field effect transistor includes a pair of first source/drain regions, a first gate insulating film, and a first gate electrode. The second field effect transistor includes a pair of second source/drain regions, a second gate insulating film, and a second gate electrode. The first source/drain regions are formed, on a main surface of a semiconductor substrate, spaced apart from each other and having a first channel region therebetween. The first gate insulating film is formed on the first channel region in a first thickness. The second source/drain regions are formed on the main surface of the semiconductor substrate, spaced apart from each other and having a second channel region therebetween. The second gate insulating film is formed on the second channel region in a second thickness larger than the first thickness. The second gate electrode is formed on the second gate insulating film. An oxidation protection film to prevent one of the first and second gate electrodes from being oxidized is formed on a side of one of the gate electrodes. In the semiconductor device according to this aspect, the oxidation protection film to prevent the gate electrode from being oxidized is formed on a side of one of the first and second gate electrodes, and therefore an oxidizing step to form a gate insulating film of another field effect transistor may be performed while the oxidization protection film is formed on a side of that one gate electrode. As a result, the lower part of the side of the gate electrode can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

A semiconductor device according to another aspect of the invention having a plurality of field effect transistors includes first and second field effect transistors.

The first field effect transistor includes a pair of first source/drain regions, a first gate insulating film, and a first gate electrode. The second field effect transistor includes a pair of second source/drain regions, a second gate insulating film, and a second gate electrode. The first source/drain regions are formed, on a main surface of a semiconductor substrate, spaced apart from each other and having a first channel region therebetween. The first gate insulating film has a first thickness and is formed on the first channel region to include an oxide nitride film. The first gate electrode is formed on the first gate insulating film. The second source/drain regions are formed, on the main surface of the semiconductor substrate, spaced apart from each other and having a second channel region therebetween. The second gate insulating film is formed on the second channel region and has a second thickness larger than the first thickness. The second gate electrode is formed on the second gate insulating film.

In the semiconductor device according to this aspect, since the first gate insulating film is formed to include the oxide nitride film, in the manufacturing process which will be described, in the presence of the second gate electrode, during forming the oxide nitride film to be the first gate insulating film, an end of the second gate electrode can be prevented from being excessively oxidized in the contact portion between a lower part of a side of the second gate electrode and the second gate insulating film. Thus, as a result, the lower part of the side of the gate electrode can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating. Furthermore, since the first gate insulating film is formed to include the oxide nitride film, the first gate insulating film may be formed thinner with a prescribed breakdown voltage being maintained than the case of using a conventional silicon oxide film or the like. As a result, the driving voltage of the first field effect transistor may be reduced.

A semiconductor device according to another aspect of the invention having a plurality of field effect transistors includes first and second field effect transistors. The first field effect transistor includes a pair of first source/drain regions, a first gate insulating film, and a first gate electrode. The second field effect transistor includes a pair of second source/drain regions, a second gate insulating film, and a second gate electrode. The first source/drain regions are formed, on a main surface of a semiconductor substrate, spaced apart from each other and having a first channel region therebetween. The first gate insulating film is formed on the first channel region and has a first thickness. The first gate electrode is formed on the first gate insulating film. The second source/drain regions are formed, on the main surface of the semiconductor substrate, spaced apart from each other and having a second channel region therebetween. The gate insulating film is formed on the second channel region and has a second thickness larger than the first thickness. The second gate electrode is formed on the second gate insulating film. An anti-oxidation conductive film is formed on at least one of the first and second gate insulating films.

In the semiconductor device according to this aspect, the anti-oxidation conductive film is formed on at least one of the first and second gate insulating films, it is not necessary to form a resist pattern directly on the surface of one of the first and second gate insulating films in the following manufacturing steps. Furthermore, before forming one of the first and second gate electrodes, an oxidizing step to form the other one of the first and second gate insulating films may be performed using the anti oxidation conductive film. Thus, in the step of oxidizing the first gate insulating film, a lower part of the side of one of the first and second gate electrodes can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, since the anti-oxidation conductive film is formed on one of the first and second gate insulating films, a resist pattern will not be formed directly on one of the first and second gate insulating films in the following manufacturing steps. As a result, defects such as local irregularities in the gate insulating film as formed during removing the resist pattern can be avoided. Therefore, the threshold voltages of the field effect transistors may be prevented from fluctuating. Electrical characteristics of the semiconductor device including the plurality of field effect transistors may be prevented from deteriorating.

In the semiconductor device according to this aspect, a semiconductor film having a conductive impurity may be formed at a position between the anti-oxidation conductive film and at least one of the first and second gate insulating films.

Thus, when voltage is supplied to one of the first and second gate electrodes having the semiconductor film including the conductive impurity, the formation of a depletion layer caused by a reduction in the concentration of the conductive impurity in the vicinity of one of the first and second gate insulating films may be prevented. As a result, the fluctuation of the threshold voltages of the field effect transistors caused by the formation of such a depletion layer can be prevented. Therefore, electrical characteristics of the semiconductor device including the plurality of field effect transistors can be prevented from deteriorating.

A semiconductor device according to another aspect of the invention having a plurality of field effect transistors includes first and second field effect transistors.

The first field effect transistor includes a pair of first source/drain regions, a first gate insulating film, and a first gate electrode. The second field effect transistor includes a pair of second source/drain regions, a second gate insulating film, and a second gate electrode. The first source/drain regions are formed, on a main surface of a semiconductor substrate, spaced apart from each other and having a first channel region therebetween. The first gate insulating film is formed on the first channel region and has a first thickness. The first gate electrode is formed on the first gate insulating film. The second source/drain regions are formed, on the main surface of the semiconductor substrate, spaced apart from each other and having a second channel region therebetween. The second gate insulating film is formed on the second channel region and has a second thickness. The second gate electrode is formed on the second gate insulating film. A semiconductor film having a conductive impurity is formed on and in contact with at least one of the first and second gate insulating films. An anti-oxidation insulating film for preventing the semiconductor film having the conductive impurity from being oxidized is formed on the semiconductor film.

Since the semiconductor film having the conductive impurity is thus formed on and in contact with one of the first and second gate insulating films, it is not necessary to form a resist pattern directly on a surface of one of the first and second gate insulating films in the manufacture of the semiconductor device. Furthermore, before one of the first and second gate electrodes is formed, an oxidizing step to form the other one of the first and second gate insulating films may be performed using the anti-oxidation insulating film as a mask. In the step of oxidizing the gate insulating films, a lower part of a side of the gate electrodes can be prevented from being oxidized as a result, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, the semiconductor film having the conductive impurity is formed on and in contact with one of the first and second gate insulating films, a resist pattern is not formed directly on one of the first and second gate insulating films. As a result, defects such as local irregularities in the gate insulating films as formed during removing the resist pattern can be avoided. Therefore, the threshold voltages of the field effect transistors may be prevented from fluctuating. Electrical characteristics of the semiconductor device including the plurality of field effect transistors may be prevented from deteriorating. Furthermore, when voltage is supplied to one of the first and second gate electrodes having the semiconductor film including the conductive impurity, the formation of a depletion layer caused by a reduction in the concentration of the conductive impurity in the vicinity of one of the first and second gate insulating films may be prevented. As a result, the fluctuation of the threshold voltages of the field effect transistors caused by the formation of such a depletion layer can be prevented. Therefore, electrical characteristics of the semiconductor device including the plurality of field effect transistors can be prevented from deteriorating.

A semiconductor device according to another aspect of the invention having a plurality of field effect transistors includes first and second field effect transistors.

The first field effect transistor includes a pair of first source/drain regions, a first gate insulating film, and a first gate electrode. The second field effect transistor includes a pair of second source/drain regions, a second gate insulating film, and a second gate electrode. The second gate electrode has a first conductive film, an insulating film and a second conductive film. The first source/drain regions are formed, on a main surface of a semiconductor substrate, spaced apart from each other and having a first channel region therebetween. The first gate insulating film is formed on the first channel region and has a first thickness. The first gate electrode is formed on the first gate insulating film. The second source/drain regions are formed, on the main surface of the semiconductor substrate, spaced apart from each other and having a second channel region therebetween. The second gate insulating film is formed on the second channel region and has a second thickness. The first conductive film to be a part of the second gate electrode is formed on the second gate insulating film. The insulating film to be a part of the second gate electrode is formed on the first conductive film. The second conductive film to be a part of the second gate electrode is formed on the insulating film.

Thus, the second gate electrode has the first conductive film, the insulating film, and the second conductive film, and therefore an oxidizing step for forming the first gate insulating film can be performed before forming the second gate electrode without forming a resist pattern directly on the surface of the second gate insulating film. As a result, a lower part of a side of the gate electrode can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

A semiconductor device according to another aspect of the invention having a plurality of field effect transistors includes first and second field effect transistors.

The first field effect transistor includes a pair of first source/drain regions, a first gate insulating film, and a first gate electrode. The second field effect transistor includes a pair of second source/drain regions, a second gate insulating film, and a second gate electrode. The first source/drain regions are formed, on a main surface of a semiconductor substrate, spaced apart from each other and having a first channel region therebetween. The first gate insulating film is formed on the first channel region and has a first thickness. The first gate electrode is formed on the first gate insulating film. The second source/drain regions are formed, on the main surface of the semiconductor substrate, spaced apart from each other and having a second channel region therebetween. The second gate insulating film is formed on the second channel region and has a second thickness larger than the first thickness. The second gate electrode is formed on the second gate insulating film. A protection conductive film is formed on and in contact with at least one of the first and second gate insulating films.

Thus, the protection conductive film is formed on and in contact with one of the first and second gate insulating films, it is not necessary to form a resist pattern directly on the surface of one of the first and second gate insulating films. Furthermore, before forming one of the first and second gate electrodes, an oxidizing step for forming the other one of the first and second gate insulating films can be performed using the protection conductive film. Thus, in the step of oxidizing the gate insulating films, a lower part of a side of one of the first and second gate electrodes can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

In the semiconductor device according to this aspect, the protection conductive film includes first and second protection conductive films. The first protection conductive film may be formed on and in contact with the first gate insulating film, while the second protection conductive film may be formed on and in contact with the second gate insulating film. The first and second protection conductive films may be substantially equal in thickness.

Thus, during etching the first and second protection conductive films to form the first and second gate electrodes, the part of the thickness of the first and second protection conductive films to be removed by the etching can be made substantially equal in the regions to form the first and second gate electrodes. As a result, during the etching for forming the first and second gate electrodes, the amount of etching for forming the first gate electrode can be substantially the same as the amount of etching for forming the second gate electrode. Therefore, the amount of overetching during forming the first and second gate electrodes can be reduced. As a result, the semiconductor substrate or the like positioned under the protection conductive films to be etched away can be prevented from being damaged by overetching. As a result, electrical characteristics of the semiconductor device including the plurality of field effect transistors can be prevented from deteriorating.

The semiconductor device according to this aspect may further include a protection conductive film formed by depositing a film having an amorphous structure. Thus, the film having the amorphous structure is free from grain boundaries, and therefore during isotropically etching the protection conductive film in the manufacture of the semiconductor device, damages to the gate insulating film positioned under the protection conductive film caused by the isotropic etching agent running along grain boundaries can be prevented. As a result, the fluctuation of the threshold voltages of the field effect transistors can be prevented. As a result, electrical characteristics of the semiconductor device including the plurality of field effect transistors can be prevented.

In the semiconductor device according to this aspect, an anti-oxidation film may be formed on and in contact with the protection conductive film. Thus, in the manufacture of the semiconductor device, a natural oxide film difficult to control in thickness can be prevented from being formed on the protection conductive film. Thus, in an etching step to form the first and second gate electrodes, the variation of the thickness of the protection conductive film to be etched away caused by the formation of such a natural oxide film can be prevented. As a result, during etching for forming the first and second gate electrodes, the variation of the thickness of the protection conductive film to be etched away can be reduced, the amount of overetching, can be reduced. As a result, damages to the semiconductor substrate or the like positioned under the protection conductive film to be etched away, caused by overetching can be prevented.

In a method of manufacturing a semiconductor device according to another aspect of the invention, a first gate insulating film having a first thickness is formed on a main surface of a semiconductor device. A first gate electrode is formed on the first gate insulating film. Using the gate electrode as a mask, an impurity is introduced into the main surface of the substrate to form a pair of first source/drain regions, spaced apart from each other and having a first channel region therebetween. A second gate insulating film having a second thickness larger than the first thickness is formed on the main surface of the semiconductor substrate. Using the second gate electrode as a mask, an impurity is introduced into the main surface of the substrate to form a second pair of source/drain regions, spaced apart from each other and having a second channel region therebetween. An oxidation protection film to prevent a gate electrode from being oxidized is formed on a side of one of the first and second gate electrodes. After one of the first and second gate insulating films is formed, the other one of the first and second gate insulating films is formed with the oxidation protection film being present on the side of the gate electrode formed on that one of the first and second gate insulating films.

Thus, with the gate electrode being formed on one of the first and second gate insulating films, the other one of the first and second gate insulating films is formed, and therefore resist pattern is not directly formed on the gate insulating film. Therefore, during the following removal of the resist pattern, a direct light etching processing can be prevented on the surface of the gate insulating film. As a result, defects in the surface of the gate insulating film caused by such a light etching processing can be prevented. Furthermore, with the oxidation protection film for preventing a gate electrode from being oxidized being present on a side of one of the first and second gate electrodes, an oxidizing step to form the other one of the first and second gate insulating films is performed. As a result, a lower part of a side of the gate electrode can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

In a method of manufacturing a semiconductor device according to another aspect of the invention, a first gate insulating film including an oxide nitride film and having a first thickness is formed on a main surface of a semiconductor substrate. A first gate electrode is formed on the first gate insulating film. Using the gate electrode as a mask, an impurity is introduced into the main surface of the substrate to form a pair of first source/drain regions, spaced apart from each other and having a first channel region therebetween. A second gate insulating film having a second thickness larger than the first thickness is formed on the main surface of the semiconductor substrate. Using the second gate electrode as a mask, an impurity is introduced into the main surface of the substrate to form a second pair of source/drain regions, spaced apart from each other and having a second channel region therebetween. The first gate insulating film is formed in the presence of the second gate electrode formed on the second gate insulating film.

Thus, while the second gate electrode has been formed on the second gate insulating film, the first gate insulating film is formed, and therefore resist pattern is not directly formed on the second gate insulating film. Therefore, during the following removal of the resist pattern, a direct light etching processing on the surface of the second gate insulating films can be prevented. Thus, defects in the surface of the second gate insulating film caused by such a light etching processing can be prevented.

Furthermore, since there is the step of forming the first gate insulating film to include the oxide nitride film, an end of the second gate electrode can be suppressed from being excessively oxidized at the joint of a lower part of a side of the second gate electrode and the second gate insulating film during forming the oxide nitride film to be the first gate insulating film while the second gate electrode has been formed. Thus, a gate bird's beak can be avoided. Therefore, the threshold voltages of the field effect transistors can be prevented increasing, and as a result electrical characteristics of the semiconductor device including the plurality of field effect transistors can be prevented from deteriorating. Since the first gate insulating film is formed to include the oxide nitride film, the thickness of the first gate insulating film can be made smaller than the case of using a conventional silicon oxide film as a prescribed breakdown voltage is maintained. As a result, the driving voltage of the first field effect transistor can be reduced.

In a method of manufacturing a semiconductor device according to another aspect of the invention, a first gate insulating film having a first thickness is formed on a main surface of a semiconductor substrate. A first gate electrode is formed on the first gate insulating film. Using the first gate electrode as a mask, an impurity is introduced into the main surface of the substrate to form a pair of first source/drain regions, spaced apart from each other and having a first channel region therebetween. A second gate insulating film having a second thickness larger than the first thickness is formed on the main surface of the semiconductor substrate. Using the second gate electrode as a mask, an impurity is introduced into the main surface of the substrate to form a second pair of source/drain regions, spaced apart from each other and having a second channel region therebetween. An anti-oxidation conductive film is formed on at least one of the first and second gate insulating films. While the anti-oxidation conductive film has been formed on at least one of the first and second gate insulating films, the other one of the first and second gate insulating films is formed.

Since the anti-oxidation conductive film is formed on one of the first and second gate insulating films, it is not necessary to directly form a resist pattern on the surface of one of the first and second gate insulating films. In addition, before forming one of the first and second gate electrodes, an oxidizing step to form the other one of the first and second gate insulating films can be performed using the anti-oxidation conductive film as a mask. As a result, a lower part of a side of one of the first and second gate electrodes can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, since the anti-oxidation conductive film is formed on one of the first and second gate insulating films, a resist pattern is not directly formed on that one of the first and second gate insulating films. As a result, defects such as local irregularities in the gate insulating film as formed during removing a resist pattern can be avoided. Therefore, the threshold voltages of the field effect transistors may be prevented from fluctuating. Electrical characteristics of the semiconductor device including the plurality of field effect transistors may be prevented from deteriorating.

The method of manufacturing the semiconductor device according to this aspect may further include the step of forming a semiconductor film including a conductive impurity at a position between the anti-oxidation conductive film and at least one of the first and second gate insulating films. Thus, when voltage is supplied to one of the first and second gate electrodes on the side having the semiconductor film including the conductive impurity, the formation of a depletion layer caused by a reduction in the concentration of the conductive impurity in the vicinity of one of the first and second gate insulating films can be restricted. As a result, the fluctuation of the threshold voltages of the field effect transistors caused by the formation of such a depletion layer can be prevented. Therefore, electrical characteristics of the semiconductor device including the plurality of field effect transistors can be prevented from deteriorating.

In the method of manufacturing the semiconductor device according to this aspect, a substrate protection film may be formed in the region on the main surface of the semiconductor substrate to form one of the first and second gate insulating films. With the substrate protection film being present, the other one of the first and second gate insulating films and the anti-oxidation conductive film may be formed.

Thus, with the presence of the substrate protection film, the other one of the first and second gate insulating films and the anti-oxidation conductive film are formed, the insulating film forming the other one of the first and second gate insulating film can be prevented from being formed in contact with the main surface of the semiconductor substrate positioned in the region to form one of the first and second gate insulating films.

As a result, during etching away the anti-oxidation conductive film and the insulating film from the region to form one of the first and second gate insulating films, the main surface of the semiconductor substrate positioned in the region to form that one of the first and second gate insulating films can be prevented from being directly etched. Thus, damages to the main surface of the semiconductor substrate caused by etching can be prevented. As a result, during forming one of the first and second gate insulating films, the deterioration of the quality of one of the first and second gate insulating films caused by the presence of damages by the etching on the main surface of the semiconductor substrate in which the gate insulating film is formed can be prevented. As a result, the fluctuation of the threshold voltage of the field effect transistors can be prevented. As a result, electrical characteristics of the semiconductor device including the plurality of field effect transistors can be prevented.

The method of manufacturing the semiconductor device according to this aspect may further include the step of removing a part of the main surface of the semiconductor substrate positioned in the region to form one of the first and second gate insulating films before forming that insulating film.

Thus, in the main surface of the semiconductor substrate positioned in the region to form one of the first and second gate insulating films by means of etching in the manufacture of the semiconductor device, a part of the main surface of the semiconductor substrate with damages such as local irregularities can be removed. Therefore, that one of the first and second gate insulating films can be formed on the main surface of the semiconductor substrate removed of the damaged part. Therefore, the quality of the gate insulating film can be prevented from deteriorating due to damages on the main surface of the semiconductor substrate. The fluctuation of the threshold voltages of the field effect transistors can be prevented. As a result, electrical characteristics of the semiconductor device including the plurality of field effect transistors can be prevented.

In a method of manufacturing a semiconductor device according to another aspect of the invention, a first gate insulating film having a first thickness is formed on a main surface of a semiconductor device. A first gate electrode is formed on the first gate insulating film. Using the gate electrode as a mask, an impurity is introduced into the main surface of the substrate to form a pair of first source/drain regions, spaced apart from each other and having a first channel region therebetween. A second gate insulating film having a second thickness larger than the first thickness is formed on the main surface of the semiconductor substrate. A first conductive film to be a part of a second electrode is formed on the second gate insulating film. An insulating film to be a part of the second gate electrode is formed on the first conductive film. A second conductive film to be a part of the second gate electrode is formed on the insulating film. The first and second insulating films and the insulating film are anisotropically etched to form the second gate electrode. Using the second gate electrode as a mask, an impurity is introduced into the main surface of the substrate to form a second pair of source/drain regions, spaced apart from each other and having a second channel region therebetween. Herein the first gate insulating film is formed in the presence of the first conductive film.

Thus, after forming the first conductive film to be a part of the second gate electrode on the second gate insulating film, the first gate insulating film is formed, and therefore an oxidizing step to form the first gate insulating film can be performed without forming a resist pattern directly on the surface of the second gate insulating film. Therefore, during the following removal of the resist pattern, a direct light etching processing to the surface of the second gate insulating film can be prevented. Thus, defects on the surface of the second gate insulating film caused by such a light etching processing can be prevented.

In the presence of the first conductive film, after the first gate insulating film is formed and then the insulating film and the second conductive films are formed, the first and second conductive films and the insulating film are anisotropically etched to form the second gate electrode, a side of the second gate electrode can be prevented from being oxidized in the oxidizing step to form the first gate insulating film. Thus, a gate bird's beak can be avoided. Thus, the threshold voltages of the field effect transistors can be prevented from increasing. As a result, electrical characteristics of the semiconductor device including the plurality of field effect transistors can be prevented from deteriorating. In the presence of the insulating film, when a voltage is supplied to the second gate electrode, the voltage drops in the insulating film, and voltage imposed on the second gate insulating film can be reduced.

In a method of manufacturing a semiconductor device according to another aspect of the invention, a first gate insulating film having a first thickness is formed on a main surface of a semiconductor substrate. A first gate electrode is formed on the first gate insulating film. Using the gate electrode as a mask, an impurity is introduced into the main surface of the substrate to form a pair of first source/drain regions, spaced apart from each other and having a first channel region therebetween. A second gate insulating film having a second thickness larger than the first thickness is formed on the main surface of the semiconductor substrate. A second gate electrode is formed on the second gate insulating film. Using the second gate electrode as a mask, an impurity is introduced into the main surface of the substrate to form a pair of second source/drain regions, spaced apart from each other and having a second channel region therebetween. A protection conductive film for protecting a gate insulating film is formed on and in contact with at least one of the first and second gate insulating films. While the protection conductive film has been formed, the other one of the first and second gate insulating films is formed.

Thus, the protection conductive film is formed on and in contact with one of the first and second gate insulating films, it is not necessary to directly form a resist pattern on that one of the first and second gate insulating films. Furthermore, before forming one of the first and second gate electrodes, an oxidizing step to form the other one of the first and second gate insulating films using the protection conductive film as a mask can be performed. As a result, a lower part of the side of one of the first and second gate electrodes can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

In the method of manufacturing the semiconductor device according to this aspect, a conductive film may be formed on and in contact with the other one of the first and second gate insulating films. A resist pattern may be formed on and in contact with the conductive film and the protection conductive film. Using the resist pattern as a mask, part of the conductive film and the protection conductive film is anisotropically etched away to simultaneously form the first gate electrode and the second gate electrode.

Thus, the resist pattern is formed on and in contact with the protection conductive film and the conductive film, part of the conductive film and the protection conductive film is anisotropically etched away using the resist pattern as a mask, and therefore the first and second gate electrodes can be formed only of the conductive film and the protection conductive film. As a result, it is not necessary to further form a conductive film to be a part of the gate electrode on the protection conductive film, the process of manufacturing the semiconductor device can be simplified.

In a method of manufacturing a semiconductor device according to another aspect of the invention, an insulating film is formed on a main surface of a semiconductor substrate positioned in regions to form first and second field effect transistors. A resist pattern is formed on the insulating film positioned in the regions to form the second field effect transistor. Using the resist pattern as a mask, a part of the insulating film positioned in the region to form the first field effect transistor is isotropically etched away, followed by removal of the resist pattern. Thus a part of the surface of the insulating film is isotropically etched away to form first and second gate insulating films. A first gate electrode is formed on the first gate insulating film. Using the first gate electrode as a mask, an impurity is introduced into the main surface of the semiconductor substrate to form a pair of source/drain regions, spaced apart from each other and having a first channel region therebetween. A second gate electrode is formed on the second gate insulating film. Using the second gate electrode as a mask, an impurity is introduced into the main surface of the semiconductor substrate, to form a pair of second source/drain regions, spaced apart from each other and having a second channel region therebetween.

Thus, the first and second gate insulating films are formed of a single insulating film, only a single oxidizing step is necessary to form the first and second gate insulating films. Since the first and second gate electrodes are formed after forming the first and second gate insulating films, thus first and second gate electrodes are not oxidized during forming the first and second gate insulating films. As a result, a lower part of a side of the first and second gate electrodes can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, since only a single oxidizing step is necessary to form the first and second gate insulating films, in other words the number of oxidizing steps to form insulating films is reduced by one as compared to the conventional method, the process of manufacturing the semiconductor device can be simplified.

Furthermore, the first and second gate insulating films are formed by means of isotropic etching, possible defects such as local irregularities caused by for example a step of ashing during removal of the resist pattern on the insulating film to be the first and second gate insulating films can be removed by the anisotropic etching. As a result, a defectless, highly reliable gate insulating film may be obtained, and the fluctuation of the threshold voltages of the field effect transistors can be prevented. As a result, electrical characteristics of the semiconductor device including the plurality of field effect transistors can be prevented from deteriorating.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be now described in conjunction with the accompanying drawings.

First Embodiment

Figure 1:
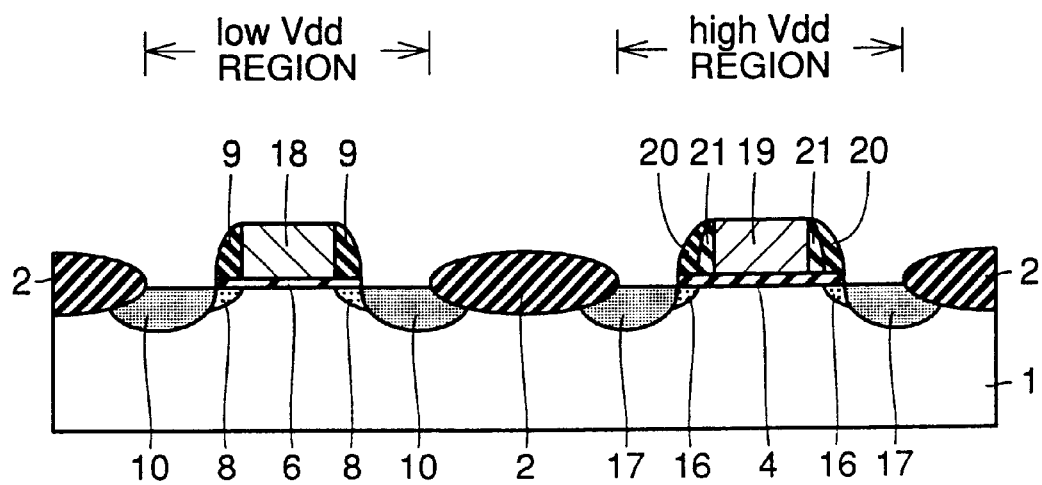
FIG. 1 is a cross sectional view showing a 2-power supply semiconductor device including a plurality of field effect transistors according to a first embodiment of the invention.

Referring to FIG. 1, in a 2-power supply semiconductor device including a plurality of field transistors according to a first embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of low concentration, impurity diffusion regions 8 adjacent thereto, spaced apart from each other and having a first channel region therebetween. Low concentration, n type impurity diffusion region 8 formed adjacent to the first channel region and high concentration, n type impurity diffusion region 10 formed adjacent to n type impurity region 8 constitute an LDD structure. A first, gate insulating film 6 is formed on the first channel region. A first gate electrode 18 is formed on first insulating film 6. A sidewall oxide film 9 is formed on a side of first gate electrode 18. First source/drain regions 10, low concentration impurity diffusion regions 8 adjacent thereto, first gate insulating film 6, and first gate electrode 18 form the first field effect transistor.

In the high Vdd region, there are formed, on the main surface of semiconductor substrate 1, a pair of second source/drain regions 17 and a pair of low concentration impurity diffusion regions 16 adjacent thereto, spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the second channel region. A second gate electrode 19 is formed on the second gate insulating film. On a side of second gate electrode 19, a sidewall nitride film 21 formed of a silicon nitride film which serves as an oxidation protection film to prevent second gate electrode 19 from being oxidized is formed. On a side of sidewall nitride film 21, a sidewall oxide film 20 is formed. Second source/drain regions 17, low concentration impurity diffusion regions 16 adjacent thereto, second gate insulating film 4 and second gate electrode 19 form the second field effect transistor. Herein, the thickness of gate insulating film 4 of the second field effect transistor supplied with high Vdd should be larger than the thickness of the gate insulating film 6 of the first field effect transistor supplied with low Vdd.

Thus, sidewall nitride film 21 serving as an oxidation protection film to prevent second gate electrode 19 from being oxidized is formed on a side of second gate electrode 19, and therefore an oxidizing step to form first gate insulating film 6 in the first field effect transistor can be performed with sidewall nitride film 21 present on the side of second gate electrode 19. As a result, a lower part of a side of the second gate electrode 19 can be prevented from being oxidized, and a gate bird's beak can be avoided. As a result, electrical characteristics of the semiconductor device including the plurality of field effect transistors can be prevented from deteriorating.

In addition, the sidewall is formed of a silicon nitride film, which has a higher ability of preventing diffusion of oxygen atoms than a silicon oxide film, can more surely prevent second gate electrode 19 from being oxidized.

Referring to FIGS. 2 to 10, a process of manufacturing the 2-power supply semiconductor device including the plurality of field effect transistors according to the first embodiment of the invention will be described.

Figure 2:
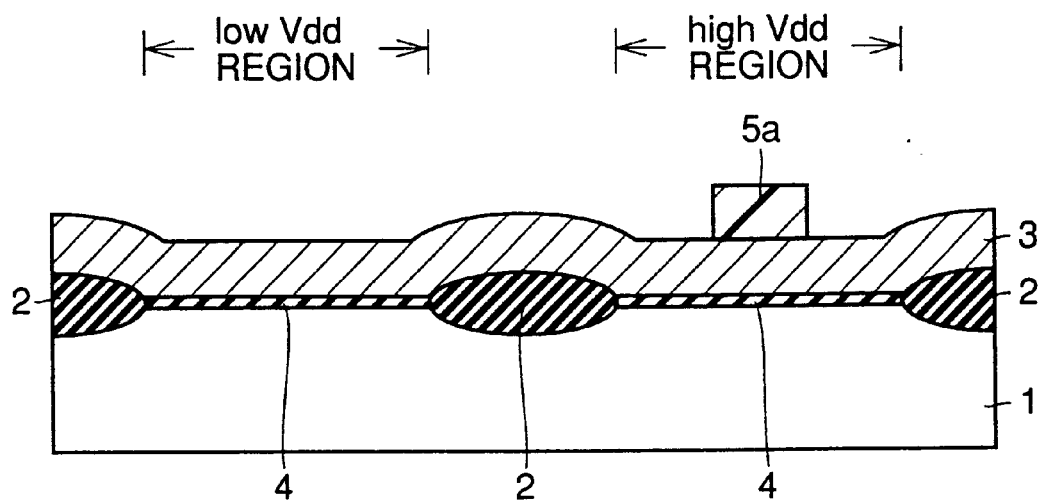
FIGS. 2 to 10 are cross sectional views for use in illustration of the first to ninth steps in the process of manufacturing the 2-power supply semiconductor device including the plurality of field effect transistors according to the first embodiment shown in FIG. 1.

As shown in FIG. 2, isolation oxide film 2 is formed on the main surface of p type semiconductor substrate 1 to surround an active region. Second gate insulating film 4 is formed on the active region of the main surface of p type semiconductor substrate 1. A first doped polysilicon film 3 is formed on second gate insulating film 4 and on isolation oxide film 2. A resist pattern 5a is formed on a region of first doped polysilicon film 3 positioned in the high Vdd region to be second gate electrode 19 (see FIG. 1).

Figure 3:
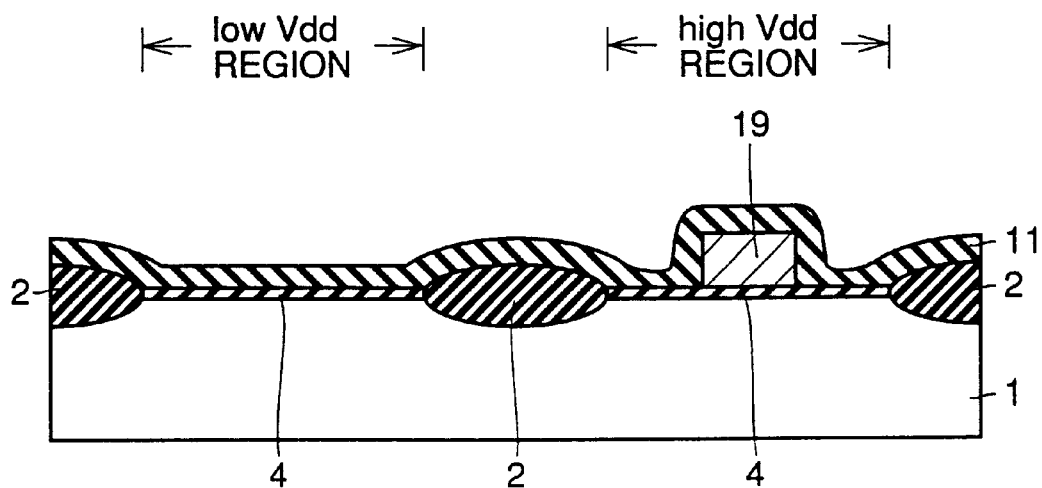

Using resist pattern 5a as a mask, a part of first doped polysilicon film 3 is anisotropically etched away to form second gate electrode 19 as shown in FIG. 3, followed by removal of resist pattern 5a (see FIG. 2). A silicon nitride film 11 is formed on second gate insulating film 4, second gate electrode 19 and isolation oxide film 2.

Silicon nitride film 11 is anisotropically etched to form, on a side of second gate electrode 19, sidewall nitride film 21 formed of a silicon nitride film which serves as an oxidation protection film to prevent second gate electrode 19 from being oxidized. A resist pattern 5b is formed on second gate insulating film 4, second gate electrode 19 and sidewall nitride film 21 to cover the high Vdd region.

Herein, resist pattern 5b is formed after second gate electrode 19 is formed on second gate insulating film 4, resist pattern 5b is not directly formed on the region of the surface of second gate insulating film 4 in which second gate electrode 19 is positioned. As a result, during removing resist pattern 5b, in the region of the surface of second gate insulating film 4, a resist removing processing or a light etching processing can be prevented. As a result, defects may be prevented from being generated in the region of the surface of second gate insulating film 4. The condition of the anisotropic etching to silicon nitride film 11 may be adjusted so that sidewall nitride film 21 serving as the oxidation protection film has an arbitrary thickness. Thus, during forming second source/drain regions 17 (see FIG. 1) and low concentration impurity diffusion regions 16 (see FIG. 1) in the manufacturing process which will be described, the distance between the source region and the drain region (the length of the channel region) can be adjusted, and second source/drain regions 17 and low concentration impurity diffusion regions 16 having an offset structure can be readily formed. Thus, a high electric field in the vicinity of the boundary region between the channel region, second source/drain regions 17 and low concentration impurity diffusion regions 16 can be reduced. Thus, the generation of electrons with high energy can be prevented. As a result, the fluctuation of the threshold voltage of the second field effect transistor caused by introduction of such high energy electrons into second gate insulating film 14 can be prevented, and as a result electrical characteristics of the semiconductor device including the plurality of field effect transistors can be prevented from deteriorating.

Figure 4:
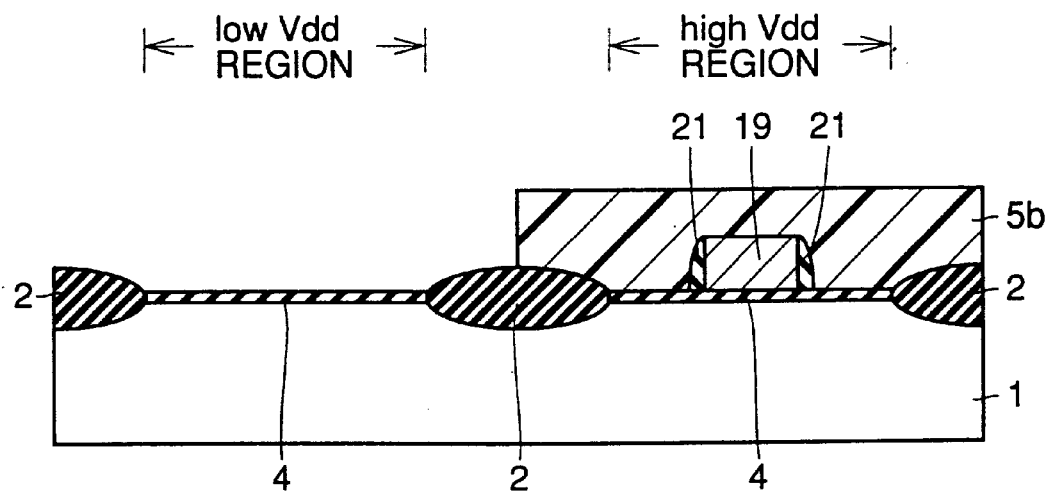
Figure 5:
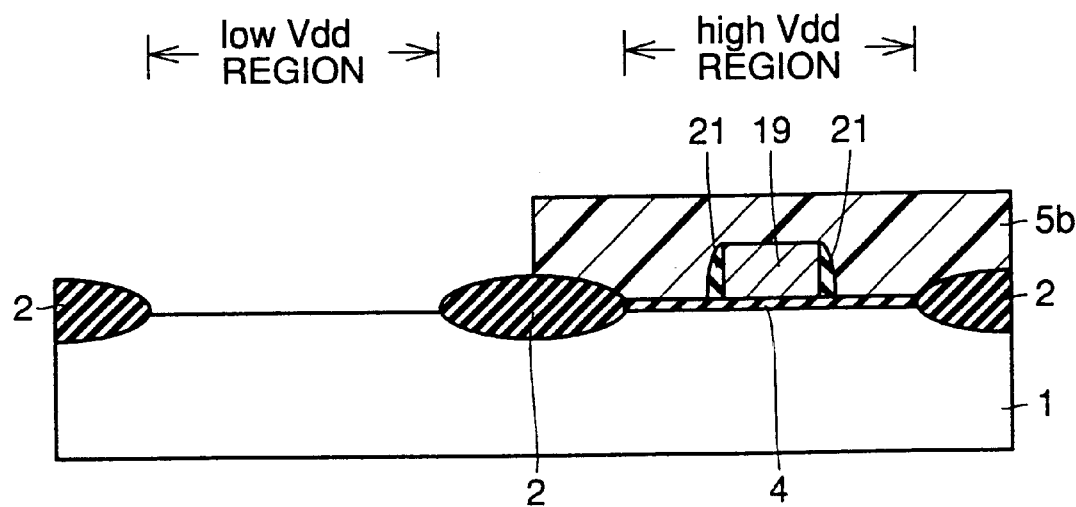

After the step shown in FIG. 4, second gate insulating film 4 present in the low Vdd region is removed by means of isotropic etching, and the structure as shown in FIG. 5 results. Thereafter, resist pattern 5b is removed.

Figure 6:
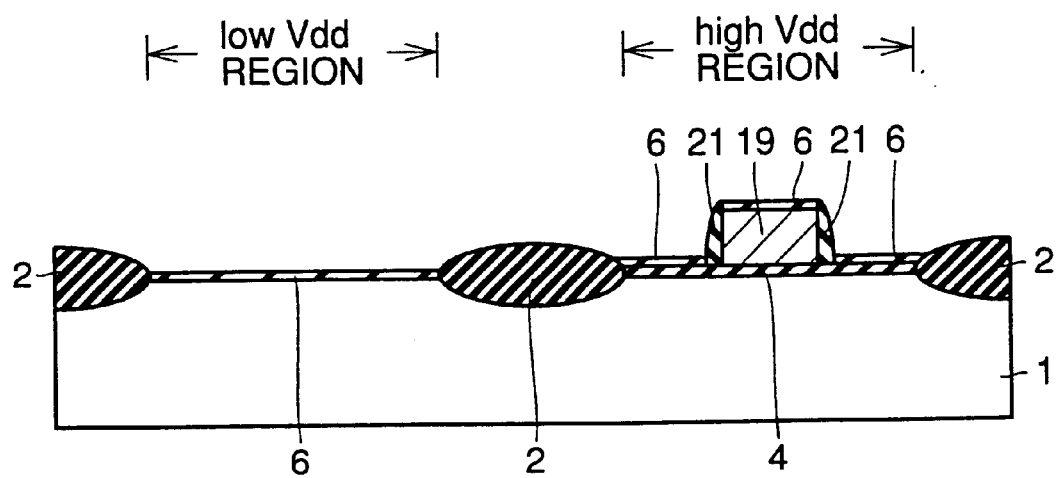

First gate insulating film 6 is formed on the portion of the main surface of p type semiconductor substrate 1 positioned in the low Vdd region, on the surface of second gate insulating film 4, and on second gate electrode 19 by means of thermal oxidation. Thus, the structure as shown in FIG. 6 results. Herein, the thermal oxidation to form first gate insulating film 6 can be performed after sidewall nitride film 21 serving as the oxidation protection film is formed on the side of second gate electrode 19. As a result, a lower part of the side of second gate electrode 19 can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Figure 7:
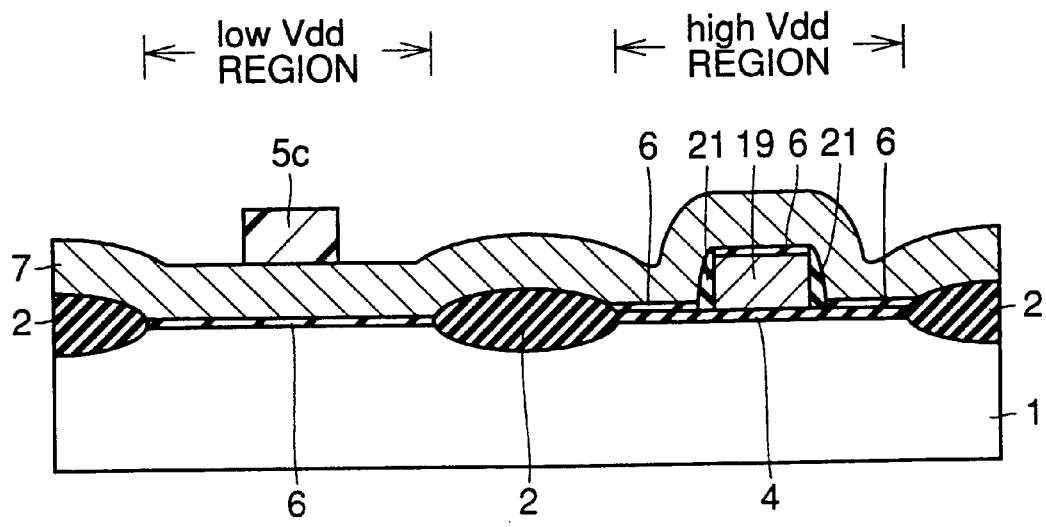

A second doped polysilicon film 7 is formed to generally cover the entire surface. A resist pattern 5c is formed on the region of second doped polysilicon film 7 to be the first gate electrode 18 (see FIG. 1). As a result, the structure as shown in FIG. 7 results.

Figure 8:
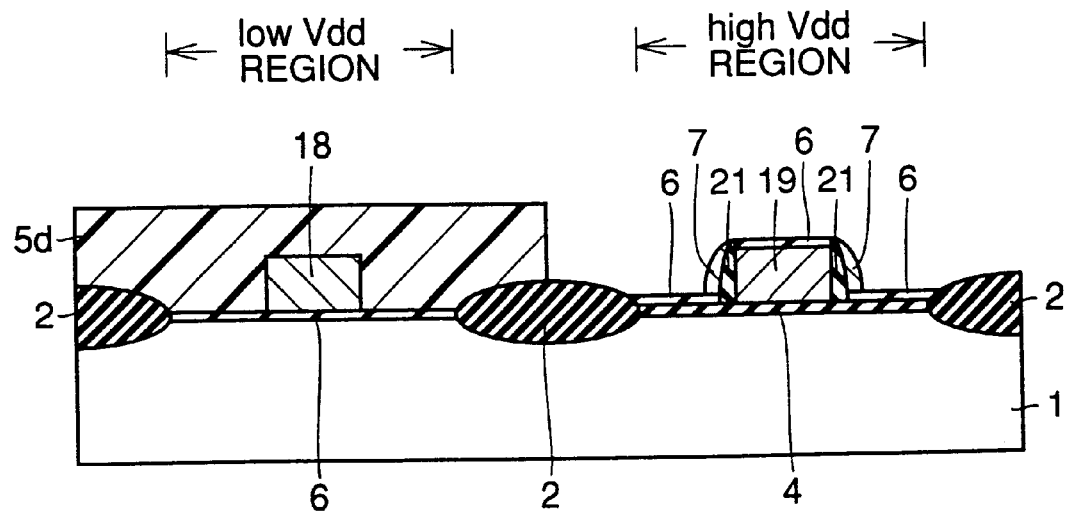

Then, using resist pattern 5c as a mask, a part of second doped polysilicon film 7 is anisotropically etched away to form first gate electrode 18 (see FIG. 1). Herein, silicon oxide film 6 formed by the thermal oxidation during forming first gate insulating film 6 is on second gate electrode 19. As a result, during the anisotropic etching for forming first gate electrode 18, silicon oxide film 6 serves as a stopper, so that damages such as partial removal of second gate electrode 19 by the anisotropic etching can be prevented. Furthermore, second doped polysilicon film 7 is formed on first gate insulating film 6, resist pattern 5d (see FIG. 8) is not directly formed on first gate insulating film 64 positioned under first gate electrode in the manufacturing process according to the first embodiment. Therefore, as is the case with second gate insulating film 4, defects caused by a processing of removing a resist pattern on the surface of first gate insulating film 6 can be prevented. Thereafter, resist pattern 5c (see FIG. 7) is removed. A resist pattern 5d (see FIG. 8) is formed to cover the low Vdd region. Thus, the structure as shown in FIG. 8 results. At the time, second doped polysilicon film 7 also remains on a side of sidewall nitride film 21.

Figure 9:
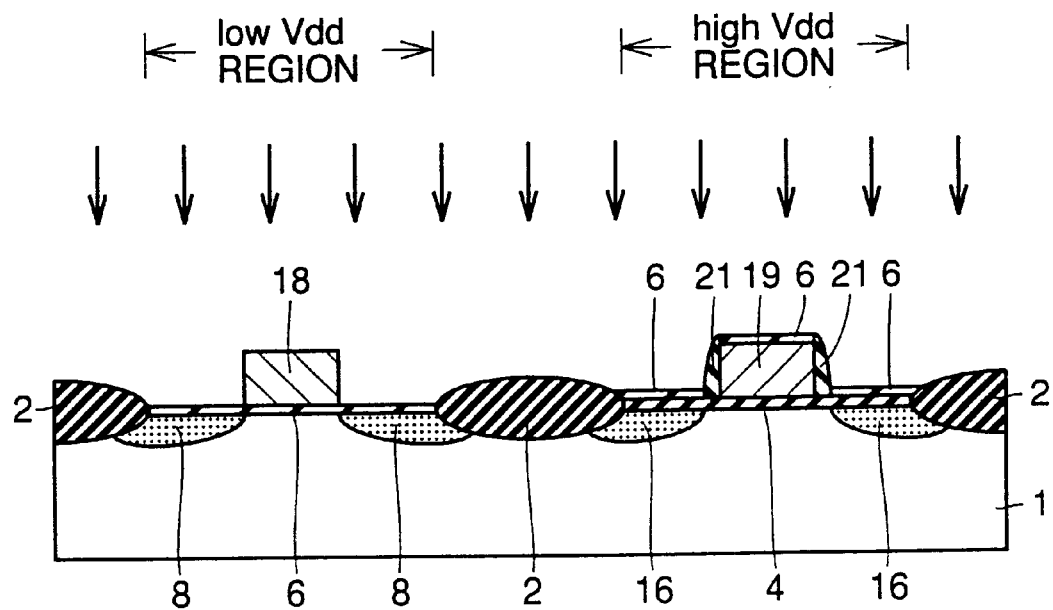

Second doped polysilicon film 7 on the side of sidewall nitride film 21 is removed by means of isotropic etching. Thereafter, resist pattern 5d is removed. An n type impurity is introduced into a prescribed region of the main surface of p type semiconductor substrate 1 to form low concentration, n type impurity diffusion regions 8 and 16 as shown in FIG. 9. The n type impurity may be phosphorous or arsenic.

Figure 10:
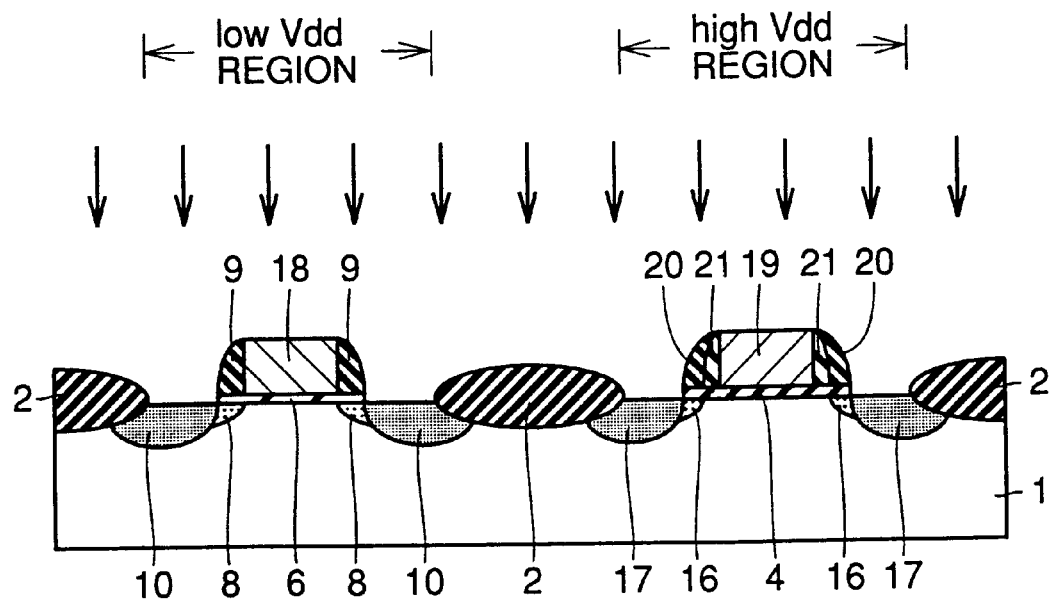

Sidewall oxide films 9 and 20 are formed on sides of first gate electrode 18 and sidewall nitride film 21. First and second gate insulating films 4 and 6 in the region other than those positioned under first and second gate electrodes 18 and 19, sidewall oxide films 9 and 20 and sidewall nitride film 21 are etched away. An n type impurity is introduced into a prescribed region of the main surface of p type semiconductor substrate 1 to form high concentration, n type impurity diffusion regions 10 and 17 as shown in FIG. 10.

The 2-power supply semiconductor device according to the first embodiment is thus manufactured.

Note that in the 2-power supply semiconductor device according to the first embodiment, sidewall nitride film 21 serving as the oxidation protection film is formed on a side of second gate electrode 19, the same effects can be brought about by forming sidewall nitride film 21 serving as the oxidation protection film on a side of first gate electrode 18.

Second Embodiment

Figure 11:
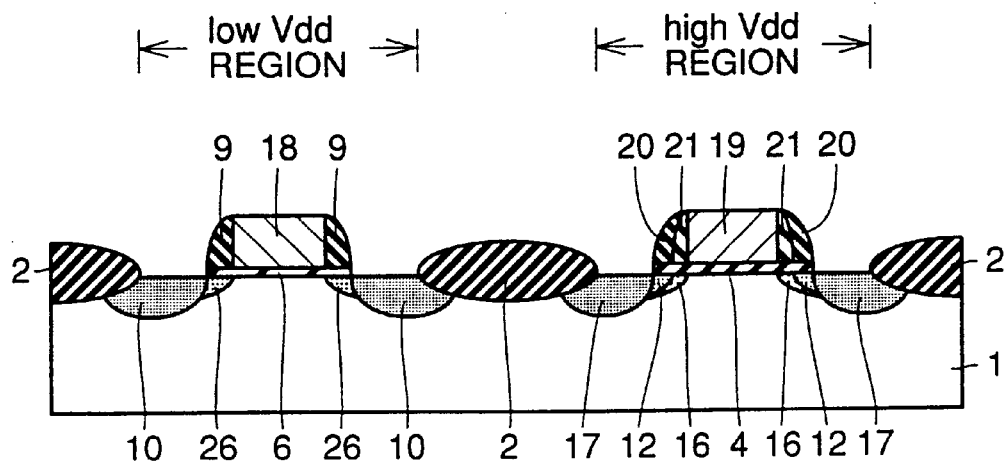
FIG. 11 is a cross sectional view showing a 2-power supply semiconductor device including a plurality of field effect transistors according to a second embodiment of the invention.

Referring to FIG. 11, in a 2-power supply semiconductor device including a plurality of field transistors according to a second embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10 and a pair of impurity diffusion regions 26, spaced apart from each other and having a first channel region therebetween. Intermediate concentration, n type impurity diffusion region 26 formed adjacent to the first channel region and high concentration, n type impurity diffusion region 10 formed adjacent to n type impurity region 26 constitute an LDD structure. A first gate insulating film 6 is formed on the first channel region. A first gate electrode 18 is formed on first insulating film 6. A sidewall oxide film 9 is formed on a side of first gate electrode 18. First source/drain regions 10, impurity diffusion regions 26, first gate insulating film 6, and first gate electrode 18 form the first field effect transistor.

In the high Vdd region, there are formed, on the main surface of semiconductor substrate 1, a pair of second source/drain regions 17, pairs of impurity diffusion regions 16 and 12 adjacent thereto, spaced apart from each other and having a second channel therebetween. Low concentration, n type impurity diffusion region 16 formed adjacent to the second channel region, intermediate concentration, n type impurity diffusion region 12 and high concentration, n type impurity diffusion region 17 formed adjacent to n type impurity diffusion region 16 constitute an LDD structure. A second gate insulating film 4 is formed on the second channel region. A second gate electrode 19 is formed on second gate insulating film 4. A sidewall nitride film 21 serving as an oxidation protection film to prevent second gate electrode 19 from being oxidized is formed on a side of second gate electrode 19. A sidewall oxide film 20 is formed on a side of sidewall nitride film 21. Second source/drain regions 17, impurity diffusion regions 16 and 12, second gate insulating film 4, and second gate electrode 19 form the second field effect transistor. Herein, the thickness of the second gate insulating film 4 of the second field effect transistor supplied with high Vdd should be larger than the thickness of the first gate insulating film 6 of the first field effect transistor supplied with low Vdd.

Thus, with sidewall nitride film 21 serving as the oxidation protection film to prevent the oxidation of second gate electrode 19 being present on a side of second gate electrode 19, an oxidizing step to form the first gate insulating film 6 of first field effect transistor can be performed in the manufacturing process which will be described. As a result, as is the case with the first embodiment, a gate bird's beak can be prevented from being generated in second gate electrode 19. As a result, electric characteristics of the semiconductor device including the plurality of field effect transistors can be prevented from deteriorating. Furthermore, the second source/drain regions 17 and impurity diffusion regions 12 and 16 of the second field effect transistors which are supplied with high Vdd have a three-region LDD structure, a high electric field in the boundary region between the second channel region and second source/drain regions as well as impurity diffusion regions 12 and 16 can be more effectively reduced. As a result, the fluctuation of the threshold voltage of the second field effect transistor can be prevented. As a result, electrical characteristics of the semiconductor device including the plurality of field effect transistors can be prevented from deteriorating.

Referring to FIGS. 12 to 21, a method of manufacturing the 2-power supply semiconductor device including the plurality of field effect transistors according to the second embodiment will be described.

Figure 12:
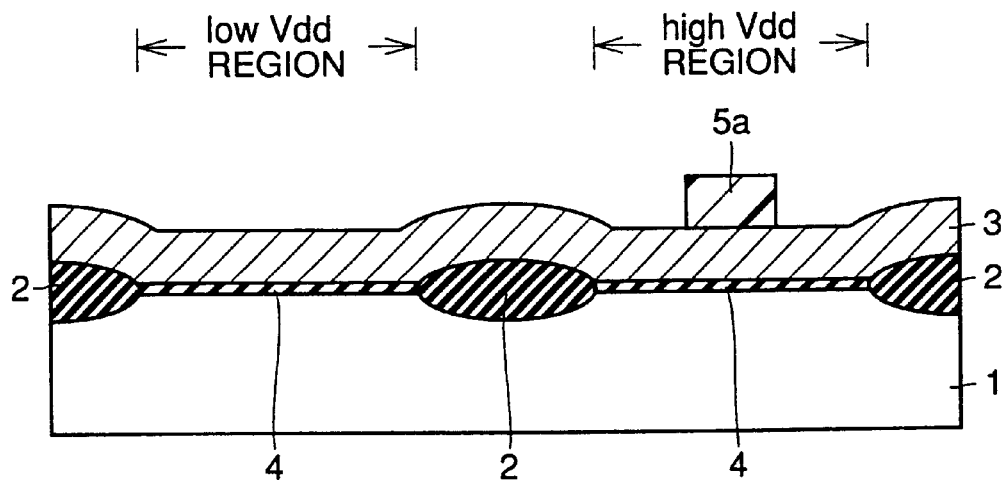
FIGS. 12 to 21 are cross sectional views for use in illustration of the first to tenth steps in the process of manufacturing the 2-power supply semiconductor device including the plurality of field effect transistors according to the second embodiment shown in FIG. 11.

As shown in FIG. 12, isolation oxide film 2 to surround an active region is formed on the main surface of p type semiconductor substrate 1. Second gate insulating film 4 is formed on the active region of the main surface of semiconductor substrate 1. A first doped polyslicon film 3 is formed on second gate insulating film 4 and isolation oxide film 2. A resist pattern 5a is formed on the region of first doped polysilicon film 3 positioned in the high Vdd region to be second gate electrode 19 (see FIG. 11).

Figure 13:
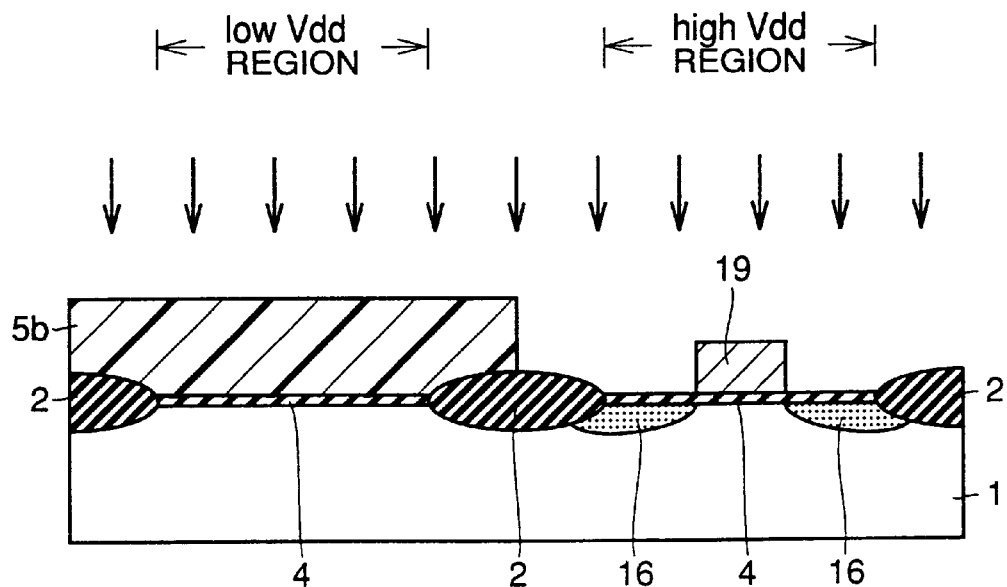

Then, using resist pattern 5a as a mask, a part of first doped polysilicon film 3 is anisotropically etched away to form second gate electrode 19. Thereafter, resist pattern 5a is removed. A resist pattern 5b is formed on second gate insulating film 4 and isolation oxide film 2 positioned in the low Vdd region. An n type impurity is introduced into a prescribed region of semiconductor substrate 1 to form a low concentration, n type impurity diffusion region 16 as shown in FIG. 13. The n type impurity used is phosphorus, the introduction energy is 20 keV, and the dose is $2 \times 10^{13} cm^{-2}$. The introduction energy may be in the range from 10 to 30 keV. Herein, since second gate electrode 19 has been formed on second gate insulating film 4, a resist pattern is not directly formed in the region of the surface of second gate insulating film 4 in which second gate electrode 19 is positioned, in the process of manufacturing which will be described. Defects in the region of the surface of second gate insulating film 4 which are caused by a processing of removing the resist patterns or a light etching processing can be prevented. Resist pattern 5b is thereafter removed.

Figure 14:
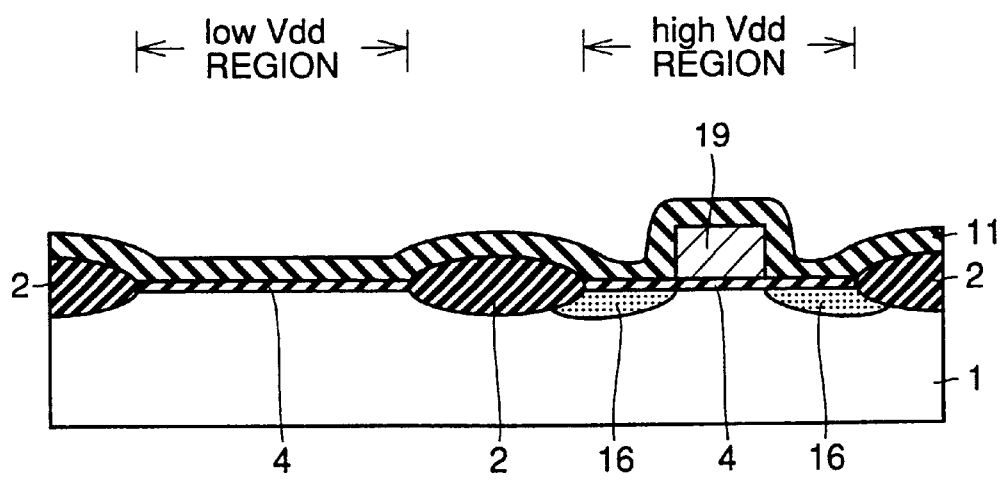

A silicon nitride film 11 is formed on second gate insulating film 4, second gate electrode 19 and isolation oxide film 2. Thus, the structure as shown in FIG. 14 results.

Figure 15:
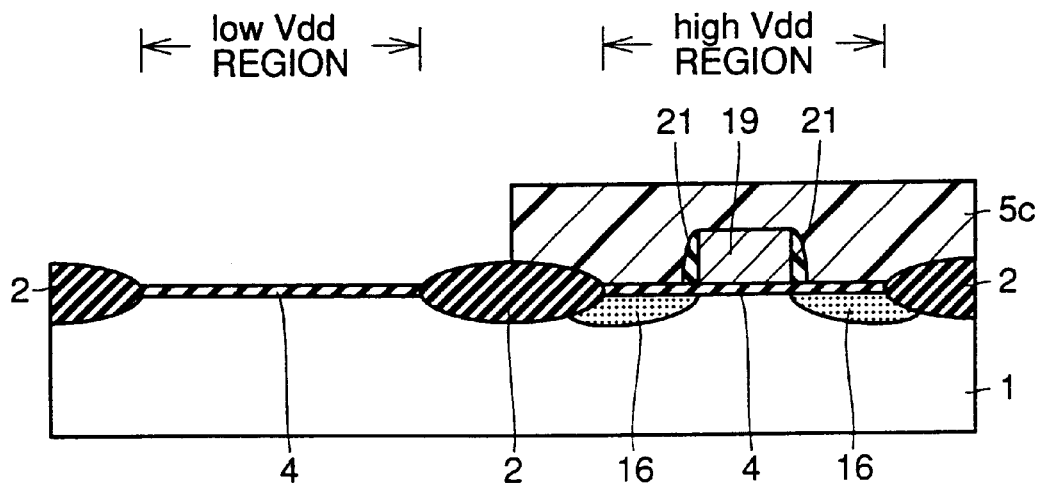

Silicon nitride film 11 is then anisotropically etched to form sidewall nitride film 21 (see FIG. 11) which serves as an oxidation protection film to prevent second gate electrode 19 from being oxidized on a sidewall of second gate electrode 19. Resist pattern 5c (see FIG. 15) is formed on second gate insulating film 4, second gate electrode 19 and sidewall nitride film 21 to cover the high Vdd region to obtain the structure as shown in FIG. 15.

Figure 16:
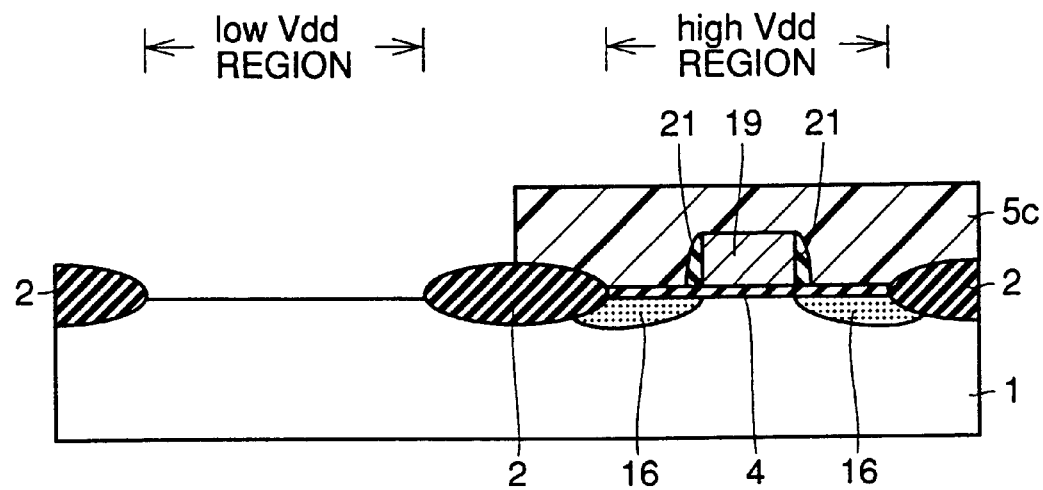

Then, second gate insulating film 4 present in the low Vdd region is isotropically etched to obtain the structure as shown in FIG. 16. Resist pattern 5c is then removed away.

Figure 17:
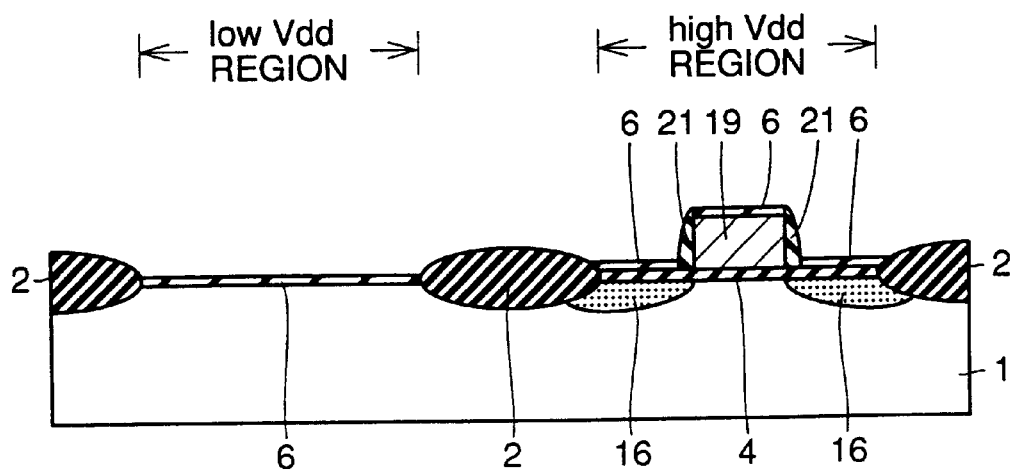

First gate insulating film 6 is formed by means of thermal oxidation on the portion of the main surface of semiconductor substrate 1 positioned in the low Vdd region, on the surface of second gate insulating film 4, and on second gate electrode 19. The structure as shown in FIG. 17 thus results. Herein, the thermal oxidation to form first gate insulating film 6 may be performed after forming sidewall nitride film 21 serving as the oxidation protection film to prevent second gate electrode 19 from being oxidized on a side of second gate electrode 19. As a result, a lower part of a side of second gate electrode 19 can be prevented from being oxidized, and a gate bird's beak can be prevented.

Figure 18:
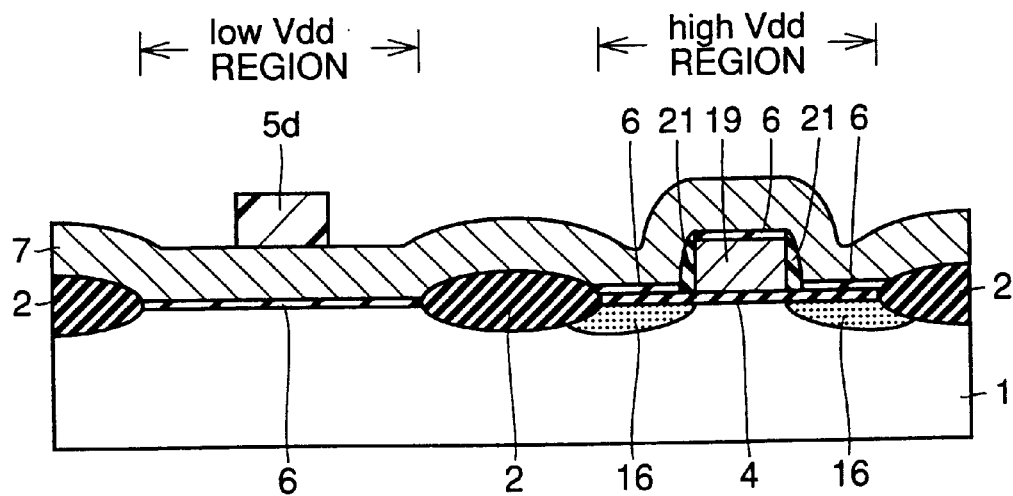

A second doped polysilicon film 7 (see FIG. 18) is formed to generally cover the entire surface. A resist pattern 5d (see FIG. 18) is formed on the region of second doped polysilicon film 7 to be the first gate electrode (see FIG. 11). Thus, the structure as shown in FIG. 18 results.

Figure 19:
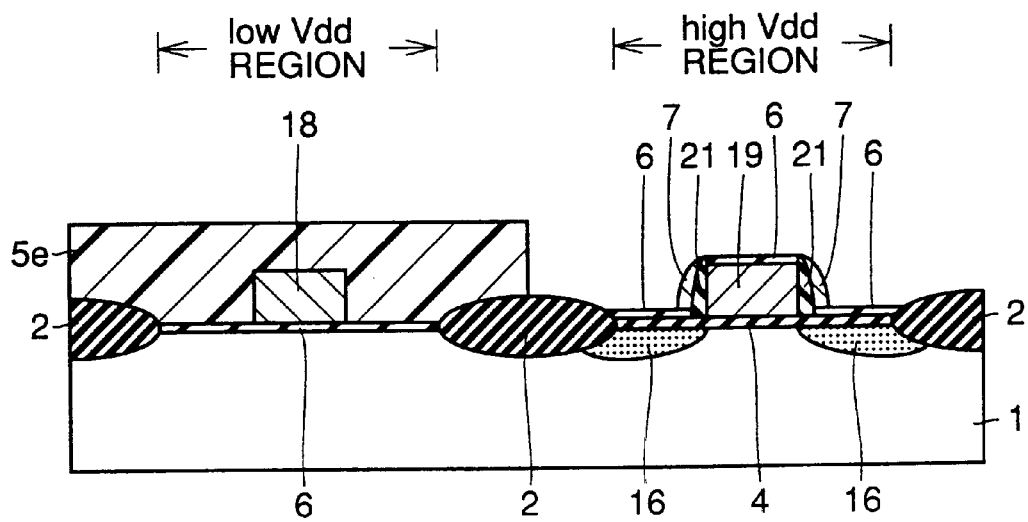

Then, using resist pattern 5d as a mask, a part of second doped polysilicon film 7 is anisotropically etched away to form first gate electrode 18 (see FIG. 11). Herein, silicon oxide film 6 formed by the thermal oxidation during forming first gate insulating film 6 is present on second gate electrode 19. Therefore, during the anisotropic etching for forming first gate electrode 18, silicon oxide film 6 serves as a stopper, so that damages such as partial removal of second gate electrode 19 by the anisotropic etching can be prevented. Thereafter, resist pattern 5d (see FIG. 18) is removed. A resist pattern 5e (see FIG. 19) is formed to generally cover the low Vdd region. Thus, the structure as shown in FIG. 19 results. At the time, second doped polysilicon film 7 also remains on a side of sidewall nitride film 21.

Figure 20:
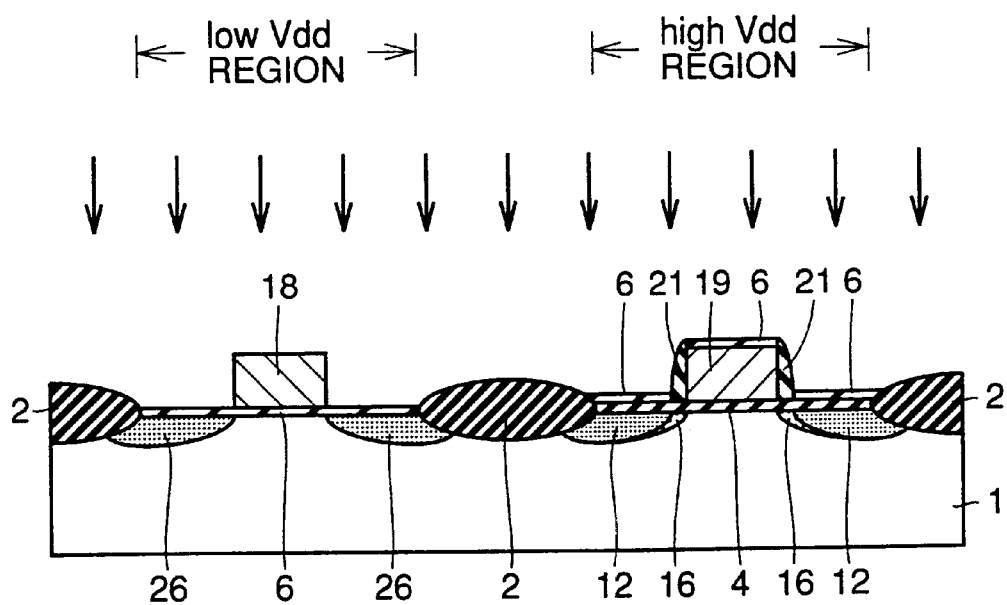

Then, second doped polysilicon film 7 on the side of sidewall nitride film 21 is isotropically etched away. Then, resist pattern 5e (see FIG. 19) is removed. An n type impurity is introduced into a prescribed region of the main surface of semiconductor substrate 1, and thus intermediate concentration, n type impurity diffusion regions 26 and 12 are formed as shown in FIG. 20. The n type impurity is arsenic, the introduction energy is 60 keV, and the dose is $2 \times 10^{13} cm^{-2}$. The introduction energy may be in the range from 30 to 80 keV.

Figure 21:
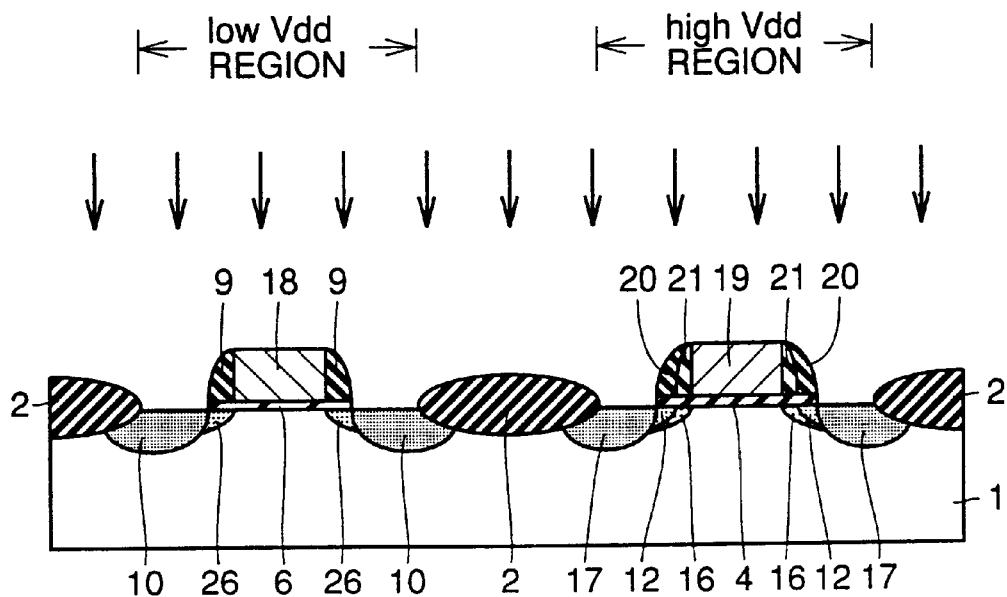

Sidewall oxide films 9 and 20 (see FIG. 21) are then formed on a side of first gate electrode 18 and sidewall nitride film 21. First and second gate insulating films 4 and 6 in the region other than in the regions positioned under first and second gate electrodes 18 and 19, sidewall oxide films 9 and 20 and sidewall nitride film 21 are etched away. An n type impurity is introduced into a prescribed region of the main surface of semiconductor substrate. As shown in FIG. 21, high concentration, n type impurity diffusion regions 10 and 17 are formed. Herein, the n type impurity is arsenic, the introduction energy is 40 keV, and the dose is $5 \times 10^{13} cm^{-2}$. The introduction energy may be in the range from 30 to 60 keV.

Thus, the 2-power supply semiconductor device including the plurality of field effect transistors according to the second embodiment is manufactured.

Third Embodiment

Figure 22:
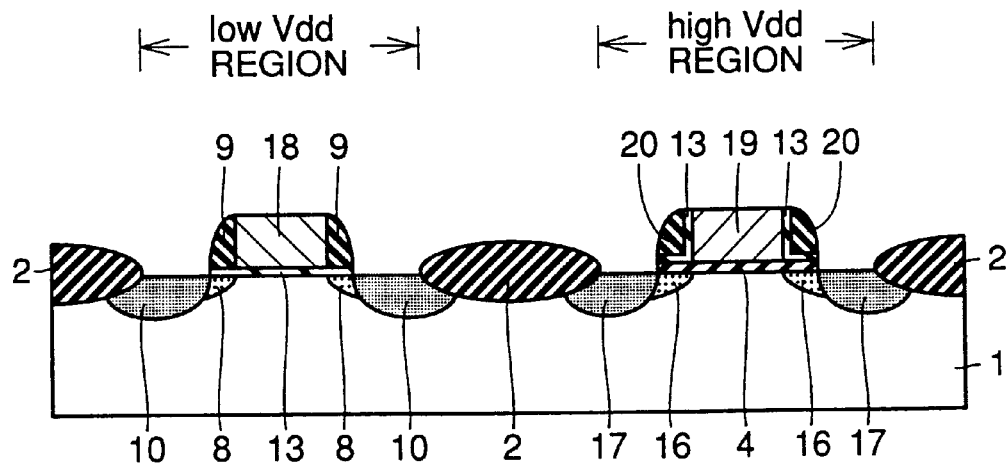
FIG. 22 is a cross sectional view showing a 2-power supply semiconductor device including a plurality of field effect transistors according to a third embodiment of the invention.

Referring to FIG. 22, in a 2-power supply semiconductor device including a plurality of field transistors according to a third embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of impurity diffusion regions 8, spaced apart from each other and having a first channel region. Low concentration, n type impurity diffusion region 8 formed adjacent to the first channel region and high concentration, n type impurity diffusion region 10 formed adjacent to n type impurity region 8 constitute an LDD structure. An oxide nitride film 13 serving as a gate insulating film is formed on the first channel region. A first gate electrode 18 is formed on oxide nitride film 13. A sidewall oxide film 9 is formed on a side of first gate electrode 18. First source/drain regions 10 and impurity diffusion regions 8, oxide nitride film 13, and first gate electrode 18 form the first field effect transistor.

In the high Vdd region, there are formed, on the main surface of semiconductor substrate 1, a pair of second source/drain regions 17, and a pair of impurity diffusion regions 16 spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the channel region. A second gate electrode 19 is formed on second gate insulating film 4. An oxide nitride film 13 is formed on a side of second gate electrode 19 and on second gate insulating film 4. A sidewall oxide film 20 is formed on oxide nitride film 13. Second source/drain regions 17, and impurity diffusion regions 16, second gate insulating film 4, and second gate electrode 19 form the second field effect transistor. Thus, the gate insulating film 13 of the first field effect transistor is formed of an oxide nitride film, an end of second gate electrode 19 in the junction of a lower part of the side of second gate electrode 19 and second gate insulating film 4 can be prevented from being excessively oxidized. The generation of a gate bird's beak can be restricted. As a result, electrical characteristics of the semiconductor device including the plurality of field effect transistors can be prevented from deteriorating. Furthermore, since the first gate insulating film is formed of oxide nitride film 13, the driving capability of the transistor may be improved in terms of thickness as compared to a conventional silicon oxide film or the like.

Figure 23:
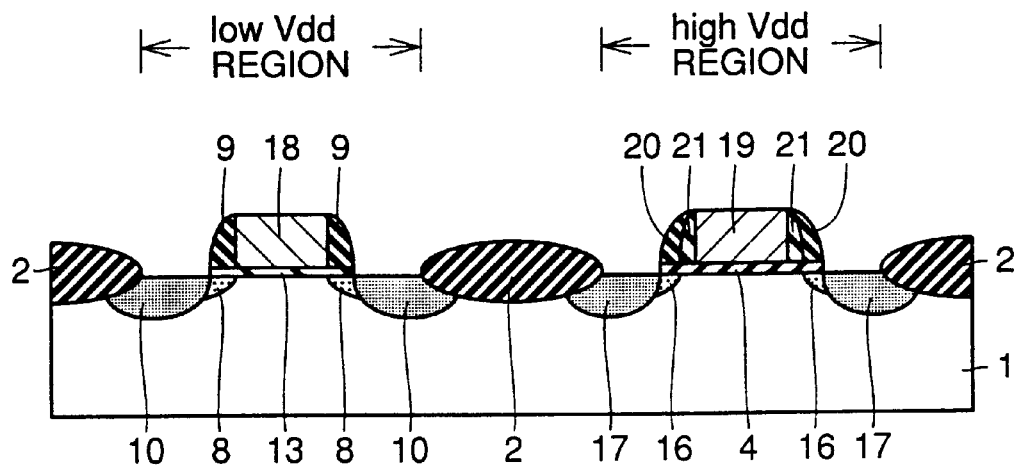
FIG. 23 is a cross sectional view showing a first variation of the 2-power supply semiconductor device including the plurality of field effect transistors according to the third embodiment.
Figure 24:
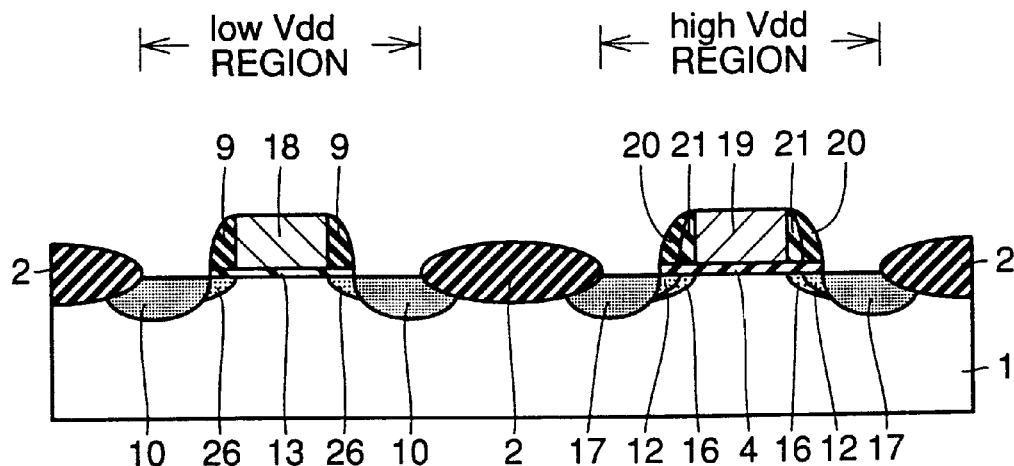
FIG. 24 is a cross sectional view showing a second variation of the 2-power supply semiconductor device including the plurality of field effect transistors according to the third embodiment.

Referring to FIG. 23, a first variation of the 2-power supply semiconductor device including the plurality of field effect transistors according to the third embodiment has basically the same structure as the 2-power supply semiconductor device according to the first embodiment shown in FIG. 1. However, in the first variation shown in FIG. 23, the first gate insulating film 13 is formed of oxide nitride film. A second variation of the third embodiment shown in FIG. 24 has basically the same structure as the device according to the second embodiment shown in FIG. 11. However, as shown in FIG. 24, in the device according to the second variation, as is the case with the examples shown in FIGS. 22 and 23, the first gate insulating film 13 is formed of oxide nitride film. Therefore, the driving capability of the transistor may be improved as compared to the case of using the conventional silicon oxide film in terms of thickness in addition to the effects brought about according to the first and second embodiments.

Referring to FIGS. 25 to 32, a process of manufacturing the 2-power supply semiconductor device including the plurality of field effect transistors shown in FIG. 22 according to the third embodiment will be described.

Figure 25:
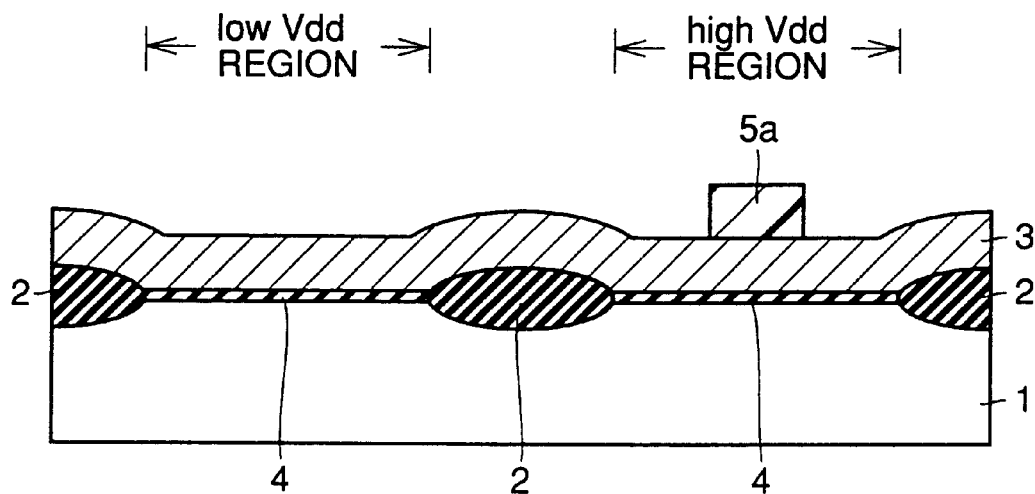
FIGS. 25 to 32 are cross sectional views showing the first to eighth steps in the process of manufacturing the 2-power supply semiconductor device including the plurality of field effect transistors according to the third embodiment shown in FIG. 22.

The manufacturing process shown in FIG. 25 is identical to the manufacturing process according to the first embodiment shown in FIG. 2.

Figure 26:
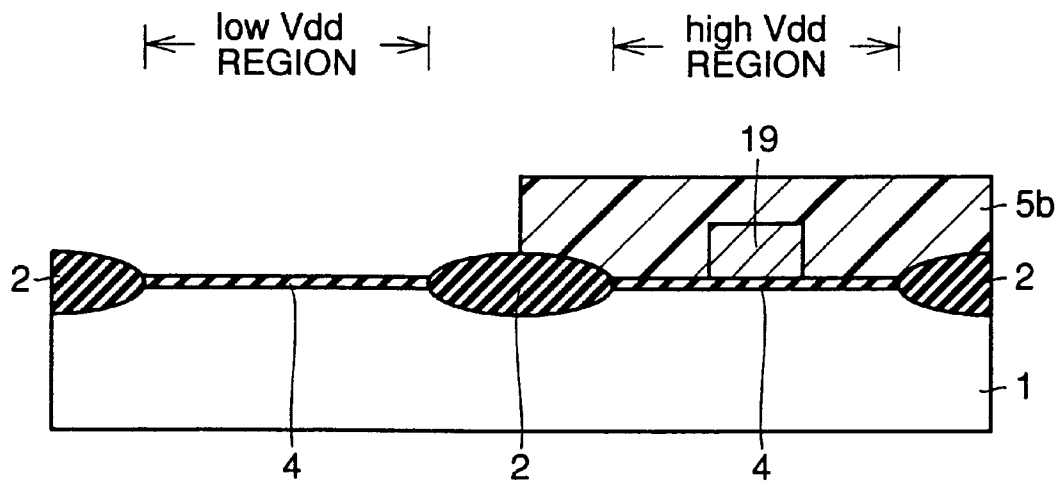

Now, a part of first doped polysilicon film 3 is anisotropically etched away, using a resist pattern 5a (see FIG. 25) as a mask, to form second gate electrode 19 (see FIG. 22), followed by removal of resist pattern 5a (see FIG. 25). A resist pattern 5b (see FIG. 26) is formed on second gate insulating film 4 and on second gate electrode 19 to cover the high Vdd region, and the structure as shown in FIG. 26 results. Herein, resist pattern 5b is formed after second gate electrode 19 is formed on second gate insulating film 4, resist pattern 5b is not directly formed in the region of the surface of second gate insulating film 4 in which second gate electrode 19 is positioned. As a result, defects in the region of the surface of second insulating film 4 caused by a processing of removing resist pattern 5b or a light etching processing can be prevented.

Figure 27:
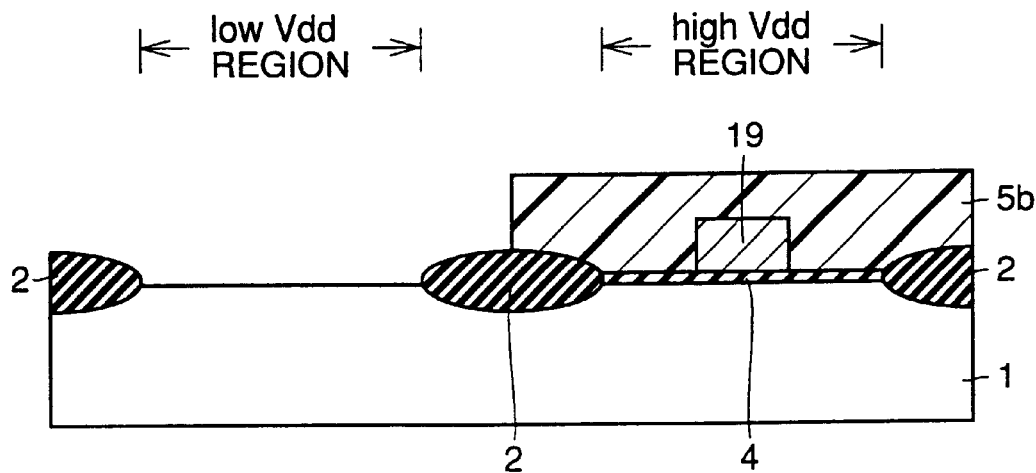

Second gate insulating film 4 present in the low Vdd region is isotropically etched away to obtain the structure as shown in FIG. 27. Thereafter, resist pattern 5b is removed.

Figure 28:
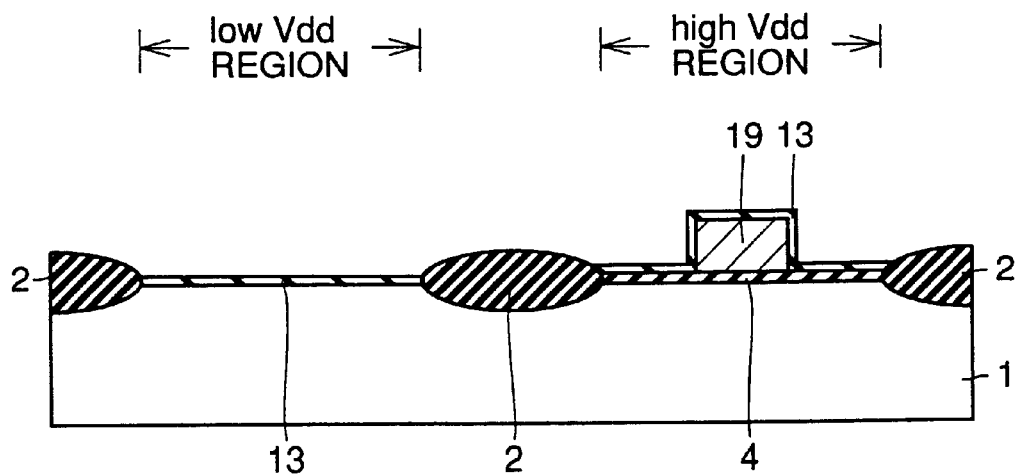
Figure 29:
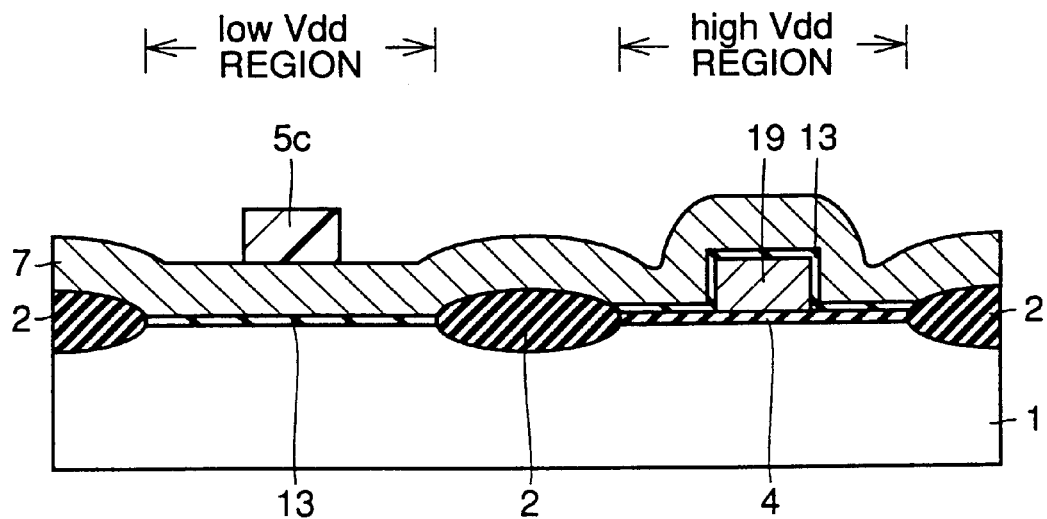
Figure 30:
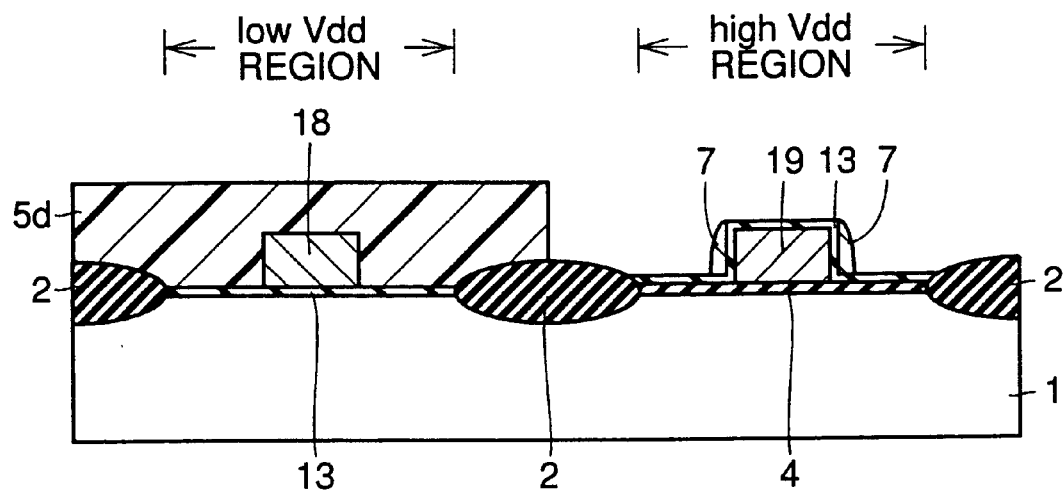
Figure 31:
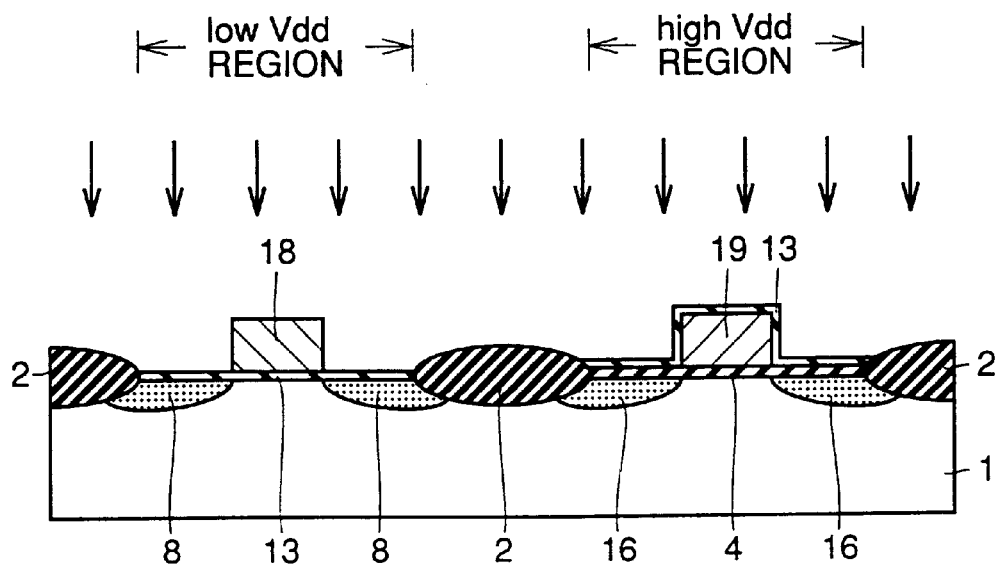
Figure 32:
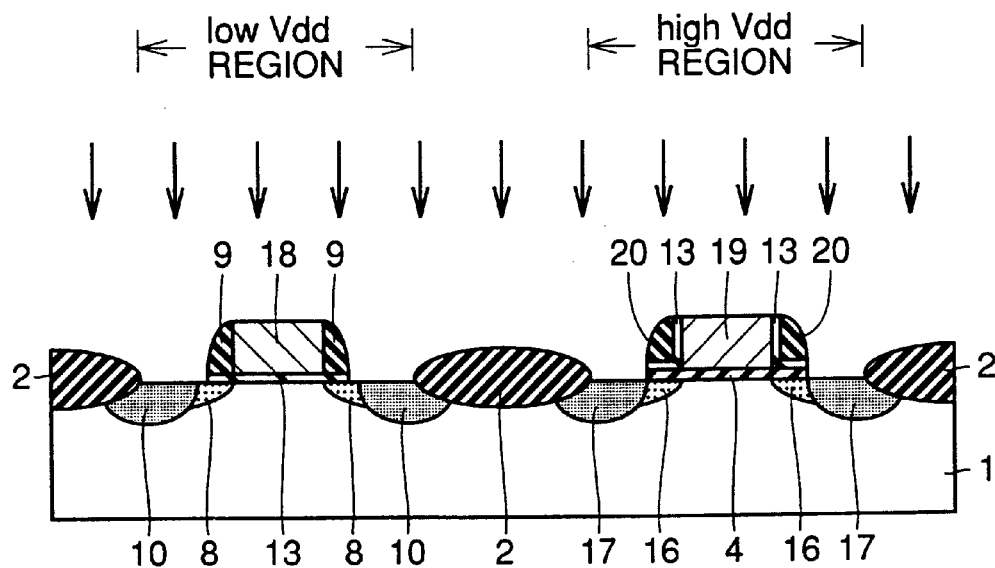

Then, oxide nitride film 13 to be the first gate insulating film is formed at the position of the main surface of semiconductor substrate 1 positioned in the low Vdd region, on the surface of second gate insulating film 4, and on second gate electrode 19 by means of thermal oxidation using $N_2O$ or $O_2$ as a gas atmosphere. Thus, the structure as shown in FIG. 28 results. Herein, oxide nitride film 13 is formed as the first gate insulating film, an end of second gate electrode 19 can be prevented from being excessively oxidized in the junction of a lower part of the side of second gate electrode 19 and second gate insulating film 4. Thus, a gate bird's beak can be prevented. Furthermore, since oxide nitride film 13 is formed as the first gate insulating film, the thickness of oxide nitride film 13 as the first gate insulating film may be smaller than a conventional silicon oxide film, while maintaining a prescribed breakdown voltage. As a result, the driving voltage of the first field effect transistor can be reduced.

The manufacturing process as shown in FIGS. 29 to 32 is substantially identical to the manufacturing process according to the first embodiment shown in FIGS. 7 to 10.

Thus, the 2-power supply semiconductor device according to the third embodiment as shown in FIG. 22 is manufactured.

Fourth Embodiment

Figure 33:
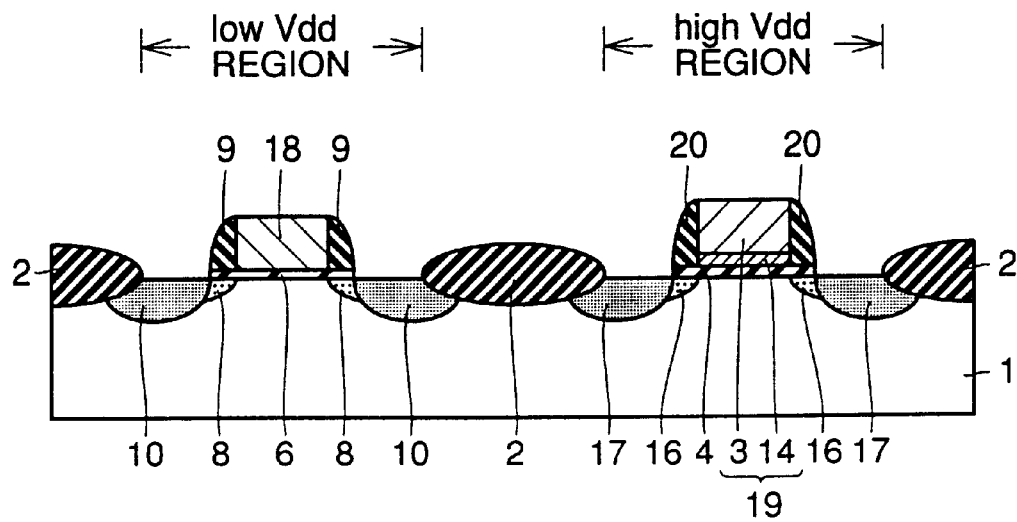
FIG. 33 is a cross sectional view showing a 2-power supply semiconductor device including a plurality of field effect transistors according to a fourth embodiment of the invention.

Referring to FIG. 33, in a 2-power supply semiconductor device including a plurality of field transistors according to a fourth embodiment of the invention, there are formed, on a main surface of a p type semiconductor substrate 1, a first field effect transistor supplied with a first power supply voltage (low Vdd) and a second field effect transistor supplied with a second power supply voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of impurity diffusion regions 8, spaced apart from each other and having a first channel region therebetween. Low concentration, n type impurity diffusion region 8 formed adjacent to the first channel region and high concentration, n type impurity diffusion region 10 formed adjacent to n type impurity region 8 constitute an LDD structure. A first gate insulating film 6 is formed on the first channel region. A first gate electrode 18 is formed on first insulating film 6. A sidewall oxide film 9 is formed on a side of first gate electrode 18. First source/drain regions 10, impurity regions 8, first gate insulating film 6, and first gate electrode 18 form the first field effect transistor.

In the high Vdd region, there are formed, on the main surface of semiconductor substrate 1, a pair of second source/drain regions 17 and a pair of impurity diffusion regions 16, spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the second channel region. A nitrogen doped polysilicon film 14 serving as an anti-oxidation conductive film is formed on second gate insulating film 4. A first doped polysilicon film 13 doped with a p type or n type impurity is formed on nitrogen doped polysilicon film 14. Nitrogen doped polysilicon film 14 and first doped polysilicon film 3 form a second gate electrode 19. A sidewall oxide film 20 is form on a side of second gate electrode 19. Second source/drain regions 17, impurity diffusion regions 16, second gate insulating film 4, and second gate electrode 19 form the second field effect transistor. Herein, the thickness of second gate insulating film 4 of the second field effect transistor should be larger than the thickness of the first gate insulating film 6 of the first field effect transistor in view of breakdown voltage.

As described above, since nitrogen doped polysilicon film 14 serving as an anti-oxidation conductive film is formed on second gate insulating film 4, it is not necessary to form a resist pattern directly on the surface of second gate insulating film 4 in the following process of manufacturing. Furthermore, before forming second gate electrode 19, first gate insulating film 6 is formed using nitrogen doped polysilicon film 14 as a mask, an oxidizing step may be performed while hardly oxidizing the surface of nitrogen doped polysilicon film 14. As a result, in the oxidizing step to form a gate insulating film 6, a lower part of a side of second gate electrode 19 is not oxidized, and a gate bird's beak can be prevented. Thus, the threshold voltage of the second field effect transistor can be prevented from increasing, and electrical characteristics of the semiconductor device including the plurality of field effect transistors can be prevented from deteriorating.

In addition, since first and second gate insulating films 6 and 4 are formed in the above-described manner, a conductive layer may be later formed in the region positioned above first and second gate insulating films 4 and 6, and therefore first and second gate electrodes 18 and 19 may be formed in a single patterning processing. As a result, the number of steps included in the manufacture of the semiconductor device may be reduced.

In addition, nitrogen doped polysilicon film 14 is formed on second gate insulating film 4, a resist pattern is not directly formed on second gate insulating film 4. As a result, defects such as local irregularities in the gate insulating film as formed during removing a resist pattern can be avoided. Therefore, the threshold voltages of the field effect transistors may be prevented from fluctuating. Electrical characteristics of the semiconductor device including the plurality of field effect transistors may be prevented from deteriorating.

Referring to FIGS. 34 to 37, a process of manufacturing the 2-power supply semiconductor device including the plurality of field effect transistors according to the fourth embodiment will be described.

Figure 34:
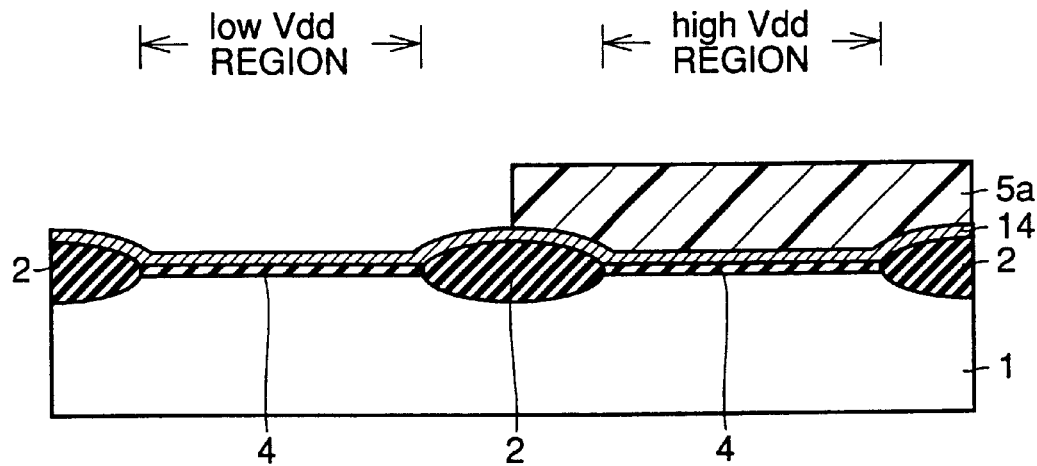
FIGS. 34 to 37 are cross sectional views for use in illustration of the first to fourth steps in the process of manufacturing the 2-power supply semiconductor device including the plurality of field effect transistors according to the fourth embodiment shown in FIG. 33.

Isolation oxide film 2 is formed to surround an active region on the main surface of p type semiconductor substrate 1. Second gate insulating film 4 is formed on the active region of the main surface of semiconductor substrate 1. Nitrogen doped polysilicon film 14 to be the anti-oxidation conductive film is formed on second gate insulating film 4 and isolation oxide film 2. Resist pattern 5a is formed on nitrogen doped polysilicon film 14 positioned in the high Vdd region. Thus the structure as shown in FIG. 34 is obtained. Since nitrogen doped polysilicon film 14 is formed on second gate insulating film 4 and resist pattern 5a is formed, resist pattern 5a is not directly formed on the surface of second gate insulating film. As a result, defects caused by a processing of removing resist pattern 5a or a light etching processing can be prevented on the surface of second gate insulating film 4. As a result, the fluctuation of the threshold voltages of the field effect transistors can be prevented. As a result, electrical characteristics of the semiconductor device including the plurality of field effect transistors can be prevented from the deteriorating.

Figure 35:
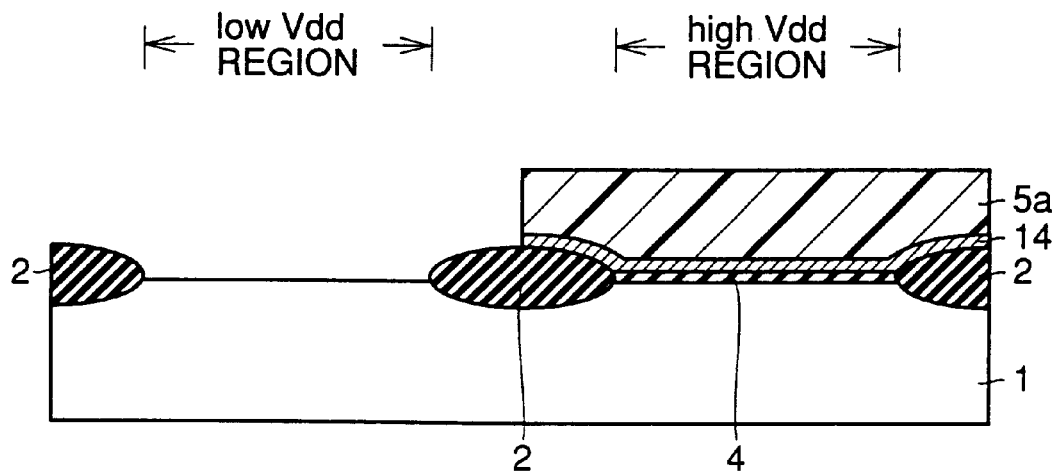

Nitrogen doped polysilicon film 14 and second gate insulating film 4 present in the low Vdd region are removed by means of isotropic etching, and the structure as shown in FIG. 35 results. Resist pattern 5a is thereafter removed.

Figure 36:
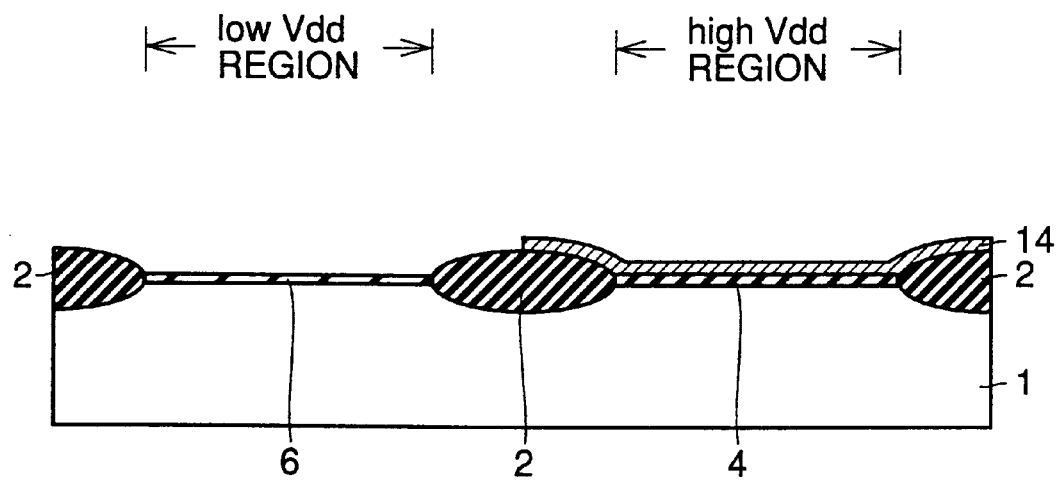

As shown in FIG. 36, first gate insulating film 6 is formed on the main surface of semiconductor substrate 1 positioned in the low Vdd region. At the time, the surface of nitrogen doped polysilicon film 14 is little oxidized, because its surface had nitrogen introduced.

Figure 37:
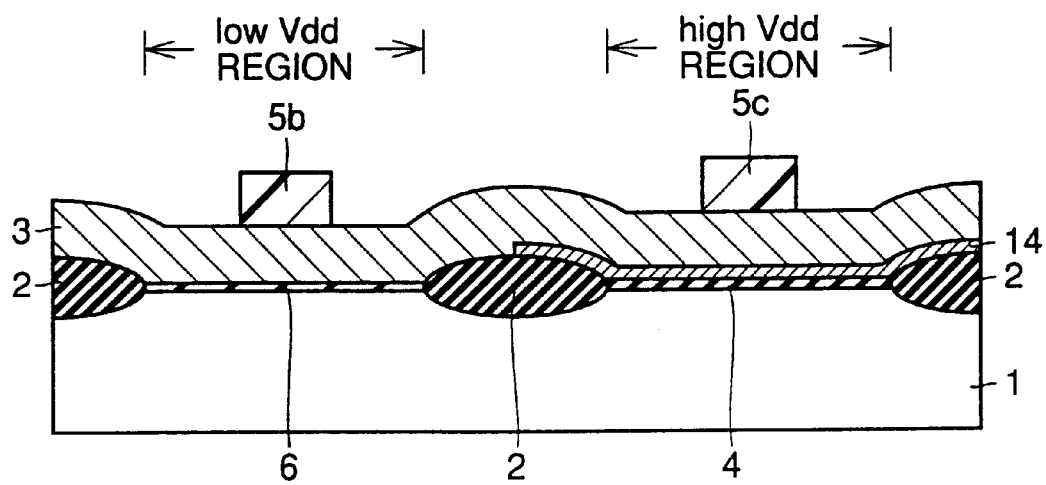

First doped polysilicon film 3 is formed on first gate insulating film 6, nitrogen doped polysilicon film 14 and isolation oxide film 2. Resist patterns 5b and 5c are formed on the regions of first doped polysilicon film 3 to be first and second gate electrodes 18 and 19 (see FIG. 33), and the structure as shown in FIG. 37 results.

Using resist patterns 5b and 5c as masks, a part of first doped polysilicon film 3 is anisotropically etched away to form first and second gate electrodes 18 and 19 (see FIG. 33). Since nitrogen doped polysilicon film 14 serving as the anti-oxidation conductive film is formed on second gate insulating film 4, first and second gate electrodes 18 and 19 may be formed in a single etching processing after first and second gate insulating films 6 and 4 are formed. In addition, since first gate electrode 18 and second gate electrode 19 may be formed in a single anisotropic etching processing, the number of steps included in the manufacture of the semiconductor device may be reduced. Furthermore, since nitrogen doped polysilicon film 14 is formed on second gate insulating film 4, nitrogen doped polysilicon film 14 serves as a barrier against an impurity when the impurity is introduced to form second source/drain regions 17 and impurity diffusion regions 16 (see FIG. 33). As a result, the impurity can be effectively prevented from being introduced into the second channel region. As a result, erroneous operations of the second field effect transistor caused by introduction of the impurity into the second channel region can be more effectively prevented.

Thereafter, an impurity is introduced into a prescribed region of the main surface of semiconductor substrate 1, followed by formation of sidewall oxide films 9 and 20 (see FIG. 33) on sides of first and second gate electrodes 18 and 19 (see FIG. 33), and the semiconductor device as shown in FIG. 33 is formed.

The 2-power supply semiconductor device including the plurality of field effect transistors according to the fourth embodiment is thus manufactured.

Referring to FIGS. 38 to 41, a process of manufacturing a 2-power supply semiconductor device including a plurality of field effect transistors according to a first variation of the fourth embodiment will be now described.

Figure 38:
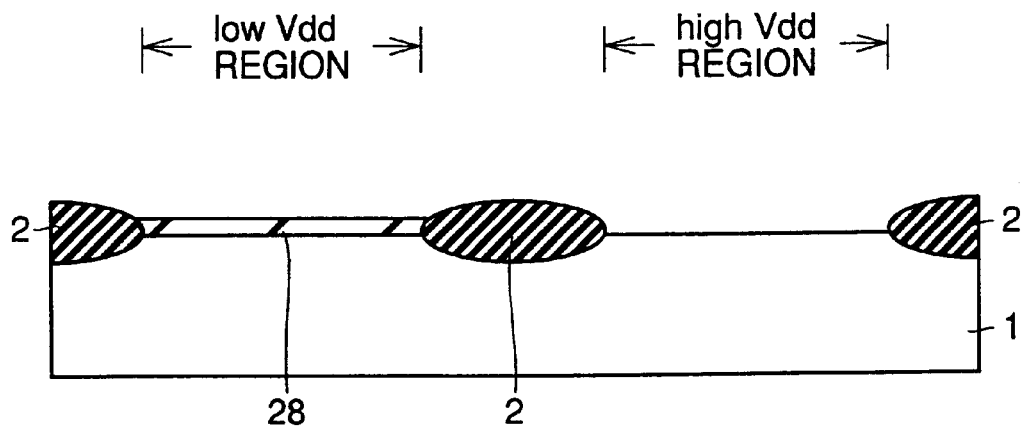
FIGS. 38 to 41 are cross sectional views for use in illustration of a process of manufacturing a 2-power supply semiconductor device including a plurality of field effect transistor according to a first variation of the fourth embodiment.

Isolation oxide film 2 is formed on the main surface of p type semiconductor substrate 1 to surround an active region. An oxide film (not shown) is formed on the main surface of semiconductor substrate 1. A resist pattern (not shown) is formed on the oxide film positioned in the low Vdd region. Using the resist pattern as a mask, an impurity is introduced into the main surface of semiconductor substrate 1 positioned in the high Vdd region. Using the resist pattern as a mask, the oxide film positioned in the high Vdd region is isotropically etched away. Thereafter, the resist pattern is removed to form the structure as shown in FIG. 38.

Figure 39:
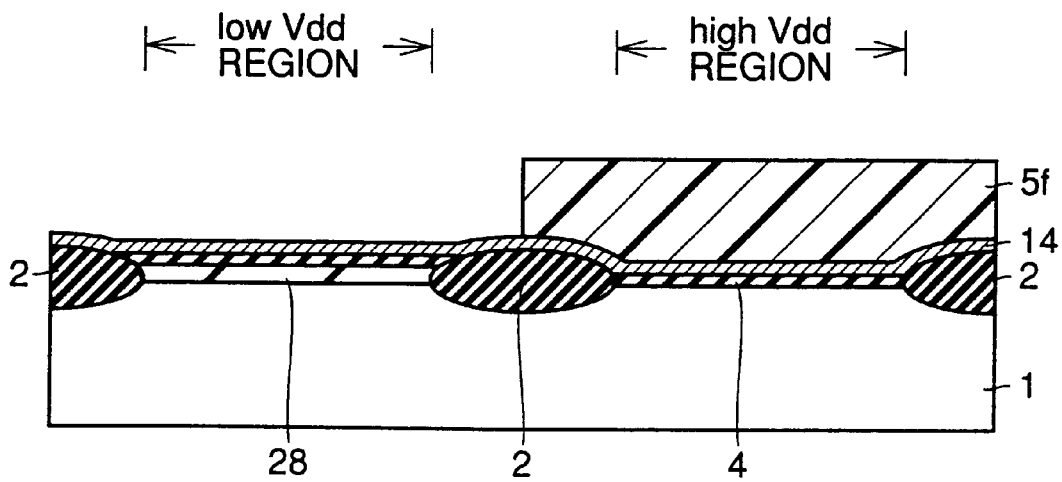
Figure 40:
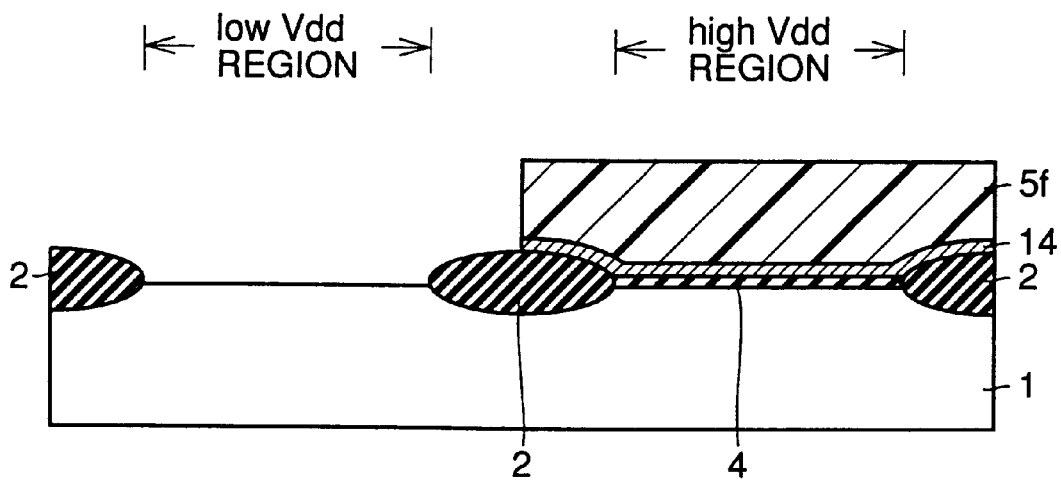

The manufacturing steps shown in FIGS. 39 and 40 are substantially identical to the steps of manufacturing the 2-power supply semiconductor device including the plurality of field effect transistors according to the fourth embodiment. However, an oxide film 28 serving as a substrate protection film is formed on the main surface of semiconductor substrate positioned in the low Vdd region as shown in FIG. 39. Thus, in the oxidizing step to form second gate insulating film 4, the main surface of semiconductor substrate 1 positioned in the low Vdd region is not directly oxidized. Since oxide film 4 and nitrogen doped polysilicon film 14 are formed on oxide film 28, during isotropically etching away nitrogen doped polysilicon film 14 from the low Vdd region as shown in FIG. 40, oxide film 28 having a sufficient thickness can prevent the main surface of semiconductor substrate 1 positioned in the low Vdd region from being directly damaged by the isotropic etching. Thus, when first gate insulating film 6 (see FIG. 33) is formed in the low Vdd region, the deterioration of the quality of first gate insulating film 6 because of possible damages by etching on the main surface of semiconductor substrate 1 can be prevented. As a result, the fluctuation of the threshold voltage of the first field effect transistor can be prevented. As a result, electrical characteristics of the semiconductor device including the plurality of field effect transistors can be prevented from deteriorating.

Figure 41:
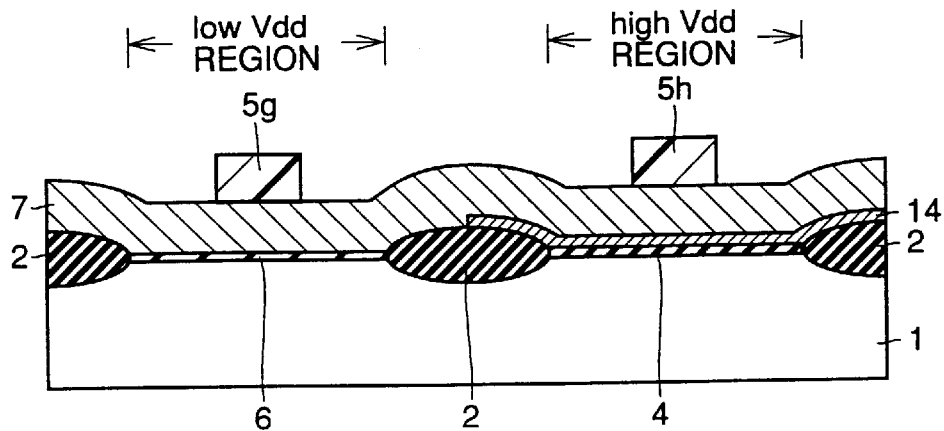

The manufacturing process according to the first variation of the fourth embodiment shown in FIG. 41 is substantially identical to the manufacturing process according to the fourth embodiment shown in FIG. 37. An impurity is thereafter introduced into a prescribed region of the main surface of semiconductor substrate 1, followed by formation of sidewall oxide films 9 and 20 (see FIG. 33) on sides of first and second gate electrodes 18 and 19 (see FIG. 33), to form the semiconductor device as shown in FIG. 33.

Figure 42:
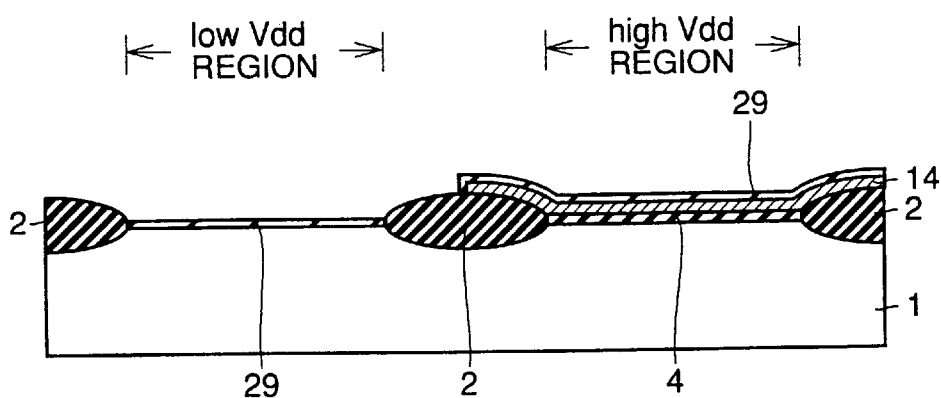
FIGS. 42 and 43 are cross sectional views for use in illustration of the first and second steps in a process of manufacturing a 2-power supply semiconductor device including a plurality of field effect transistors according to a second variation of the fourth embodiment.
Figure 43:
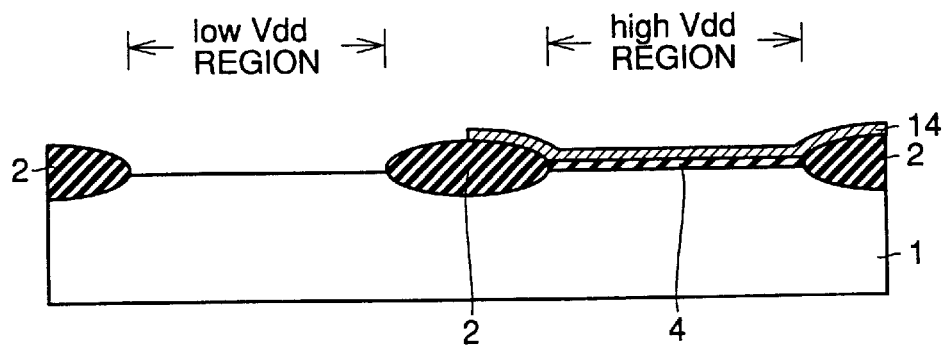

Referring to FIGS. 42 and 43, a process of manufacturing a 2-power supply semiconductor device including a plurality of field effect transistors according to a second variation of the fourth embodiment will be now described.

Among the steps of manufacturing the 2-power supply semiconductor device including the plurality of field effect transistors according to the fourth embodiment, after performing the steps shown in FIGS. 34 and 35, resist pattern 5a (see FIG. 35) is removed. Then, the entire surface of semiconductor substrate 1 is oxidized to form an oxide film 29 on the main surface of semiconductor substrate 1 positioned in the low Vdd region to obtain the structure as shown in FIG. 42.

Then, as shown in FIG. 43, oxide film 29 (see FIG. 42) is isotropically etched away. In the manufacturing process according to the second variation of the fourth embodiment, after the main surface of semiconductor substrate 1 positioned in the low Vdd region is oxidized, oxide film 29 (see FIG. 42) is thus isotropically etched away, possible damages generated by etching on the main surface positioned in the low Vdd region of semiconductor substrate 1 caused by an etching processing to remove oxide film 4 (see FIG. 34) and nitrogen doped polysilicon film 14 (see FIG. 34) from the main surface of semiconductor substrate 1 positioned in the low Vdd region can be removed by isotropically etching a part of the main surface of semiconductor substrate 1 with the defects. As a result, during forming first gate insulating film 6 (see FIG. 33), the deterioration of the quality of first gate insulating film 6 because of damages by etching such as local irregularities on the surface of semiconductor substrate 1 may be prevented. As a result, the fluctuation of the threshold voltages of the field effect transistors may be prevented, and as a result, electrical characteristics of the semiconductor device including the plurality of field effect transistors can be prevented from deteriorating.

After the step shown in FIG. 43, the steps to manufacture the 2-power supply semiconductor device including the plurality of field effect transistors according to the fourth embodiment shown in FIGS. 36 and 37 are performed to obtain the semiconductor device as shown in FIG. 33.

Figure 44:
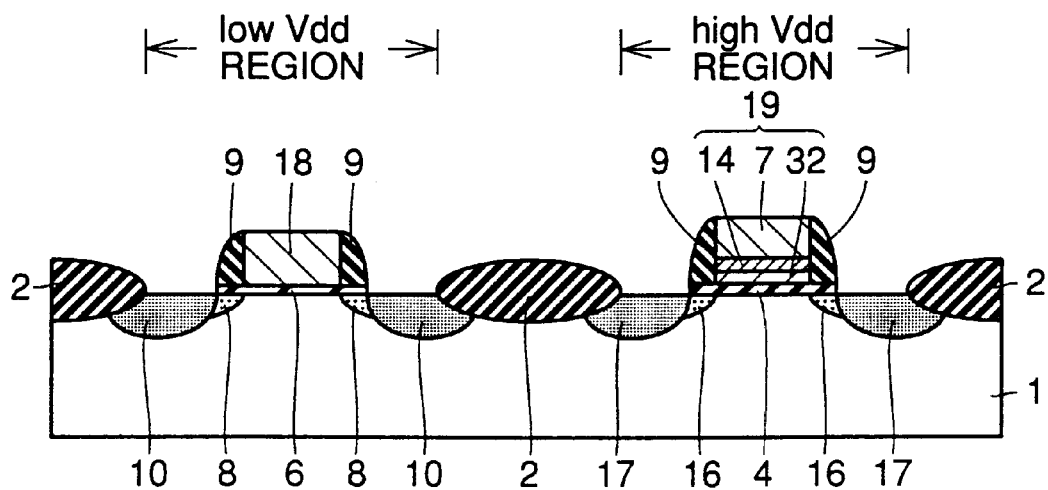
FIG. 44 is a cross sectional view showing a 2-power supply semiconductor device including a plurality of field effect transistors according to a third variation of the fourth embodiment.

Referring to FIG. 44, a 2-power supply semiconductor device including a plurality of field effect transistors according to a third variation of the fourth embodiment of the invention has substantially the same structure as the 2-power supply semiconductor device according to the fourth embodiment shown in FIG. 33. However, as shown in FIG. 44, in the device according to the third variation, there is formed a doped polysilicon film 32 having a conductive impurity between second gate insulating film 4 and nitrogen doped polysilicon film 14. Therefore, in the 2-power supply semiconductor device according the third variation, in addition to the effects brought about by the device according to the fourth embodiment, the formation of a depletion layer caused by a reduction in the density of the conductive impurity in the vicinity of second gate insulating film 4 when a voltage is supplied to gate electrode 19 can be restrained. As a result, the fluctuation of the threshold voltages of the field effect transistors caused by the formation of such a depletion layer can be prevented. Therefore, electrical characteristics of the semiconductor device including the plurality of field effect transistors can be prevented from deteriorating.

Figure 45:
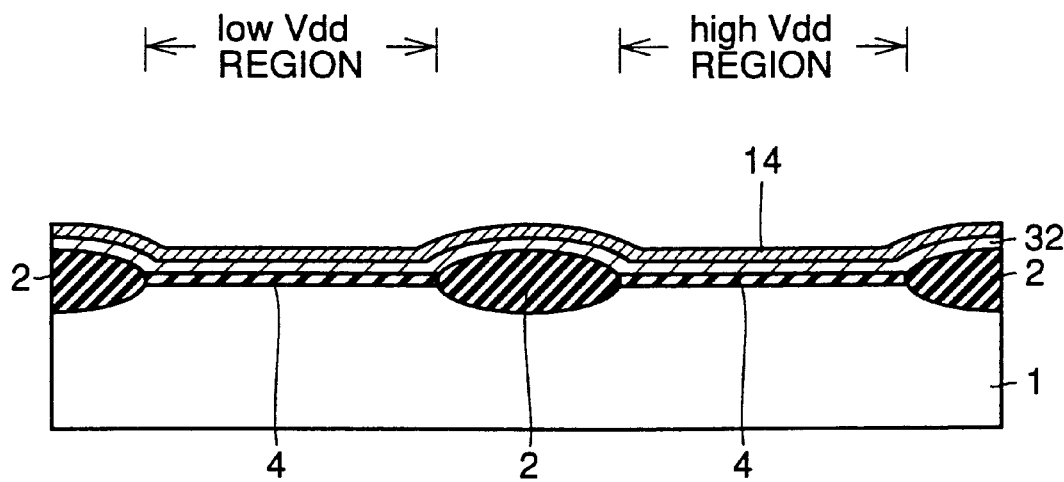
FIGS. 45 and 46 are cross sectional views for use in illustration of the first and second steps in the process of manufacturing the 2-power supply semiconductor device including the plurality of field effect transistors according to the third variation of the fourth embodiment shown in FIG. 44.
Figure 46:
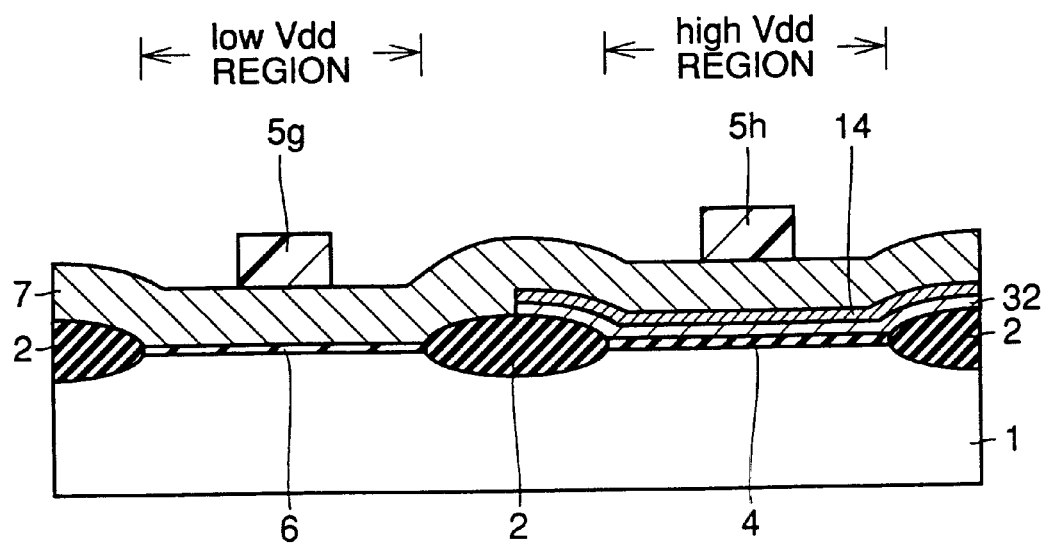

Referring to FIGS. 45 and 46, a process of manufacturing the 2-power supply semiconductor device according to the third variation of the fourth embodiment of the invention will be now described.

As shown in FIG. 45, isolation oxide film 2 is formed to surround an active region on the main surface of p type semiconductor substrate 1. Second gate insulating film 4 is formed on the active region of the main surface of semiconductor substrate 1. Doped polysilicon film 32 having a conductive impurity is formed between second gate insulating film 4 and isolation oxide film 2. Nitrogen doped polysilicon film 14 is formed on doped polysilicon film 32.

After performing the steps substantially identical to the manufacturing steps according to the fourth embodiment of the invention as shown in FIGS. 34 to 36, a polysilicon film 7 is formed to generally cover the entire semiconductor device as shown in FIG. 46. Resist patterns 5g and 5h are formed on polysilicon film 7.

Using resist patterns 5g and 5h as masks, an anisotropic etching is performed to partially remove doped polysilicon film 7, nitrogen doped polysilicon film 14 and doped polysilicon film 32 to form first and second gate electrodes 18 and 19 (see FIG. 44).

Thereafter, an impurity is introduced into a prescribed region of the main surface of semiconductor substrate 1, followed by formation of a sidewall oxide film 9 (see FIG. 44) on sides of first and second gate electrodes 18 and 19 (see FIG. 44), and the semiconductor device as shown in FIG. 44 results.

In the 2-power supply semiconductor device including the plurality of field effect transistors according to the fourth embodiment, nitrogen doped polysilicon film 14 is formed in the high Vdd region, the same effects can be brought about by forming nitrogen doped polysilicon film 14 in the low Vdd region.

Fifth Embodiment

Figure 47:
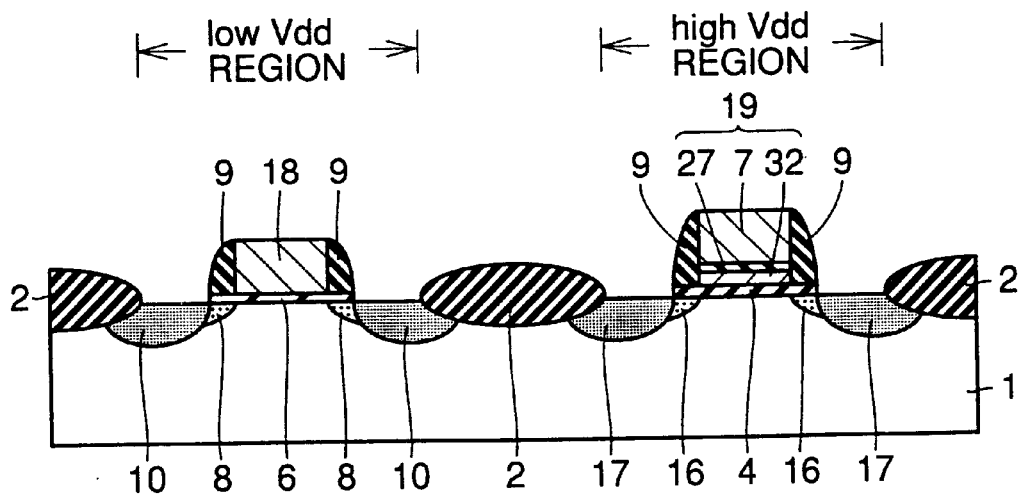
FIG. 47 is a cross sectional view showing a 2-power supply semiconductor device including a plurality of field effect transistors according to a fifth embodiment of the invention.

Referring to FIG. 47, In a 2-power supply semiconductor device including a plurality of field transistors according to a fifth embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of impurity diffusion regions 8 spaced apart from each other and having a first channel region therebetween. Low concentration, n type impurity diffusion region 8 formed adjacent to the first channel region and high concentration, n type impurity diffusion region 10 formed adjacent to n type impurity diffusion region 8 constitute an LDD structure. A first gate insulating film 6 is formed on the first channel region. A first gate electrode 18 is formed on first insulating film 6. A sidewall oxide film 9 is formed on a side of first gate electrode 18. First source/drain regions 10, impurity diffusions 8, first gate insulating film 6, and first gate electrode 18 form the first field effect transistor.

In the high Vdd region, there are formed, on the main surface of semiconductor substrate 1, a pair of second source/drain regions 17, and a pair of impurity diffusion regions 16, spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. Second gate insulating film 4 is formed on the second channel region. Doped polysilicon film 32 having a conductive impurity is formed on second gate insulating film 4. A nitride film 27 is formed on a doped polysilicon film 32. A doped polysilicon film 7 is formed on nitride film 27. Doped polysilicon film 32, nitride film 27 and doped polysilicon film 7 form a second gate electrode 19. A sidewall oxide film 9 is formed on a side of second gate electrode 19. Herein, nitride film 27 is formed by nitriding the surface of doped polysilicon film 32 by lamp annealing as in the manufacturing steps which will be described and is a tunnel insulating film through which a current may be passed when voltage is supplied to gate electrode 19. Second source/drain regions 17, impurity diffusion regions 16, second gate insulating film 4, and second gate electrode 19 form the second field effect transistor.

Thus, doped polysilicon film 32 and nitride film 27 are formed on second gate insulating film 4, it is not necessary to form a resist pattern directly on the surface of second gate insulating film 4. An oxidizing step to form first gate insulating film 6 may be performed, using nitride film 27 as a mask before forming second gate electrode 19. As a result, a lower part of a side of second gate electrode 19 is not oxidized in the step of oxidizing first gate insulating film 6, and therefore a gate bird's beak can be prevented. Therefore, the threshold voltages of the field effect transistors can be prevented from increasing. As a result, electrical characteristics of the semiconductor device including the plurality of field effect transistors can be prevented from deteriorating.

Furthermore, since doped polysilicon film 32 is formed on second gate insulating film 4, a resist pattern is not formed directly on second gate insulating film 4. Therefore, as a result, defects such as local irregularities in the gate insulating film as formed during removing the resist pattern can be avoided. Therefore, the threshold voltages of the field effect transistors may be prevented from fluctuating. Electrical characteristics of the semiconductor device including the plurality of field effect transistors may be prevented from deteriorating.

In addition, before forming second gate electrode 19, gate insulating films 6 and 4 are formed, first and second gate electrodes 18 and 19 may be formed in a single patterning processing by forming a conductive layer on the regions positioned on first and second gate insulating films 4 and 6. As a result, the number of steps included in the manufacture of semiconductor device may be reduced.

Furthermore, since doped polysilicon film 32 including a conductive impurity is formed on second gate insulating film 4, when a voltage is supplied to gate electrode 19, the formation of a depletion layer caused by a reduction in the density of the conductive impurity in the vicinity of second gate insulating film 4 may be restricted. As a result, the fluctuation of the threshold voltages of the field effect transistors caused by the formation of such a depletion layer can be prevented. Therefore, electrical characteristics of the semiconductor device including the plurality of field effect transistors can be prevented from deteriorating.

Figure 48:
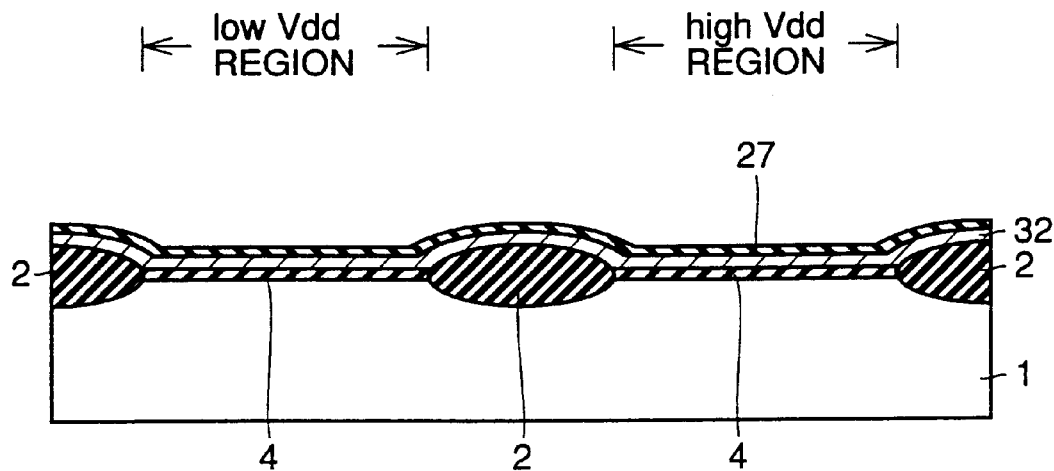
FIG. 48 is a cross sectional view for use in illustration of the first step in the process of manufacturing the 2-power supply semiconductor device including the plurality of field effect transistors according to the fifth embodiment shown in FIG. 47.

Referring to FIG. 48, a process of manufacturing the 2-power supply semiconductor device according to the fifth embodiment will be now described.

As shown in FIG. 48, isolation oxide film 2 is formed to surround an active region on the main surface of p type semiconductor substrate 1. Second gate insulating film 4 is formed on the active region on the main surface of semiconductor substrate 1. Doped polysilicon film 32 including a conductive impurity is formed on second gate insulating film 4 and isolation oxide film 2. The surface of doped polysilicon film 32 is nitrided by means of lamp annealing to form nitride film 27.

After the step shown in FIG. 48, the steps substantially the same as those shown in FIGS. 34 to 37 related to the 2-power supply semiconductor device according to the fourth embodiment are performed. Thus, semiconductor device as shown in FIG. 47 results.

In the step corresponding to the step shown in FIG. 36, doped polysilicon film 32 and nitride film 27 are formed on second gate insulating film 4, a resist pattern does not have to be formed directly on the surface of second gate insulating film 4. Furthermore, before forming second gate electrode 19, an oxidizing step to form first gate insulating film 6 using nitride film 27 as a mask may be performed. Thus, in the step of oxidizing first gate insulating film 6, a lower part of a side of second gate electrode 19 is not oxidized, and as a result, a gate bird's beak can be prevented. As a result, the threshold voltages of the field effect transistors can be prevented from increasing. As a result, electrical characteristics of the semiconductor device including the plurality of field effect transistors can be prevented from deteriorating.

Furthermore, since first and second gate insulating films 6 and 4 may be formed in the above-described manner, in the step corresponding to the step shown in FIG. 37, doped polysilicon film 7 (see FIG. 47) may be formed in the region positioned above first and second gate insulating films 6 and 4, and first and second gate electrodes 18 and 19 may be formed in a single patterning processing. As a result, the number of steps included in the manufacture of the semiconductor device may be reduced.

Sixth Embodiment

Figure 49:
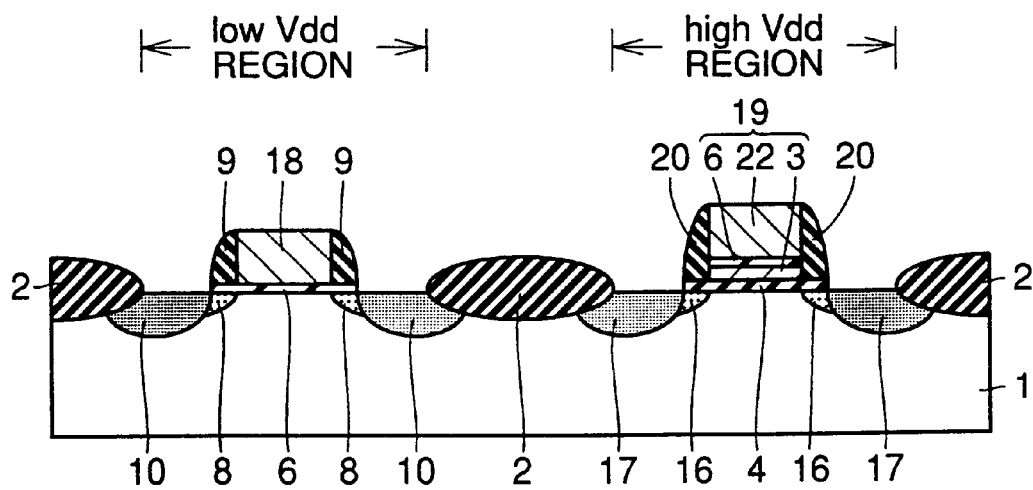
FIG. 49 is a cross sectional view showing a 2-power supply semiconductor device including a plurality of field effect transistors according to a sixth embodiment of the invention.

Referring to FIG. 49, in a 2-power supply semiconductor device including a plurality of field transistors according to a sixth embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of impurity diffusion regions 8 spaced apart from each other and having a first channel region therebetween. Low concentration, n type impurity diffusion region 8 formed adjacent to the first channel region and high concentration, n type impurity diffusion region 10 formed adjacent to n type impurity diffusion region 8 constitute an LDD structure. A first gate insulating film 6 is formed on the first channel region. A first gate electrode 18 is formed on first gate insulating film 6. A sidewall oxide film 9 is formed on a side of first gate electrode 18. First source/drain regions 10, impurity diffusion regions 8, first gate insulating film 6, and first gate electrode 18 form the first field effect transistor.

In the high Vdd region, there are formed, on the main surface of semiconductor substrate 1, a pair of second source/drain regions 17, a pair of impurity diffusion regions 16 spaced apart from each other and having a second channel therebetween. Low concentration, n type impurity diffusion region 16 formed adjacent to the second channel region and high conceltration, n type impurity diffusion region 17 formed adjacent to n type impurity diffusion region 16 constitute an LDD structure. A second gate insulating film 4 is formed on the second channel region. A first doped polysilicon film 3 is formed on second gate insulating film 4. An insulating film 6 of the same material as that of first gate insulating film 6 is for med on first doped polysilicon film 3. A second doped polysilicon film 22 is formed on insulating film 6. First doped polysilicon film 3, insulating film 6, and second doped polysilicon film 22 form second gate electrode 19. A sidewall oxide film 20 is formed on a side of second gate electrode 19. Second source/drain regions 17, impurity diffusion regions 16, second gate insulating film 4, and second gate electrode 19 form the second field effect transistor.

Thus, second gate electrode 19 is formed to have first doped polysilicon 3, insulating film 6 in the high Vdd region and second doped polysilicon film 22, a resist pattern is not directly formed on the surface of second gate insulating film 4 in the step of manufacture which will be described, an oxidizing step to form first gate insulating film 6 in the low Vdd region may be performed before forming second electrode 19. As a result, a gate bird's beak caused by oxidation of a side of second electrode 19 can be prevented. Furthermore, when high Vdd is supplied to second gate electrode 19, a voltage imposed on second gate insulating film 4 can be reduced by a voltage drop at insulating film 6 in the high Vdd region.

Assuming that the thickness of first gate insulating film 6 in low Vdd region is $t_2$, the thickness of second gate insulating film 4 $t_2$, the thickness of insulating film 6 in the high Vdd region $t_3$, a voltage supplied to first gate electrode 18 $V_1$, and a voltage supplied to second gate electrode 19 $V_2$, the thicknesses of insulating film 6 in the high Vdd region, first gate insulating film 6 in the low Vdd region and second gate insulating film 4 may be adjusted such that $t_1/(t_2+t_3)$ is substantially equal to $V_1/V_2$, and the static characteristic of first and second field effect transistors can be adjusted to be substantially equal to each other.

Referring to FIGS. 50 to 55, a process of manufacturing the 2-power supply semiconductor device according to the fifth embodiment will be now described.

Figure 50:
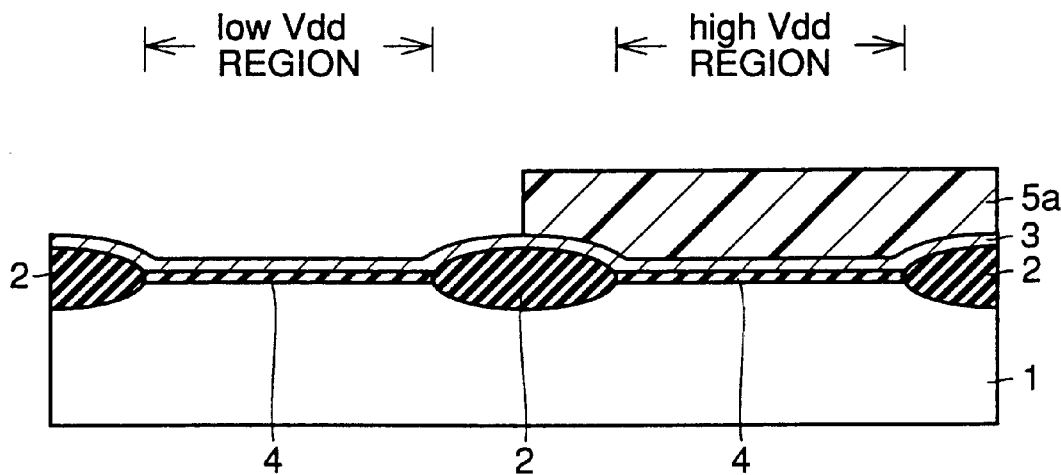
FIGS. 50 to 55 are cross sectional views for use in illustration of the first to sixth steps in the process of manufacturing the 2-power supply semiconductor device including the plurality of field effect transistors according to the sixth embodiment shown in FIG. 49.

As shown in FIG. 50, isolation oxide film 2 is formed on the main surface of p type semiconductor substrate 1 to surround an active region. Second gate insulating film 4 is formed on the active region of the main surface of semiconductor substrate 1. First doped polysilicon film 3 is formed on second gate insulating film 4 and isolation oxide film 2. Thereafter, a resist pattern 5a is formed on first doped polysilicon film 3 positioned in the high Vdd region.

Figure 51:
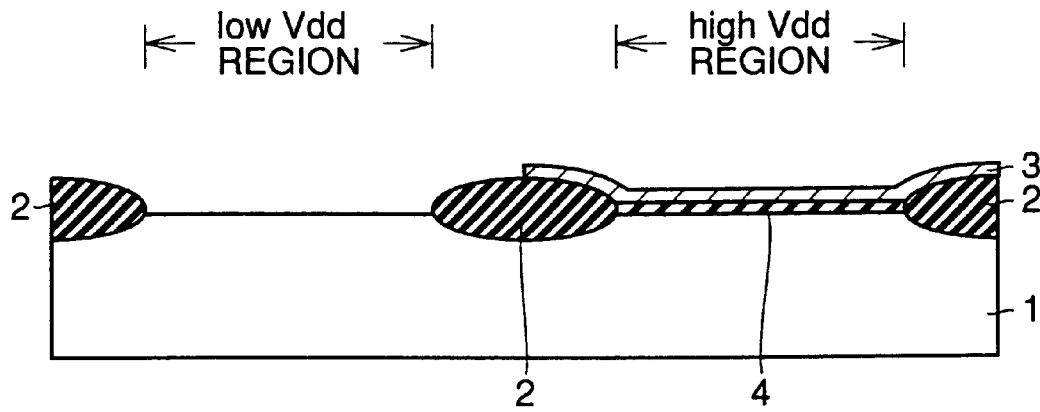

First doped polysilicon film 3 and second gate insulating film 4 present in the low Vdd region are removed by isotropic etching. Thereafter, resist pattern 5a is removed. Thus, the structure as shown in FIG. 51 results.

Figure 52:
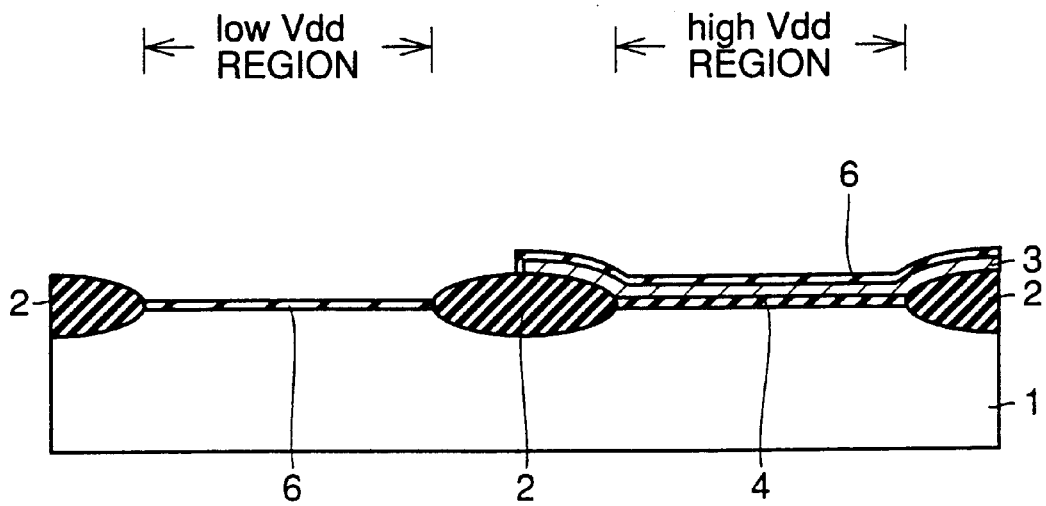

First gate insulating film 6 is formed on the portion of the main surface of semiconductor substrate 1 positioned in the low Vdd region and on first doped polysilicon film 3 by means of thermal oxidation. Thus, the structure as shown in FIG. 52 results. Before forming second gate electrode 19 (see FIG. 49), an oxidizing step to form first gate insulating film 6 is performed, a gate bird's beak caused by oxidation of a side of second gate electrode 19 can be prevented. Furthermore, since first doped polysilicon film 3 is formed on second gate insulating film 4, a resist pattern is not directly formed onto the surface of second gate insulating film 4. As a result, a processing of removing the resist pattern is not directly performed on the surface of second gate insulating film 4, and defects on the surface of second gate insulating film 4 can be prevented.

Figure 53:
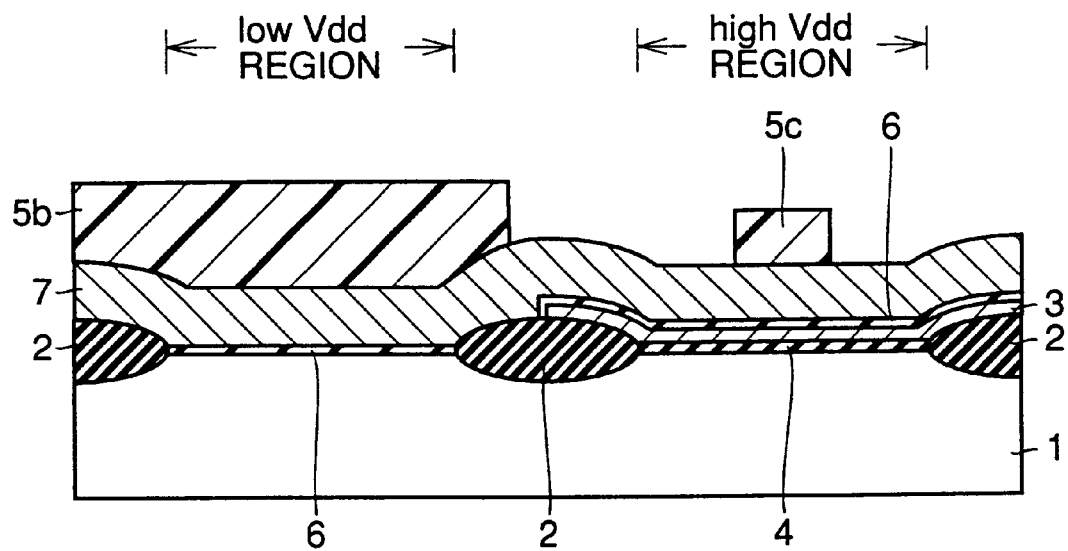

Then, second doped polysilicon film 7 is formed on first gate insulating film 6 and isolation oxide film 2. By forming resist patterns 5b and 5c on the portion of second doped polysilicon film 7 in the low Vdd region and on the region to be second gate electrode 19 (see FIG. 49), the structure as shown in FIG. 53 results.

Figure 54:
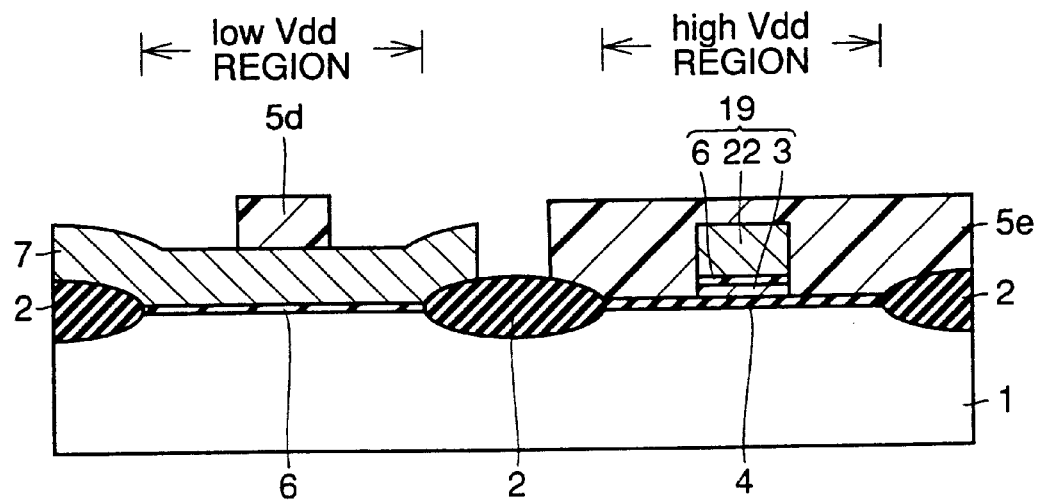

Then, using resist patterns 5b and 5c as masks, anisotropic etching is performed to remove part of second doped polysilicon film 7, first gate insulating film 6, and first doped polysilicon 3 to form second gate electrode 19 (see FIG. 49). Thereafter, resist patterns 5b and 5c (see FIG. 53) are removed. Resist patterns 5d and 5e are formed on second insulating film 4, second gate electrode 19, and the region to be the gate electrode 18 of doped polysilicon film 7 (see FIG. 49). Thus, the structure as shown in FIG. 54 results.

Figure 55:
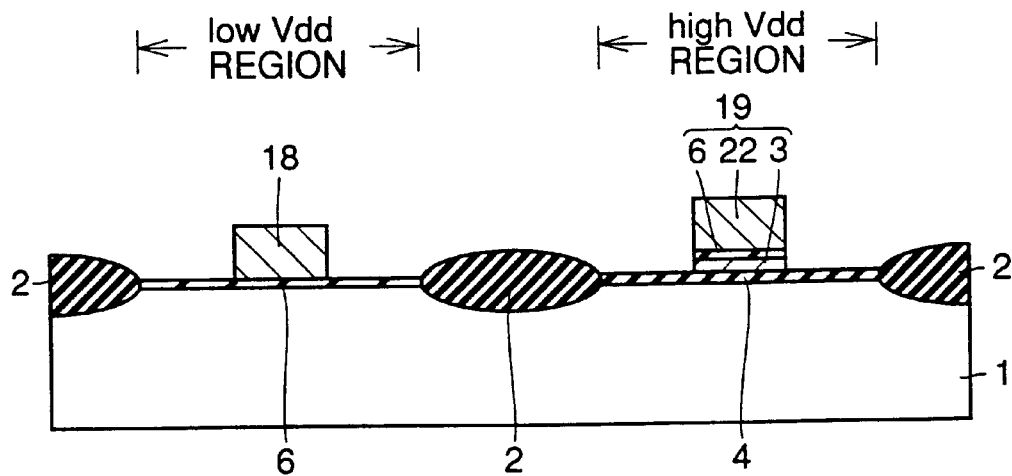

Then, using resist patterns 5d and 5e as masks, anisotropic etching is performed to partially remove second doped polysilicon film 7 and thus first gate electrode 18 (see FIG. 49) is formed. Thereafter, resist patterns 5d and 5e are removed to obtain the structure as shown in FIG. 55. Then, an impurity is introduced into a prescribed region of the main surface of semiconductor substrate 1, followed by formation of sidewall oxide films 9 and 20 (see FIG. 49) on sides of first and second gate electrodes 18 and 19, to form the semiconductor device as shown in FIG. 49.

Seventh Embodiment

Figure 56:
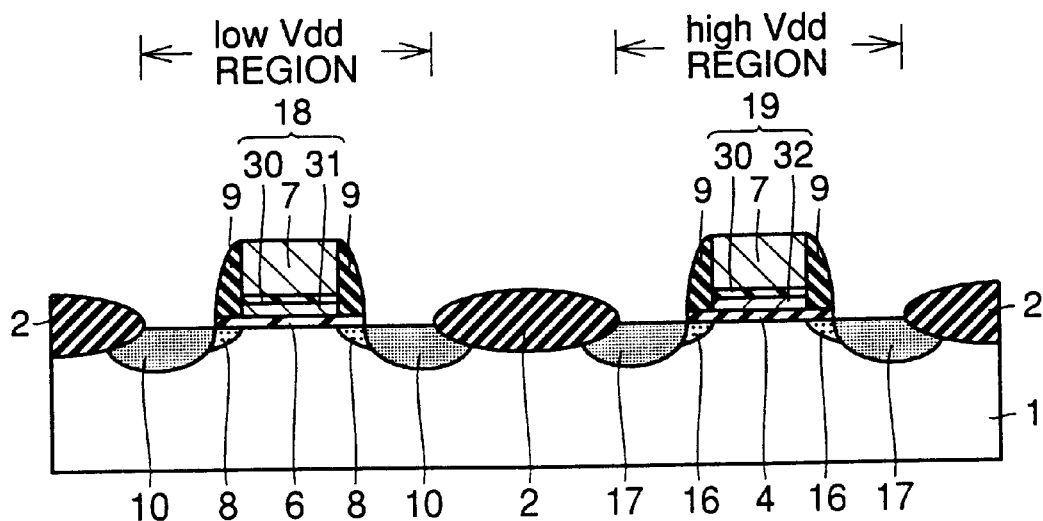
FIG. 56 is a cross sectional view showing a 2-power supply semiconductor device including a plurality of field effect transistors according to a seventh embodiment of the invention.

Referring to FIG. 56, in a 2-power supply semiconductor device including a plurality of field transistors according to a seventh embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10 and a pair of impurity diffusion regions 8, spaced apart from each other and having a first channel region therebetween. Low concentration, n type impurity diffusion region 8 formed adjacent to the first channel region and high concentration, n type impurity diffusion region 10 formed adjacent to n type impurity region 8 constitute an LDD structure. A first gate insulating film 6 is formed on the first channel region. A doped polysilicon film 31 is formed on first gate insulating film 6. Doped polysilicon film 31 has a relatively small thickness for example of about 500 Å. A natural oxide film 30 is formed on doped polysilicon film 31. A doped polysilicon film 7 is formed on natural oxide film 30. Doped polysilicon film 31, natural oxide film 30 and doped polysilicon film 7 form first gate electrode 18. A sidewall oxide film 9 is formed on a side of first gate electrode 18. First source/drain regions 10 and impurity diffusion regions 8, first gate insulating film 6 and first gate electrode 18 form first field effect transistor.

In the high Vdd region, there are formed, on the main surface of semiconductor substrate 1, a pair of second source/drain regions 17, a pair of impurity diffusion regions 16, spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the second channel region. A doped polysilicon film 32 is formed on second gate insulating film 4. Doped polysilicon film 32 has a relatively small thickness for example of about 500 Å. Natural oxide film 30 is formed on doped polysilicon film 32. Doped polysilicon film 7 is formed on natural oxide film 30. Doped polysilicon film 32, natural oxide film 30 and doped polysilicon film 7 constitute second gate electrode 19. A sidewall oxide film 9 is formed on a side of second gate electrode 19. Second source/drain regions 17, impurity diffusion regions 16, second gate insulating film 4, and second gate electrode 19 form the second field effect transistor.

Thus, doped polysilicon films 31 and 32 are formed on first and second gate insulating films 6 and 4, it is not necessary to form a resist pattern directly on the surfaces of first and second gate insulating films 6 and 4 in the following manufacturing steps. Furthermore, an oxidizing step to form first gate insulating film 6 can be performed using doped polysilicon film 32 as a mask, before forming second gate electrode 19. Thus, in the step of oxidizing gate insulating film 6, as a result, a lower part of a side of second gate electrode 19 can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, by making doped polysilicon films 31 and 32 formed on first and second gate insulating films 6 and 4 substantially equal in thickness, the thicknesses of doped polysilicon films 31 and 32 to be etched away for forming first and second gate electrodes 18 and 19 can be made substantially equal in the regions to form first and second gate electrodes 18 and 19. As a result, during etching for forming first and second gate electrodes 18 and 19, the amount of etching to form first gate electrode 18 can be almost the same as the amount of etching to form second gate electrode 19. As a result, the amount of overetching in forming first and second gate electrodes 18 and 19 can be reduced. Therefore, damages caused by overetching of semiconductor substrate 1 positioned under doped polysilicon films 31 and 32 to be etched away can be prevented. As a result, electrical characteristics of the semiconductor device including the plurality of field effect transistors can be prevented.

Furthermore, since doped polysilicon films 31 and 32 are formed on first and second gate insulating films 6 and 4, a resist pattern is not formed directly on first and second gate insulating films 6 and 4. As a result, defects such as local irregularities in the gate insulating film caused by the step of ashing to remove a resist pattern can be prevented from being generated in first and second gate insulating films 6 and 4.

Referring to FIGS. 57 to 60, a method of manufacturing the 2-power supply semiconductor device according to the seventh embodiment of the invention will be described.

Figure 57:
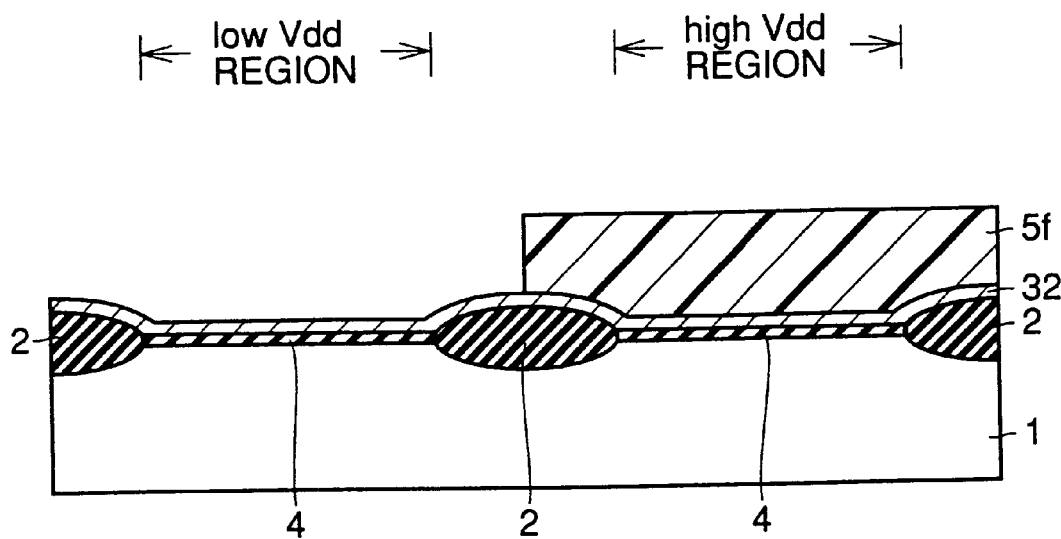
FIGS. 57 to 60 are cross sectional views for use in illustration of the first to fourth steps in the process of manufacturing the 2-power supply semiconductor device including the plurality of field effect transistors according to the seventh embodiment shown in FIG. 56.

As shown in FIG. 57, isolation oxide film 2 to surround an active region is formed on the main surface of p type semiconductor substrate 1. Second gate insulating film 4 is formed on the active region of the main surface of semiconductor substrate 1. Doped polysilicon film 32 is formed on second gate insulating film 4 and isolation oxide film 2. Thereafter, a resist pattern 5f is then formed on doped polysilicon film 32 positioned in the high Vdd region.

Using resist pattern 5f as a mask, second gate insulating film 4 and doped polysilicon film 32 positioned in the low Vdd region are etched away, followed by removal of resist pattern 5f. Since doped polysilicon film 32 is formed on second gate insulating film 4, resist pattern 5f is not directly formed on second gate insulating film 4. As a result, defects such as fine irregularities in the surface of second gate insulating film 4 caused by the removal of resist pattern 5f can be prevented.

Figure 58:
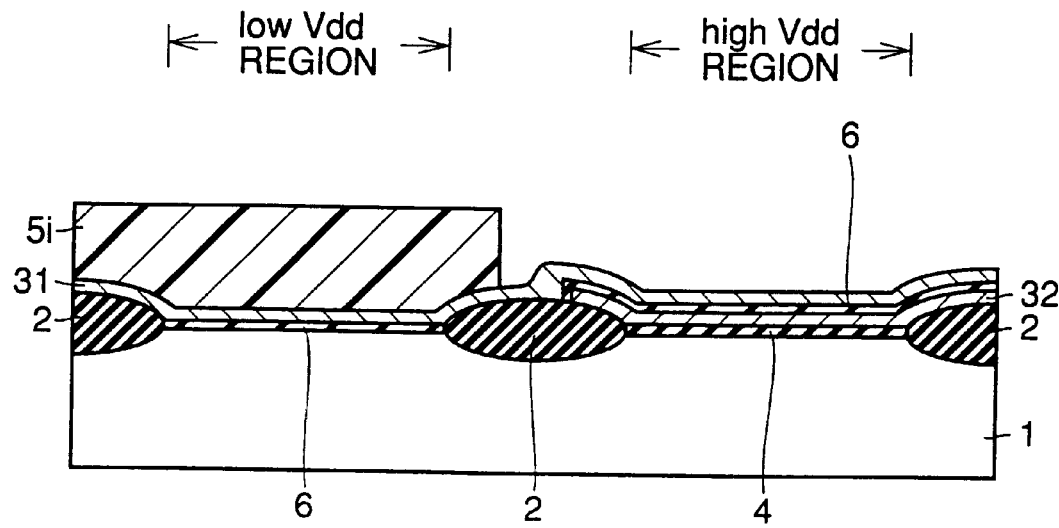

As shown in FIG. 58, first gate insulating film 6 is formed on the main surface of semiconductor substrate 1 positioned in the low Vdd region and on doped polysilicon film 32. Doped polysilicon film 31 is then formed on first gate insulating film and isolation oxide film 2. A resist pattern 5i is formed on doped polysilicon film 31 in the low Vdd region.

Since doped polysilicon film 32 is formed on second gate insulating film 4, an oxidizing step to form first gate insulating film 6 can be performed using doped polysilicon film 32 as a mask before forming second gate electrode 19 (see FIG. 56). Thus, in the step of oxidizing gate insulating film 6, a lower part of a side of second gate electrode 19 can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, by making doped polysilicon films 31 and 32 substantially equal in thickness, in the step of etching to form first and second electrodes 18 and 19 (see FIG. 56), the amount of etching to form first gate electrode 18 can be substantially the same as the amount of etching to form second gate electrode 19. As a result, the amount of overetching during forming first and second gate electrodes 18 and 19 can be reduced.

Figure 59:
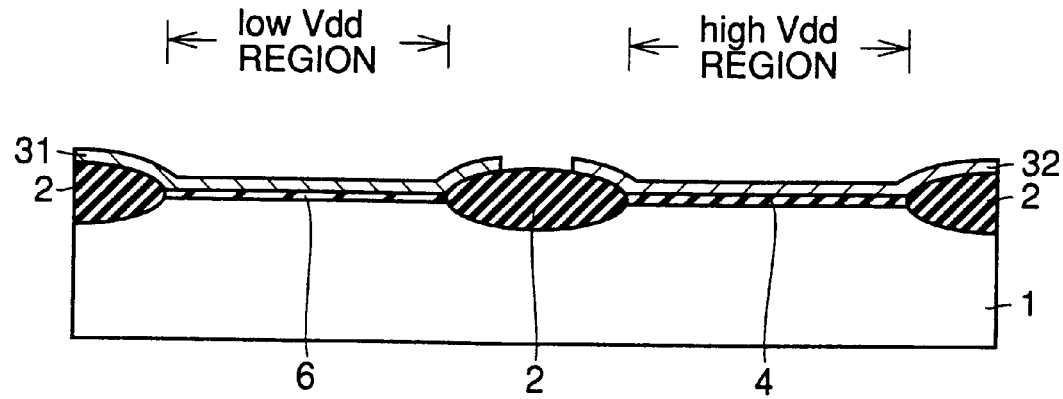

Then, doped polysilicon film 31 and gate insulating film 6 positioned in the high Vdd region are etched away, using resist pattern 5i as a mask, followed by removal of resist pattern 5i. Thus, the structure as shown in FIG. 59 results. Herein, polysilicon films 31 and 32 are laid out such that the films do not overlap on the main surface of semiconductor substrate 1 and isolation oxide film 2. Thus, in the manufacture of the semiconductor device, there is no such region having a thickness as large as the sum of the thicknesses of doped polysilicon films 31 and 32 to be etched away. As a result, the doped polysilicon film will not have a locally thick region, the etching margin during etching to form gate electrodes 18 and 19 can be improved.

Figure 60:
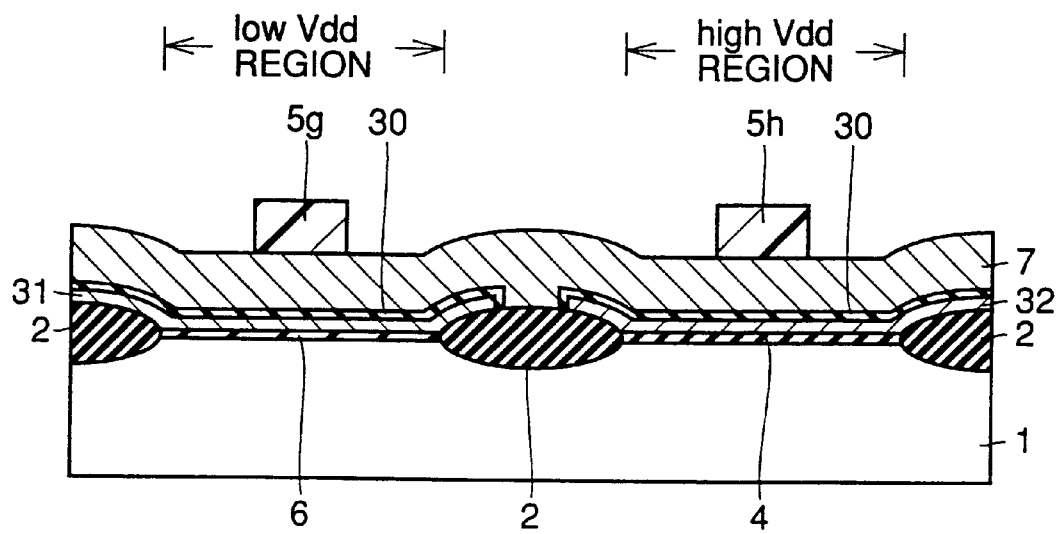

A part of the surfaces of first and second doped polysilicon films 31 and 32 is isotropically etched away. A doped polysilicon film 7 having for example a thickness of about 1500 Å is formed on the entire surface of semiconductor substrate 1. At the time, natural oxide film 30 has been formed on the surfaces of doped polysilicon films 31 and 32. Resist patterns 5g and 5h are then formed on doped polysilicon film 7. Thus, the structure as shown in FIG. 60 results.

Thereafter, using resist patterns 5g and 5h as masks, part of doped polysilicon films 7, 31 and 32, and natural oxide film 30 is etched away to form first and second gate electrodes 18 and 19 (see FIG. 56). An impurity is introduced into a prescribed region of the main surface of semiconductor substrate 1, followed by formation of a sidewall oxide film 9 (see FIG. 56) on sides of first and second gate electrodes 18 and 19, and the semiconductor device as shown in FIG. 56 results. Herein, if the thickness of doped polysilicon films 31 and 32 is for example not less than 100 Å, during etching to form first and second gate electrodes 18 and 19, part of doped polysilicon films 31 and 32 having a sufficient thickness will not be removed during removing natural oxide film 30, and damages by the etching are not caused on first and second gate insulating films 6 and 4 positioned under doped polysilicon films 31 and 32 and in the main surface of semiconductor substrate 1. As a result, during etching to form first and second gate electrodes 18 and 19, the etching process to remove natural oxide film 30 can be readily performed, and the etching margin can be improved as compared to the case of removing natural oxide film 30 by etching the doped polysilicon films.

Figure 61:
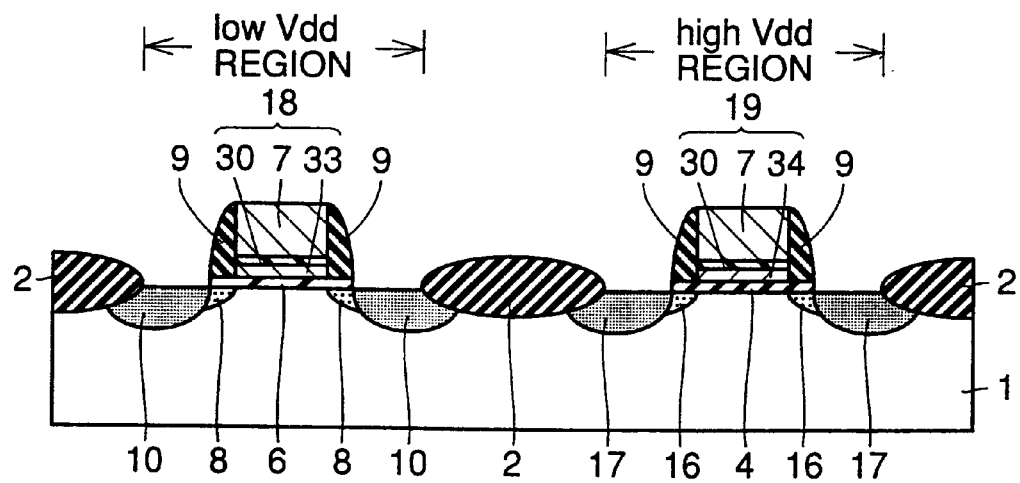
FIG. 61 is a cross sectional view showing a 2-power supply semiconductor device including a plurality of field effect transistors according to a first variation of the seventh embodiment.
Figure 62:
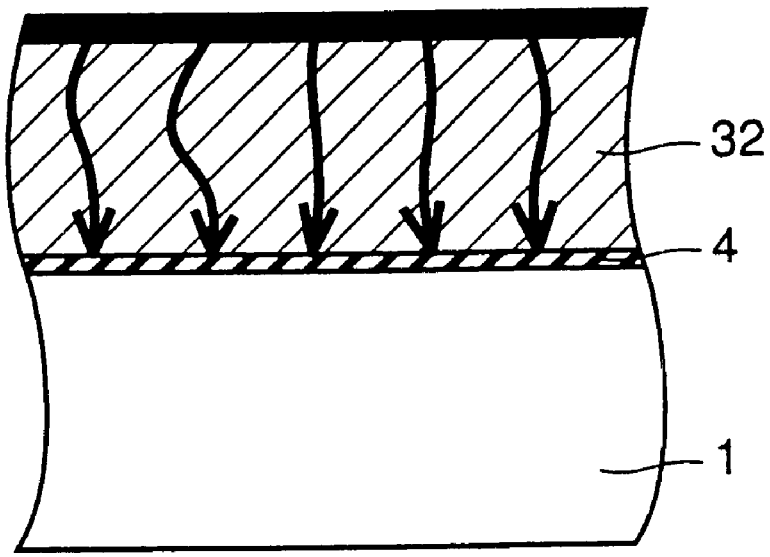
FIG. 62 is a view schematically showing how an isotropic etching agent runs along grain boundaries inside a doped polysilicon film 32 to reach a second gate insulating film 4, when doped polysilicon film 32 shown in FIG. 56 is isotropically etched.
Figure 63:
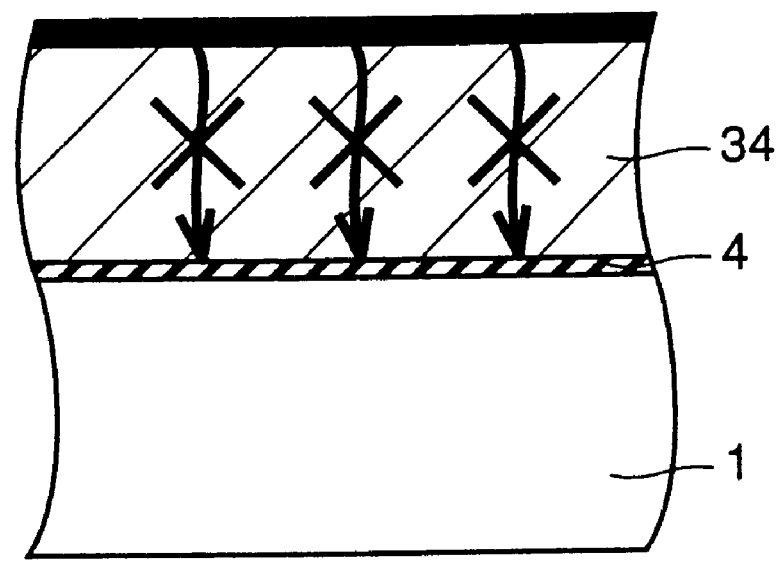
FIG. 63 is a view schematically showing that an isotropic etching agent does not reach a second gate insulating film 4 because of the absence of grain boundaries in a silicon film 34, when a silicon film 34 having an amorphous structure as shown in FIG. 61 has its surface isotropically etched in the process of manufacture.

Referring to FIG. 61, a 2-power supply semiconductor device including a plurality of field effect transistors according to a first variation of the seventh embodiment has basically the same structure as the 2-power supply semiconductor device according to the seventh embodiment shown in FIG. 56 with difference being that silicon films 33 and 34 having an amorphous structure are formed on first and second gate insulating films 6 and 4. Since silicon films 33 and 34 formed on first and second gate insulating films 6 and 4 have an amorphous structure, an isotropic etching agent used for isotropically etching silicon films 33 and 34 does not run inside silicon films 33 and 34 to reach first and second gate insulating films 6 and 4. This is in contrast to the case of polysilicon film 32 having a large number of crystals as shown in FIG. 62 where the isotropic etching agent runs along grain boundaries to reach gate insulating film 4. Meanwhile, as shown in FIG. 63, in the case of silicon film 34, having an amorphous structure which is free from grain boundaries, the isotropic etching agent does not run along grain boundaries to reach gate insulating film 4.

Therefore, damages caused by the isotropic etching agent can be prevented in gate insulating films 4, and the fluctuation of the threshold voltages of field effect transistors caused by such damages in the gate insulating film can be prevented. As a result, electrical characteristics of the 2-power supply semiconductor device including the plurality of field effect transistors can be prevented from deteriorating.

Figure 64:
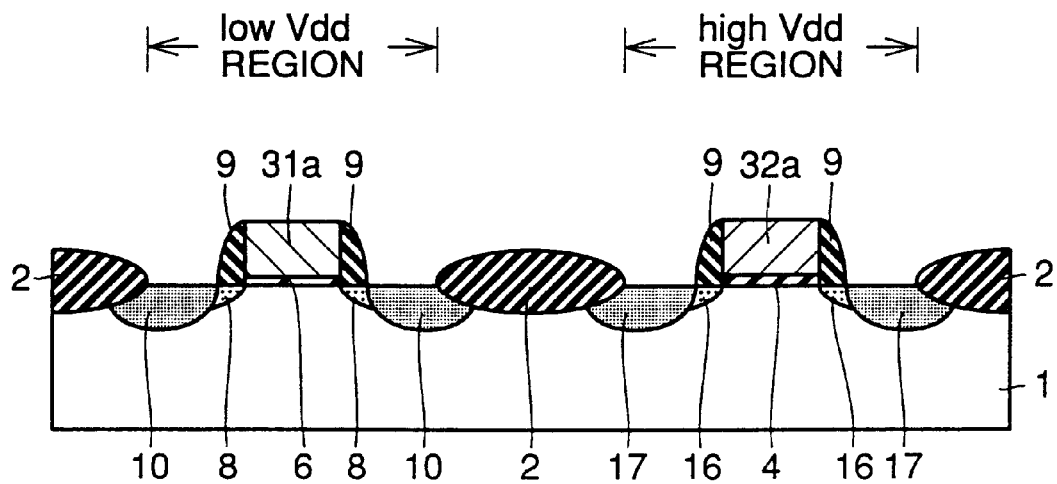
FIG. 64 is a cross sectional view showing a 2-power supply semiconductor device including a plurality of field effect transistors according to a second variation of the seventh embodiment.

Referring to FIG. 64, a 2-power supply semiconductor device including a plurality of field effect transistors according to a second variation of the seventh embodiment has basically the same structure as the 2-power supply semiconductor device according to the seventh embodiment shown in FIG. 56, with different being that the first gate electrode 31a is formed only of doped polysilicon film as shown in FIG. 64, and that the second gate electrode 32a is formed only of doped polysilicon film. Since the first and second gate electrodes 31a and 32a are formed of doped polysilicon films, respectively, the method of forming doped polysilicon film 7 (see FIG. 56) in the 2-power supply semiconductor device according to the seventh embodiment can be omitted. Thus, the manufacturing process can be simplified as compared to the 2-power supply semiconductor device according to the seventh embodiment.

Referring to FIGS. 65 to 70, a method of manufacturing the 2-power supply semiconductor device according to the second variation of the seventh embodiment will be now described.

Figure 65:
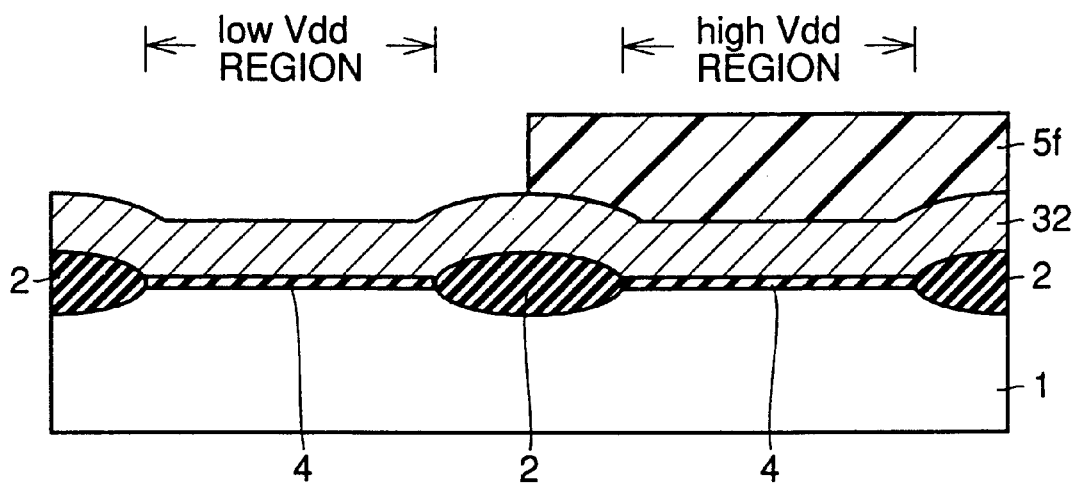
FIGS. 65 to 70 are cross sectional views for use in illustration of the first to sixth steps in the process of manufacturing the 2-power supply semiconductor device including the plurality of field effect transistors according to the second variation of the seventh embodiment shown in FIG. 64.

As shown in FIG. 65, isolation oxide film 2 is formed to surround an active region on the main surface of p type semiconductor substrate. Second gate insulating film 4 is formed on the active region of the main surface of semiconductor substrate 1. Doped polysilicon film 32 is formed on second gate insulating film 4 and isolation oxide film 2. A resist pattern 5f is formed on doped polysilicon film 32 positioned in the high Vdd region.

Figure 66:
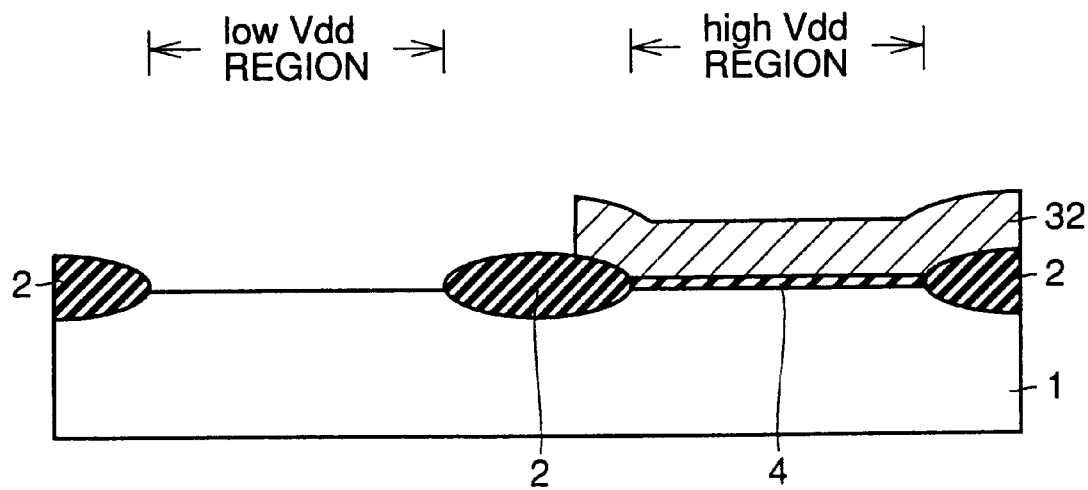

Using resist pattern 5f as a mask, part of doped polysilicon film 32 and second gate insulating film 4 is removed, followed by removal of resist pattern 5f. The structure as shown in FIG. 66 thus results. Herein, the thickness of doped polysilicon film 32 has such a thickness to be used as a gate electrode.

Figure 67:
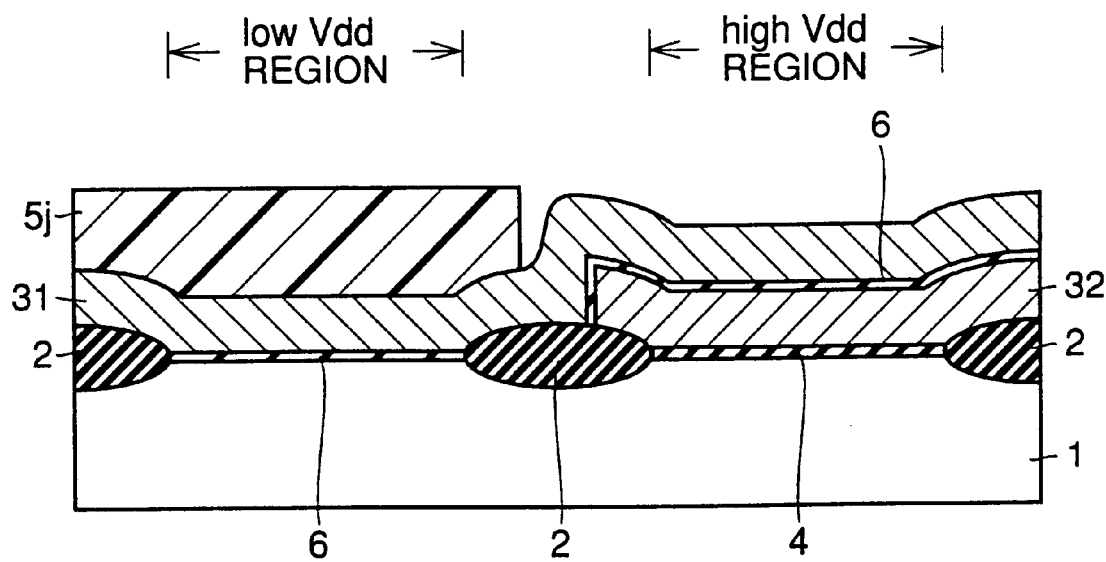

First gate insulating film 6 (see FIG. 67) is formed on the main surface of semiconductor substrate 1 and on doped polysilicon film 32. Doped polysilicon film 31 (see FIG. 67) is formed on first gate insulating film 6. A resist pattern 5j (see FIG. 67) is formed in the portion positioned in the low Vdd region on doped polysilicon film 31. Thus, the structure as shown in FIG. 67 results.

Since doped polysilicon film 32 is formed on second gate insulating film 4, an oxidizing step to form first gate insulating film 6 may be performed using doped polysilicon film 32 as a mask before forming second gate electrode 32a (see FIG. 64). Thus, in the step of oxidizing gate insulating film 6, as a result, a lower part of a side of second gate electrode 32a can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Figure 68:
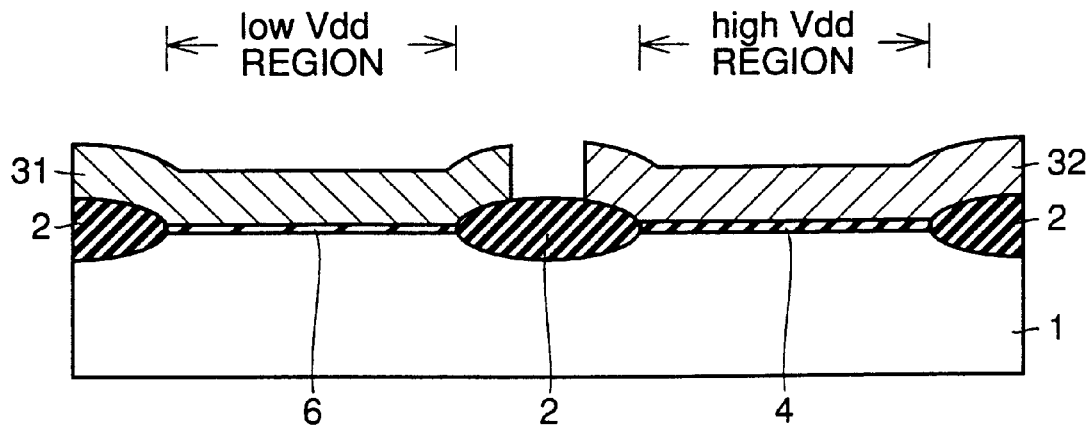

Doped polysilicon film 31 and first gate insulating film 6 positioned in the high Vdd region are etched away, using resist pattern 5j as a mask, followed by removal of resist pattern 5j, and the structure as shown in FIG. 68 thus results.

Figure 69:
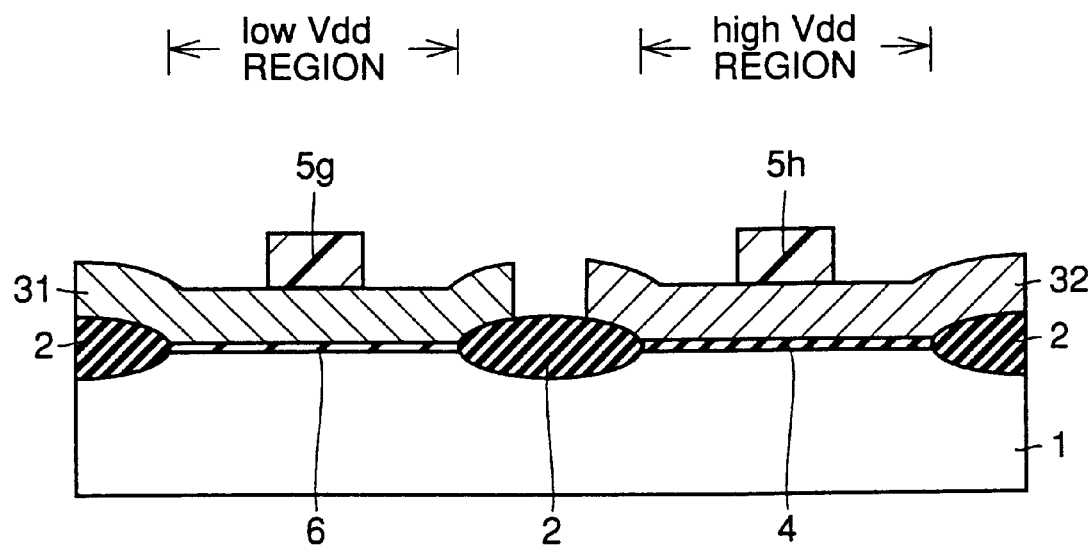

Then, as shown in FIG. 69, resist patterns 5g and 5h are formed on doped polysilicon films 31 and 32.

Figure 70:
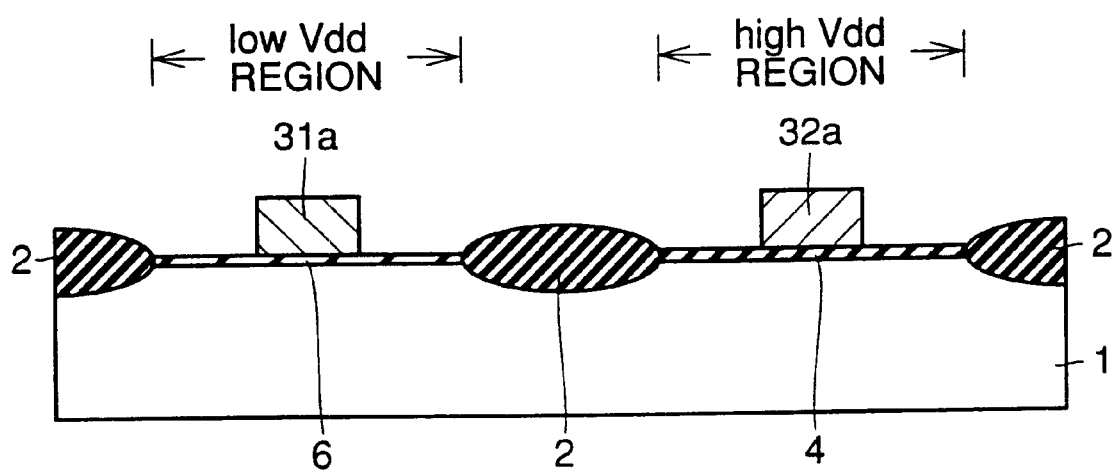

As shown in FIG. 70, using resist patterns 5g and 5h(see FIG. 69) as masks, part of doped polysilicon films 31 and 32 (see FIG. 69) is anisotropically etched away to form first and second gate electrodes 31a and 32a. Since first and second gate electrodes 31a and 32a are formed only of doped polysilicon films 31 and 32 (see FIG. 69) serving as a protection conductive film, the number of steps for forming the doped polysilicon films can be reduced as compared to the process of manufacturing the 2-power supply semiconductor device according to the seventh embodiment shown in FIGS. 57 to 60.

An impurity is then introduced into a prescribed region of the main surface of semiconductor substrate 1 followed by formation of a sidewall oxide film 9 (see FIG. 64) on sides of first and second gate electrodes 31a and 32a (see FIG. 64), and the semiconductor device as shown in FIG. 64 results.

As an application of the second variation of the fourth embodiment, after oxidizing the main surface of semiconductor substrate 1 positioned in the low Vdd region before forming first gate insulating film 6, a part of the surface is isotropically etched to prevent the quality of gate insulating film 6 from deteriorating. In addition, as applications of the first to third embodiment, doped polysilicon films 31 and 32 serving as a protection conductive film to protect the gate insulating films may be formed on first and second gate insulating films 6 and 4 to bring about the same effect as the seventh embodiment.

Eighth Embodiment

Figure 71:
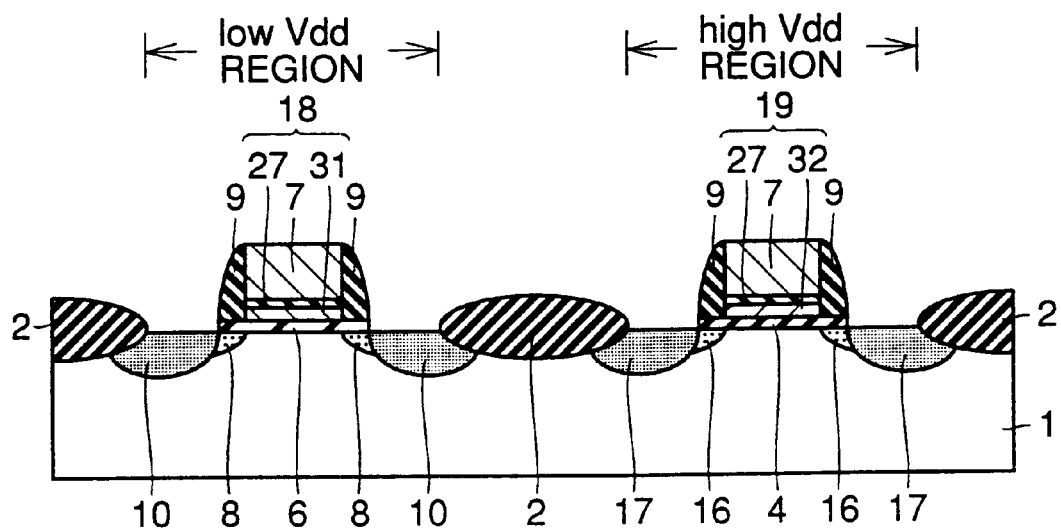
FIG. 71 is a cross sectional view showing a 2-power supply semiconductor device including a plurality of field effect transistors according to an eighth embodiment of the invention.

Referring to FIG. 71 in a 2-power supply semiconductor device including a plurality of field effect transistors according to an eighth embodiment of the invention, there are formed, on a main surface of a p type semiconductor substrate 1, a first field effect transistors supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, a pair of impurity diffusion regions 8, spaced apart from each other and having a first channel region therebetween. Low concentration, n type impurity diffusion region 8 formed adjacent to the first channel region and high concentration n type impurity diffusion region 10 formed adjacent to n type impurity diffusion region 8 constitute an LDD structure. A first gate insulating film 6 is formed on the first channel region. A doped polysilicon film 31 is formed on first gate insulating film 6. A nitride film 27 is formed on doped polysilicon film 31. A doped polysilicon film 7 is formed on nitride film 27. Doped polysilicon films 31 and 7, and nitride film 27 form a first gate electrode 18. A sidewall oxide film 9 is formed on a side of first gate electrode 18. The first source/drain regions 10, impurity diffusion regions 8, first gate insulating film 6, and first gate electrode 18 form the first field effect transistor.

In the high Vdd region, there are formed, on the main surface of semiconductor substrate 1, a pair of second source/drain regions 17, and a pair of impurity diffusion regions 16, spaced apart from each other and having a second channel region therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the second channel region. A doped polysilicon film 32 is formed on second gate insulating film 4. Nitride film 27 is formed on doped polysilicon film 32. Doped polysilicon films 7 and 32 and nitride film 27 form second gate electrode 19. Sidewall oxide film 9 is formed on a side of second gate electrode 19. Second source/drain regions 17, impurity diffusion regions 16, second gate insulating film 4 and second gate electrode 19 form the second field effect transistor.

Since doped polysilicon film 32 is formed on second gate insulating film 4, an oxidizing step to form first gate insulating film 6, using doped polysilicon film 32 as a mask can be performed before forming second gate electrode 19. As a result, in the step of oxidizing gate insulating film 6, a lower part of a side of second gate electrode 19 can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Furthermore, nitride film 27 is formed on doped polysilicon films 31 and 32 serving as a protection conductive film, a natural oxide film difficult to control in thickness can be prevented from being formed on doped polysilicon films 31 and 32. As a result, the fluctuation of the thicknesses of doped polysilicon films 31, 32 and 7 caused by such a natural oxide film can be prevented. As a result, the amount of overetching can be reduced in etching to form first and second gate electrodes 18 and 19. As a result, damages to semiconductor substrate 1 positioned under doped polysilicon films 31 and 32 to be etched away, caused by overetching can be prevented.

Figure 72:
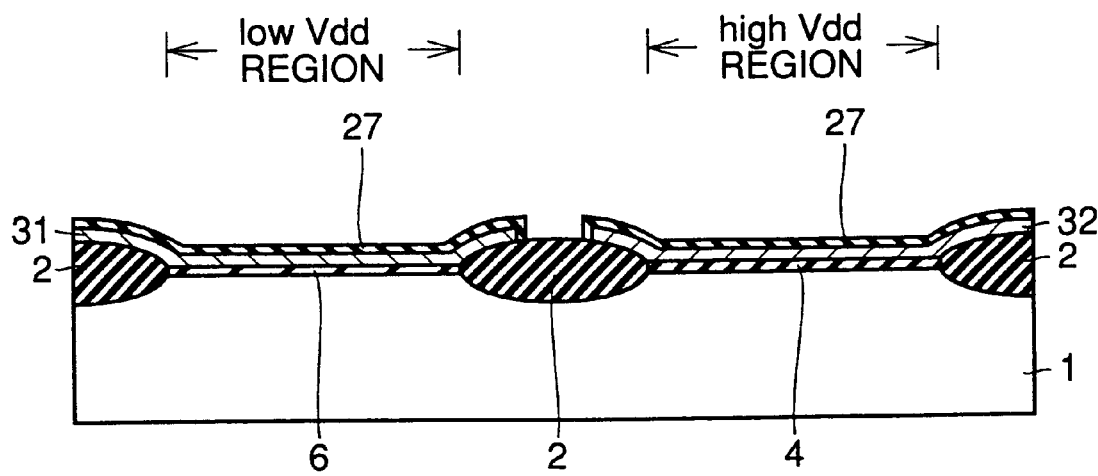
FIG. 72 is a cross sectional view for use in illustration of the first step in the process of manufacturing the 2-power supply semiconductor device including the plurality of field effect transistors according to the eighth embodiment shown in FIG. 71.

Referring to FIG. 72, a method of manufacturing the 2-power supply semiconductor device according to the eighth embodiment of the invention will be described.

After performing the steps in the manufacture of the 2-power supply semiconductor device according to the seventh embodiment shown in FIGS. 57 to 59, doped polysilicon films 31 and 32 are nitrided by lamp annealing as shown in FIG. 72, and nitride film 27 serving as an oxidation protection film is formed. Herein, doped polysilicon film 32 is formed on second gate insulating film 4, and therefore an oxidizing step to form first gate insulating film 6 can be performed using doped polysilicon film 32 as a mask before forming second gate electrode 19. Thus, in the step of oxidizing gate insulating film 6, a lower part of a side of second gate electrode 19 can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Since nitride film 27 is formed on the surfaces of doped polysilicon films 31 and 32, a natural oxide film difficult to control in thickness can be prevented from being formed on doped polysilicon films 31 and 32. As a result, variations of the thicknesses of doped polysilicon films 31, 32 and 7 caused by such a natural oxide film can be prevented. As a result, the amount of overetching during etching to form first and second gate electrodes 18 and 19 can be reduced. As a result, damages caused by overetching to semiconductor substrate 1 positioned under doped polysilicon films 31 and 32 to be etched away can be prevented.

As is the case with the 2-power supply semiconductor device according to the seventh embodiment shown in FIG. 60, doped polysilicon film 7 is formed in the low Vdd region and the high Vdd region. Resist patterns are thereafter formed on doped polysilicon film 7, anisotropic etching is performed using the resist patterns as a mask to form first and second gate electrodes 16 and 19 (see FIG. 71). An impurity is introduced into the main surface of semiconductor substrate 1, followed by formation of a sidewall oxide film 9 (see FIG. 71) on sides of first and second gate electrodes 18 and 19, and the semiconductor device as shown in FIG. 71 is thus obtained.

Ninth Embodiment

Figure 73:
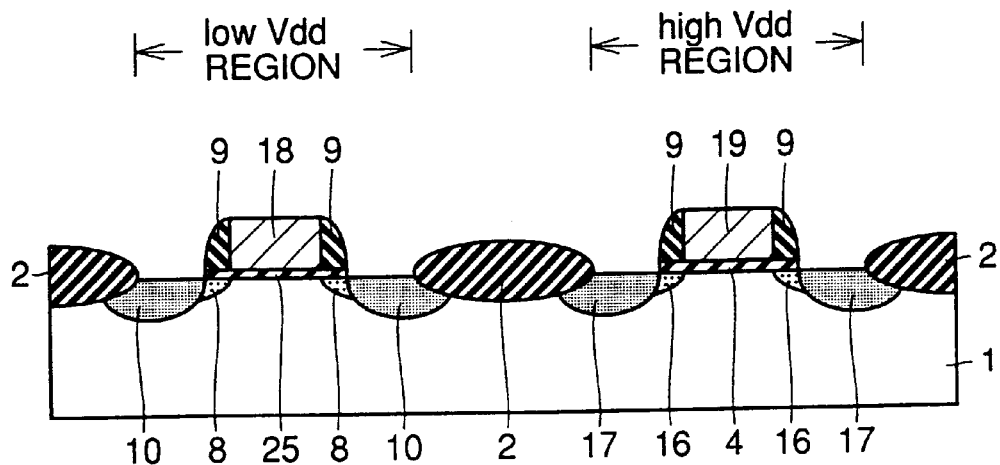
FIG. 73 is a cross sectional view showing a 2-power supply semiconductor device including a plurality of field effect transistors according to a ninth embodiment of the invention.

Referring to FIG. 73, In a 2-power supply semiconductor device including a plurality of field transistors according to a ninth embodiment of the invention, there are formed, on a main surface of a p type semiconductor substrate 1, a first field effect transistor supplied with a first power supply voltage (low Vdd) and a second field effect transistor supplied with a second voltage (high Vdd) higher than the first power supply voltage, spaced apart from each other. An isolation oxide film 2 is formed between the first and second field effect transistors.

In the low Vdd region, there are formed, on the main surface of substrate 1, a pair of first source/drain regions 10, and a pair of impurity diffusion regions 8, spaced apart from each other and having a first channel region therebetween. Low concentration, n type impurity diffusion region 8 formed adjacent to the first channel region and high concentration, n type impurity diffusion region 10 formed adjacent to n type impurity region 8 constitute an LDD structure. A first gate insulating film 25 is formed on the first channel region. A first gate electrode 18 is formed on first insulating film 25. A sidewall oxide film 9 is formed on a side of first gate electrode 18. First source/drain regions 10, impurity diffusion regions 8, first gate insulating film 25, and first gate electrode 18 form the first field effect transistor.

In the high Vdd region, there are formed, on the main surface of semiconductor substrate 1, a pair of second source/drain regions 17, and a pair of impurity diffusion regions 16, spaced apart from each other and having a second channel therebetween. Low concentration, n type impurity diffusion region 16 formed adjacent to the second channel region and high concentration, n type impurity diffusion region 17 formed adjacent to n type impurity diffusion region 16 constitute an LDD structure. A second gate insulating film 4 is formed on the second channel region. A second gate electrode 19 is formed on second gate insulating film 4. Sidewall oxide film 9 is formed on a side of second gate electrode 19. Second source/drain regions 17, impurity diffusion regions 16, second gate insulating film 4 and second gate electrode 19 form the second field effect transistor.

Herein, in the 2-power supply semiconductor device according to the ninth embodiment, as will be described in connection with the following manufacturing steps, among first and second gate insulating films 25 and 4 having substantially the same thickness, only a part of first gate insulating film 25 is isotropically etched to be reduced in thickness. Therefore, first gate insulating film 25 can be formed before forming second gate electrode 19. As a result, a lower part of a side of second gate electrode 19 can be prevented from being oxidized in the step of oxidizing to form first gate insulating film 25, and a gate bird's beak caused by the oxidation can be prevented. Therefore, the threshold voltages of the field effect transistors can be prevented from increasing.

Referring to FIGS. 74 to 78, a method of manufacturing the 2-power supply semiconductor device according to the ninth embodiment will be now described.

Figure 74:
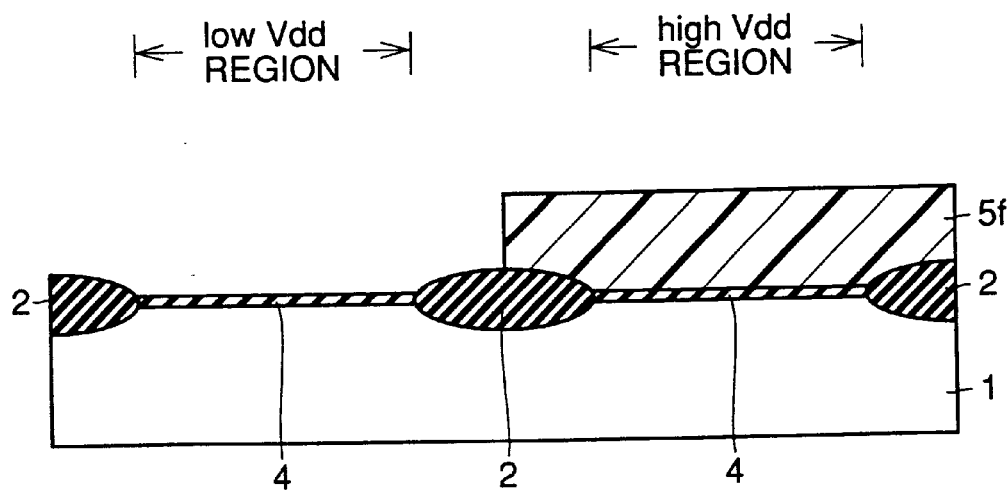
FIGS. 74 to 78 are cross sectional views for use in illustration of the first to fifth steps in the process of manufacturing the 2-power supply semiconductor device including the plurality of field effect transistors according to the ninth embodiment shown in FIG. 73.

As shown in FIG. 74, isolation oxide film 2 is formed to surround an active region on the main surface of p type semiconductor substrate 1. Second gate insulating film 4 is formed on the active region of the main surface of semiconductor substrate 1. A resist pattern 5f is formed on second gate insulating film 4 and isolation oxide film 2, positioned in the high Vdd region.

Figure 75:
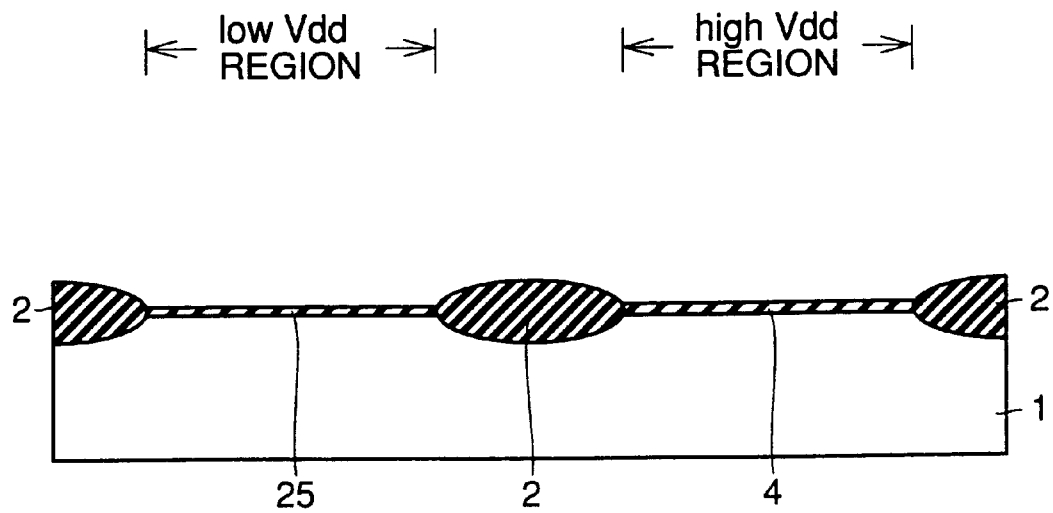

Using resist pattern 5f as a mask, a part of the surface of second gate insulating film 4 positioned in the low Vdd region is isotropically etched away to form first gate insulating film 25 (see FIG. 75) thinner than second gate insulating film 4 positioned in the high Vdd region. First and second gate insulating films 25 and 4 are formed thicker than their final thickness when used as the gate insulating films for the field effect transistors. The difference between second gate insulating film 4 and first gate insulating film 25 in thickness is set substantially identical to the final difference in thickness between the first and second gate insulating films used in the field effect transistors. Resist pattern 5f is then removed to obtain the structure as shown in FIG. 75.

At the time, the surface of second gate insulating film 4 positioned in the high Vdd region may suffer from defects such as local irregularities caused by the process of removing the resist pattern. The surfaces of first and second gate insulating films 25 and 4 are isotropically etched to remove the defects formed by the removal of the resist pattern. The first and second gate insulating films 25 and 4 are isotropically etched to have the thicknesses of the gate insulating films used in the first and second field effect transistors.

Since first and second gate insulating films 25 and 4 are formed of a single insulating film, only a single oxidizing step is necessary to form first and second gate insulating films 25 and 4. As a result, as compared to the conventional case, the number of oxidizing steps can be reduced by one, and the process of manufacturing the semiconductor device can thus be simplified. Furthermore, the first and second gate insulating films are formed by means of isotropic etching, possible defects such as local irregularities caused by the removal of resist pattern 5f (see FIG. 74) present on the surface of second gate insulating films 4 can be removed by the isotropic etching process. As a result, the first and second gate insulating films 25 and 4 will be highly reliable, and the fluctuation of the threshold voltages of the field effect transistors can be prevented.

Figure 76:
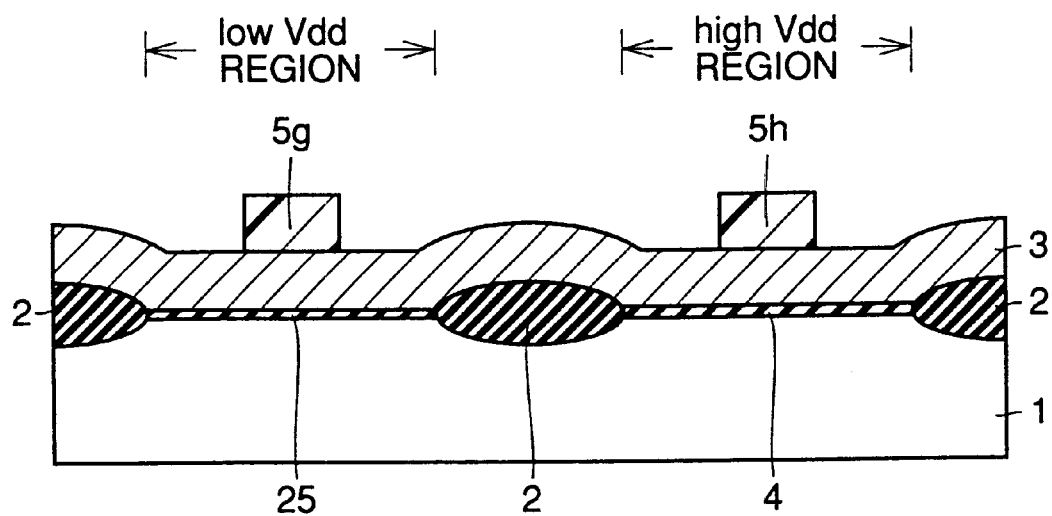

As shown in FIG. 76, a doped polysilicon film 3 is then formed on first and second gate insulating films 25 and 4, and on isolation oxide film 2. Resist patterns 5b and 5h are formed on doped polysilicon film 3.

Figure 77:
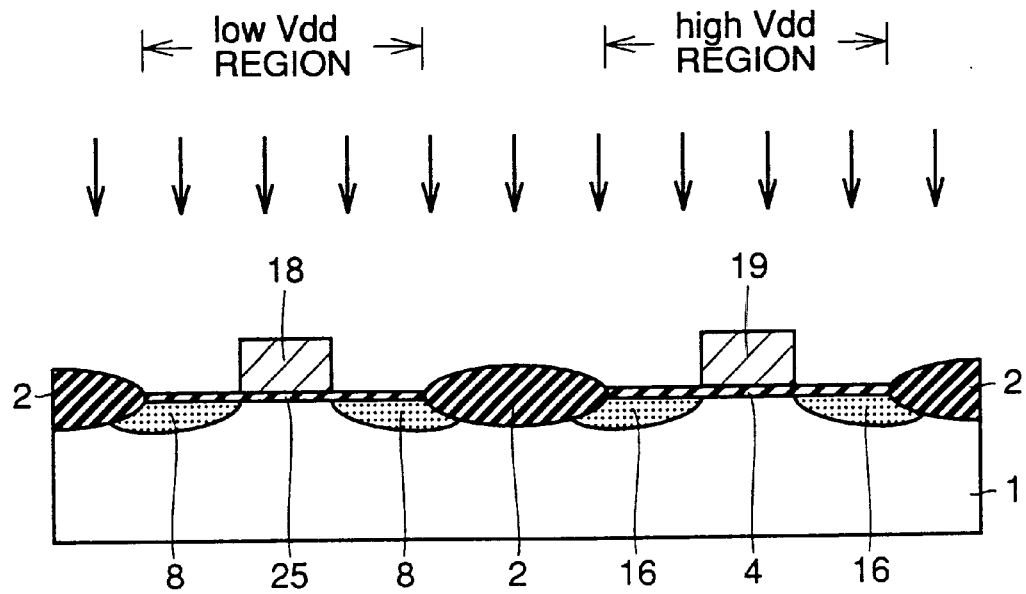

Using resist patterns 5g and 5h as masks, a part of doped polysilicon film 3 is anisotropically etched away to form first and second gate electrodes 18 and 19 (see FIG. 77), followed by removal of resist patterns 5g and 5h. As shown in FIG. 77, an impurity is then introduced into the main surface of semiconductor substrate 1, using first and second gate electrodes 18 and 19 as masks, n type impurity diffusion regions 8 and 16 are formed on the main surface of semiconductor substrate 1.

Herein, the oxidizing step to form first and second gate insulating films 25 and 4 can be performed before forming second gate electrode 19, a lower part of a side of the gate electrode can be prevented from being oxidized, and a gate bird's beak can be avoided. Thus, the threshold voltages of the field effect transistors can be prevented from increasing. As a result, electrical characteristics of the semiconductor device including the plurality of field effect transistors can be prevented from deteriorating.

Figure 78:
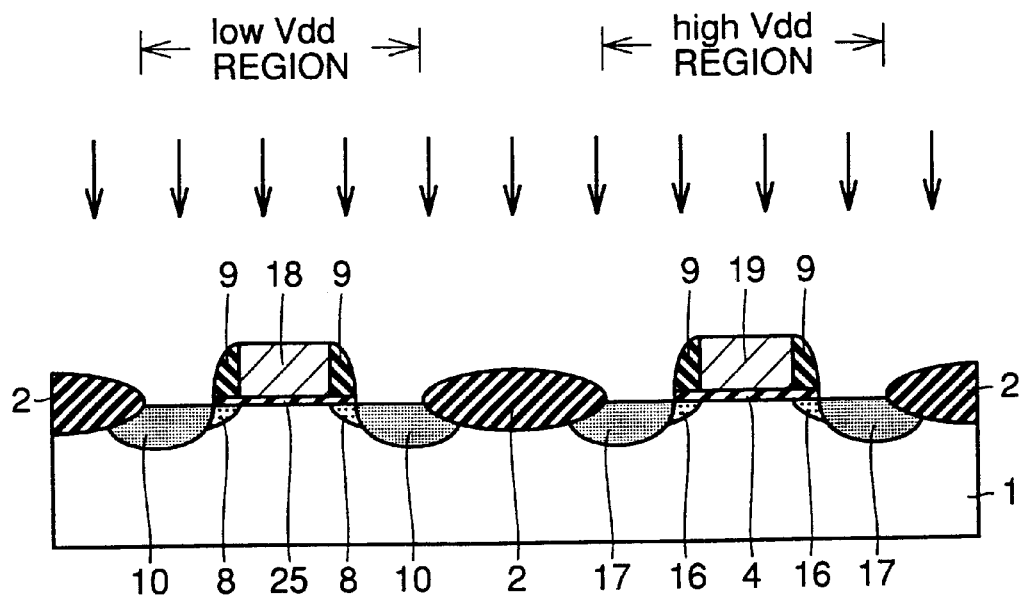
Figure 79:
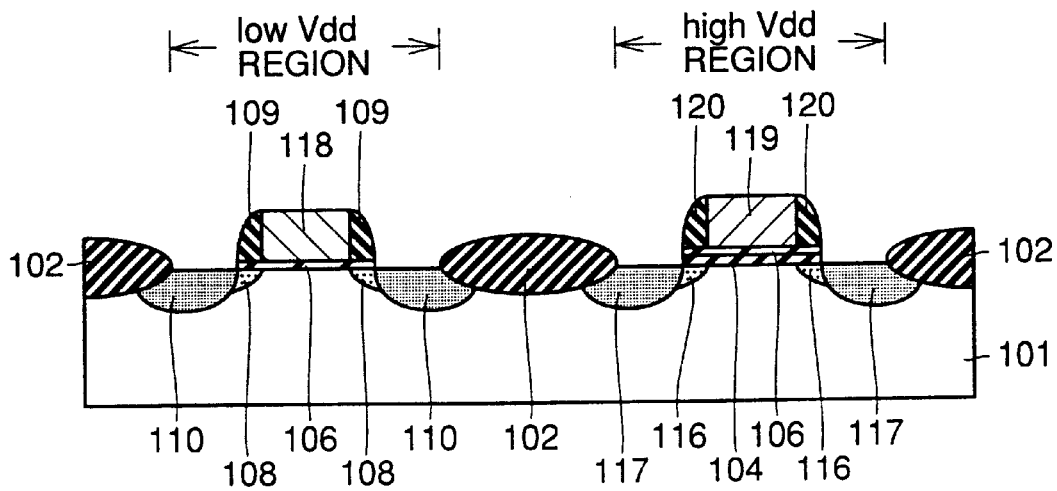
FIG. 79 is a cross sectional view showing a conventional 2-power supply semiconductor device including a plurality of field effect transistors.
Figure 80:
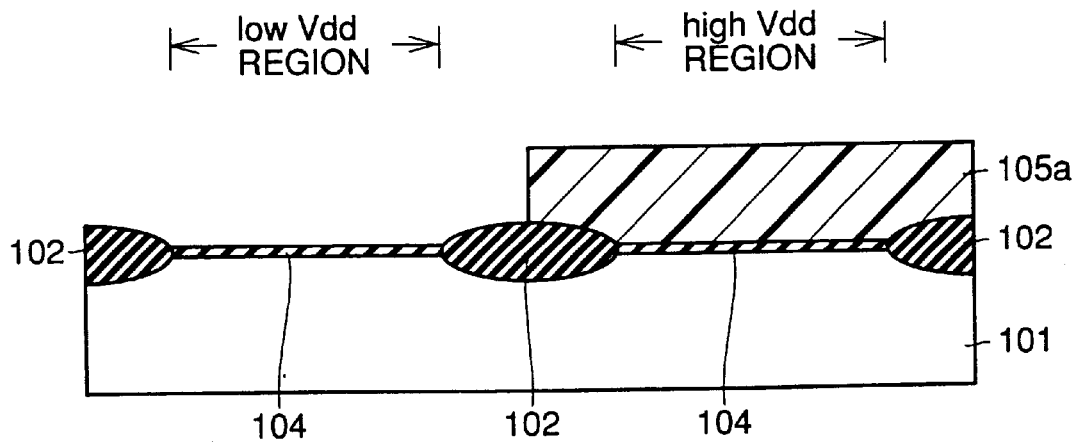
FIGS. 80 to 86 are cross sectional views for use in illustration of the first to seventh steps in the process of manufacturing the conventional 2-power supply semiconductor device including the plurality of field effect transistors shown in FIG. 79.
Figure 81:
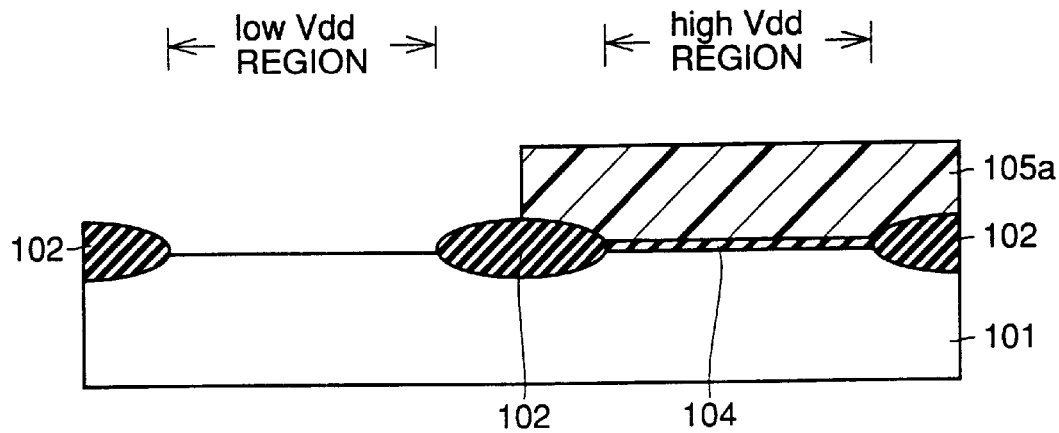
Figure 82:
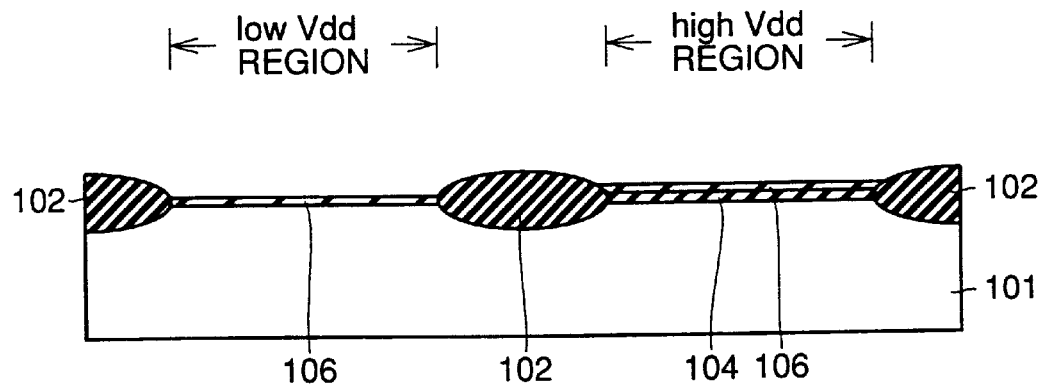
Figure 83:
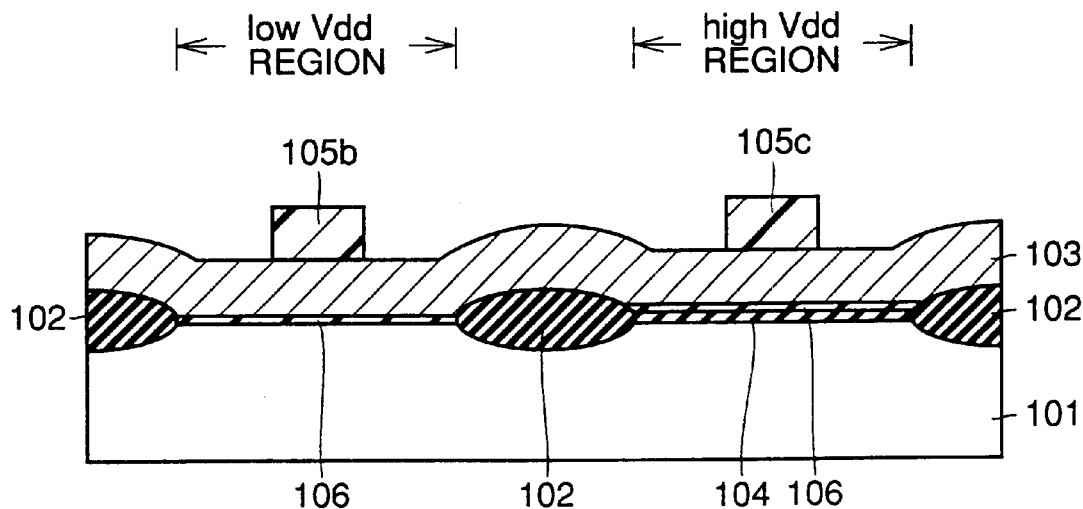
Figure 84:
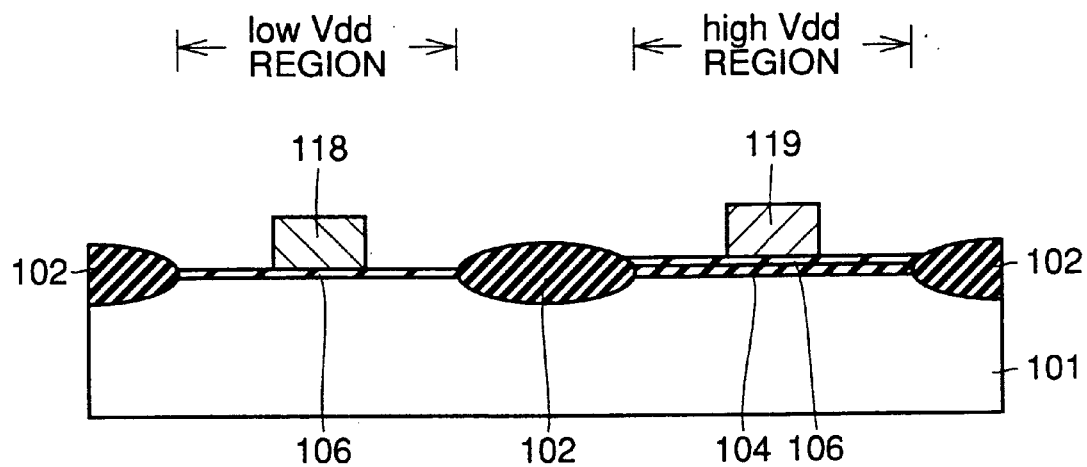
Figure 85:
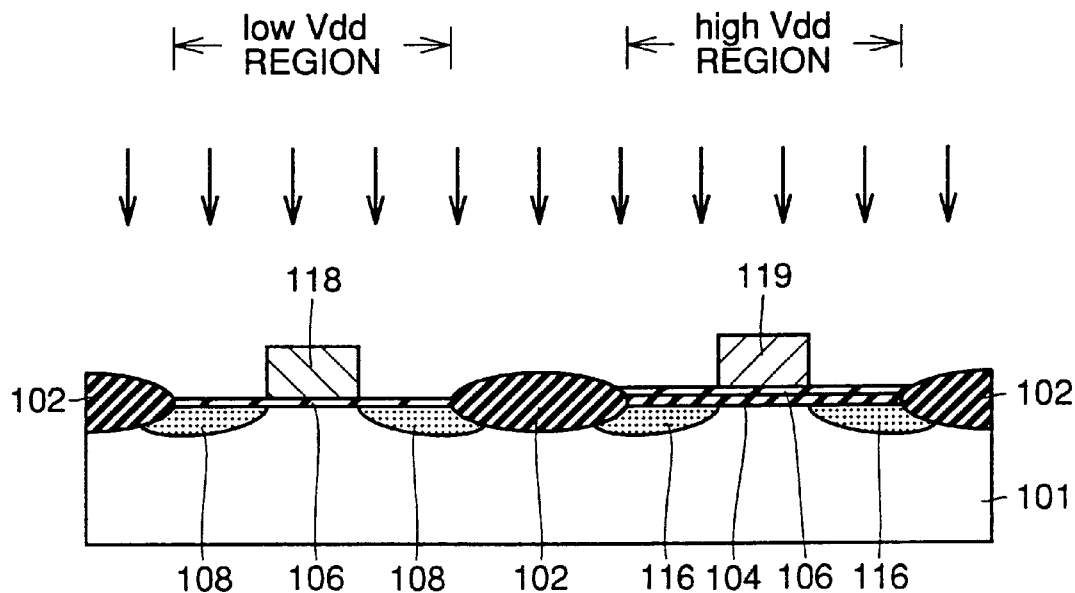
Figure 86:
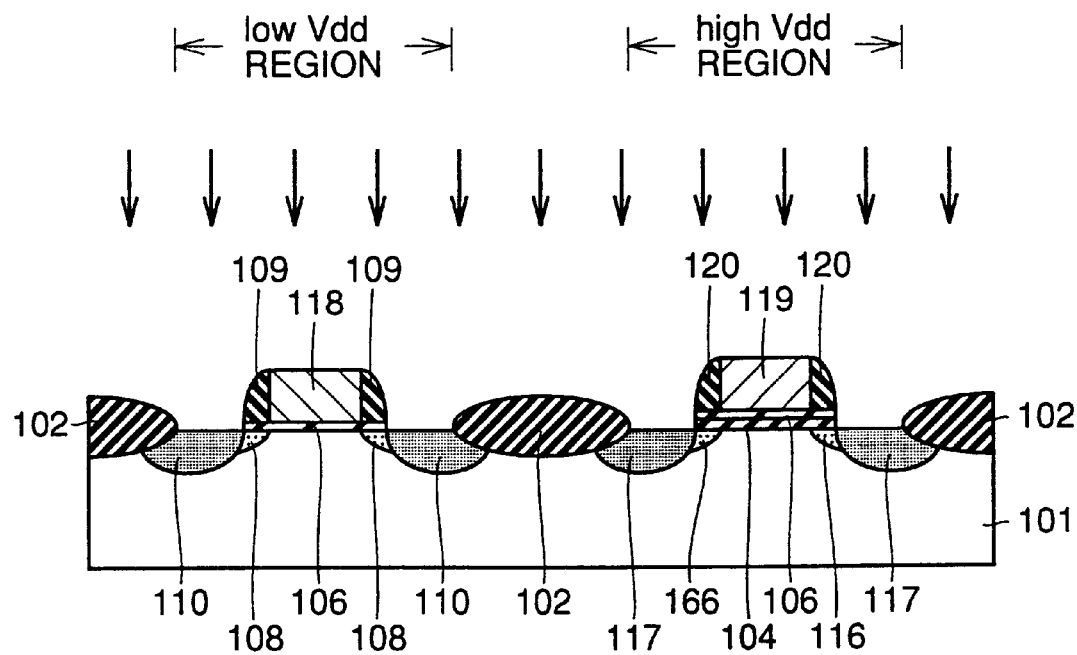
Figure 87:
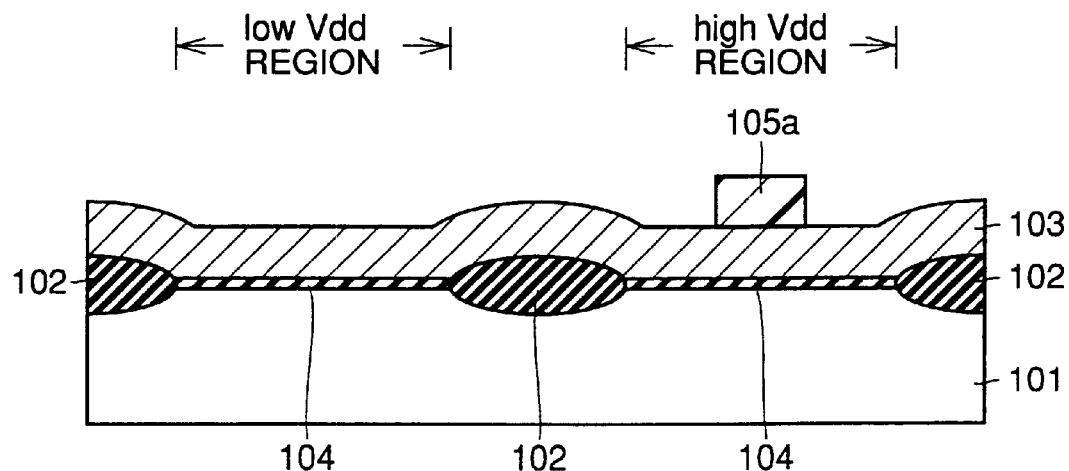
FIGS. 87 to 93 are cross sectional views for use in illustration of the first to seventh steps in the process of manufacturing another conventional 2-power supply semiconductor device including a plurality of field effect transistors.
Figure 88:
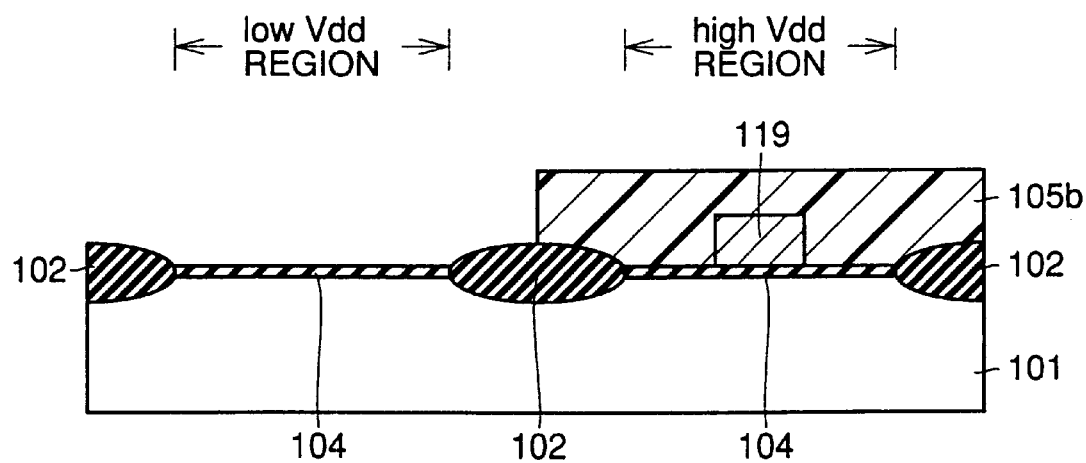
Figure 89:
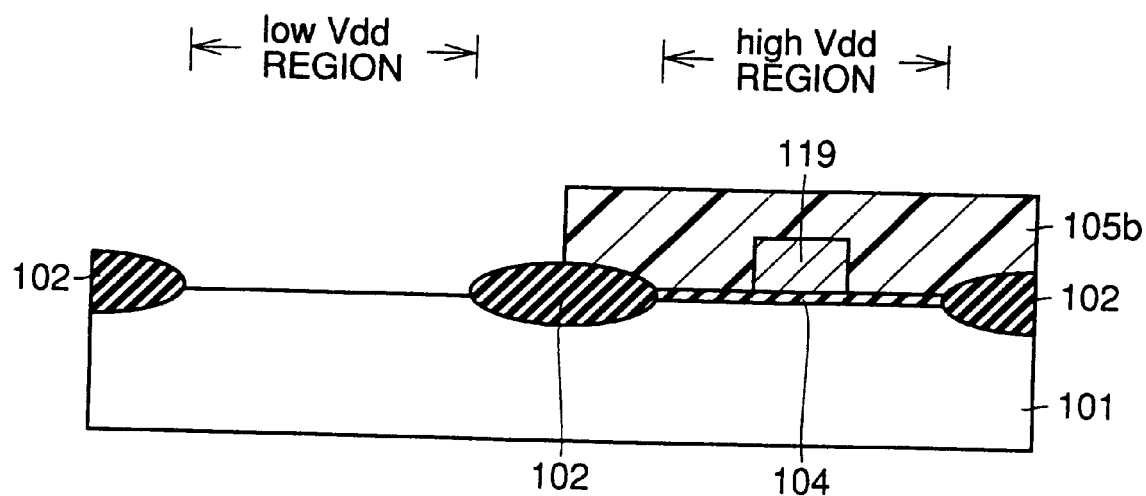
Figure 90:
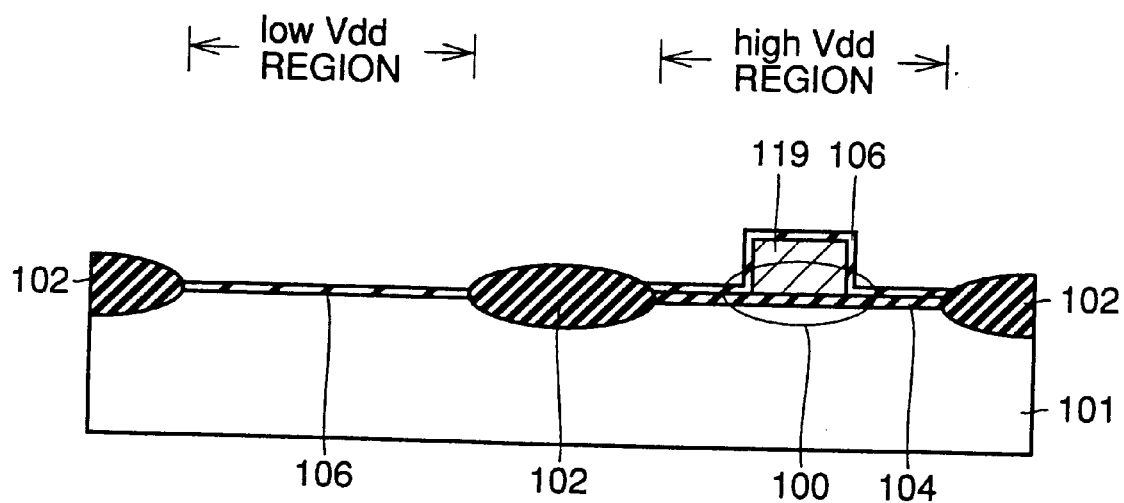
Figure 91:
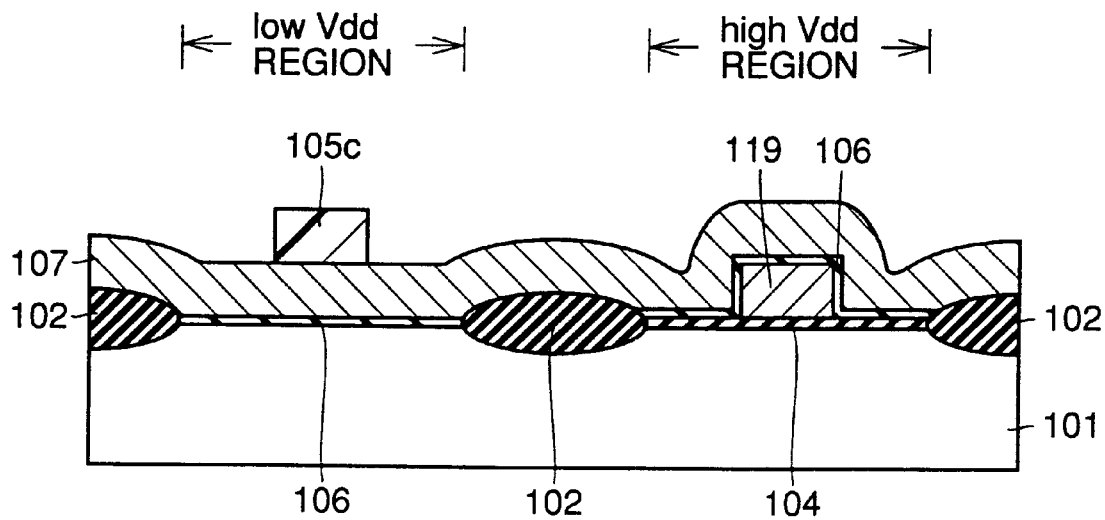
Figure 92:
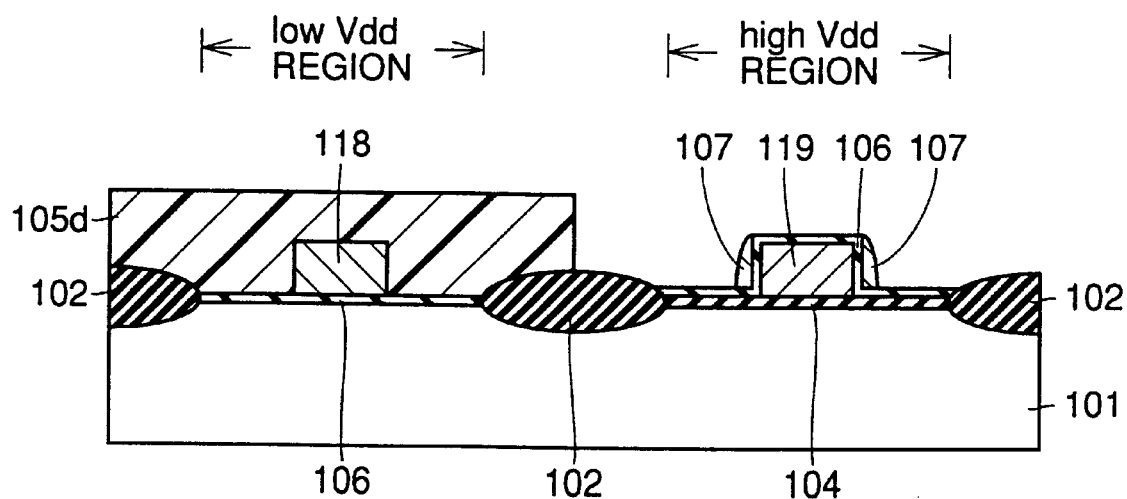
Figure 93:
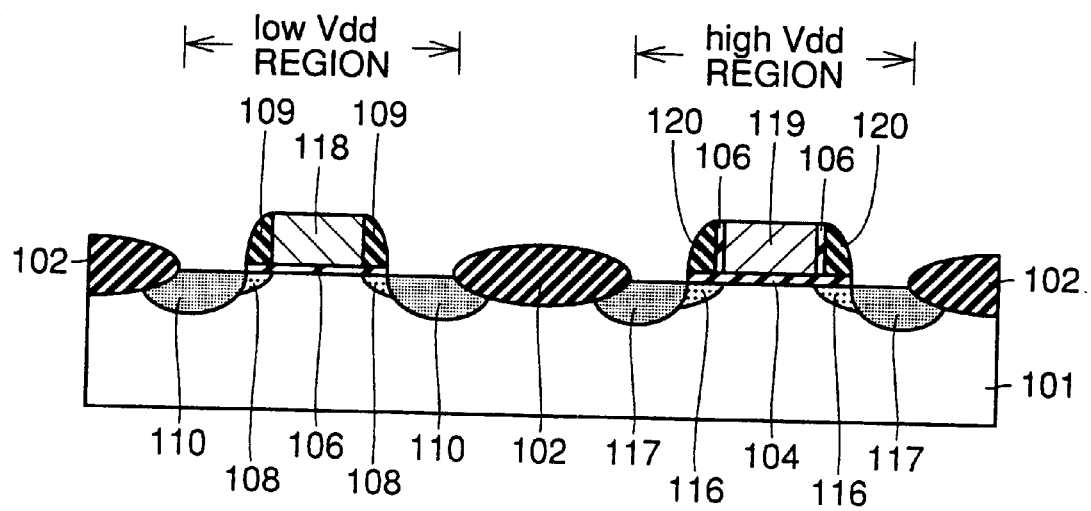
Figure 94:
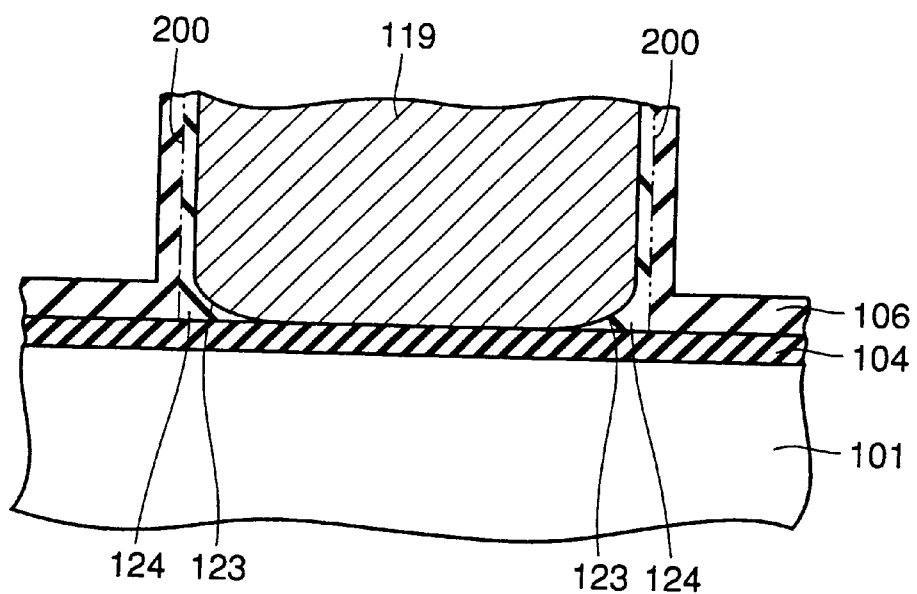
FIG. 94 is an enlarged view of region 100 in FIG. 90.

A sidewall oxide film 9 is then formed on sides of first and second gate electrodes 18 and 19 as shown in FIG. 78. Using first and second gate electrodes 18 and 19 and sidewall oxide film 9 as masks, impurity ions are introduced into the main surface of semiconductor substrate 11 to form high concentration, n type impurity diffusion regions 10 and 17. The semiconductor device as shown in FIG. 73 is thus obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a plurality of field effect transistors, including a first field effect transistor and a second field effect transistor, said first field effect transistor including, a pair of first source/drain regions formed on a main surface of a semiconductor substrate, spaced apart from each other and having a first channel region therebetween, a first gate insulating film formed on said channel region and having a first thickness, and a first gate electrode, having side surfaces with oxide spacers directly thereon, formed on said first gate insulating film, said second field effect transistor including, a pair of second source/drain regions formed on the main surface of said semiconductor substrate, spaced part from each other and having a second channel region therebetween, a second gate insulating film formed on said second channel region and having a second thickness larger than said first thickness, and a second gate electrode, having side surfaces, formed on said second gate insulating film, an oxidation protection film directly on the side surfaces of the second gate electrode for preventing the second gate electrode from being oxidized and an oxide film spacer formed on the oxidation protection film on the side surfaces of the second gate electrode.

2. A semiconductor device including a plurality of field effect transistors, including a first field effect transistor and a second field effect transistor, said first field effect transistor including, a pair of first source/drain regions formed on a main surface of a semiconductor substrate, spaced apart from each other and having a first channel region therebetween, a first gate insulating film formed on said channel region and having a first thickness, and a first gate electrode, having side surfaces with oxide spacers directly thereon, formed on said first gate insulating film, said second field effect transistor including, a pair of second source/drain regions formed on the main surface of said semiconductor substrate, spaced part from each other and having a second channel region therebetween, a second gate insulating film formed on said second channel region and having a second thickness larger than said first thickness, and a second gate electrode, having side surfaces, formed on said second gate insulating film, an oxidation protection film directly on the side surfaces of the second gate electrode for preventing the second gate electrode from being oxidized and an oxide film spacer formed on the oxidation protection film on the side surfaces of the second gate electrode, wherein, the source/drain region of the field effect transistor with the oxidation protection film has an impurity region having three concentration levels:
(a) a low impurity concentration level;
(b) an intermediate impurity concentration level; and
(c) a high impurity concentration level.

* * * * *

UNITED STATES PATENT AND TRADEMARK OFFICE
CERTIFICATE OF CORRECTION

PATENT NO.     : 6,541,823 B1
DATED          : April 1, 2003
INVENTOR(S)    : Kenji Yoshiyama et al.

It is certified that error appears in the above-identified patent and that said Letters Patent is hereby corrected as shown below:

<u>Title page, Item [54] and Column 1, lines 1-4,</u>
Replace title with -- SEMICONDUCTOR DEVICE INCLUDING MULTIPLE FIELD EFFECT TRANSISTORS WITH DIFFERING GATE INSULATING FILM THICKNESSES AND DIFFERING SPACER CONFIGURATIONS --

<u>Title page,</u>
Item [56], References Cited, OTHER PUBLICATIONS, delete "Japanese Office Action" delete the second "Stanley Wolf, Ph.D., "Silicon Processing for the VLSI Era vol. 3: the Subicron Mosfer," Latice Press, 1995, pp. 646-661."

Signed and Sealed this

Twenty-first Day of October, 2003

JAMES E. ROGAN
*Director of the United States Patent and Trademark Office*